(12) United States Patent
Webb et al.

(10) Patent No.: US 12,697,741 B2
(45) Date of Patent: *Aug. 4, 2026

(54) HUMANOID ROBOT WITH ADVANCED WIRING ASSEMBLY

(71) Applicant: Figure AI Inc., San Jose, CA (US)

(72) Inventors: Jacob Daniel Webb, San Jose, CA (US); Jose Domingo Briones Bravo, San Jose, CA (US); Basel Zohny, San Jose, CA (US); Ernesto Gonzalez Urdaneta, San Jose, CA (US); Shubham Jayprakash Chotia, San Jose, CA (US)

(73) Assignee: FIGURE AI INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/372,574

(22) Filed: Oct. 29, 2025

(65) Prior Publication Data

US 2026/0054369 A1 Feb. 26, 2026

Related U.S. Application Data

(63) Continuation of application No. PCT/US2025/024817, filed on Apr. 15, 2025.

(Continued)

(51) Int. Cl.
*B25J 19/00* (2006.01)
*B25J 9/00* (2006.01)
(Continued)

(52) U.S. Cl.
CPC ......... *B25J 19/0029* (2013.01); *B25J 9/0003* (2013.01); *B25J 9/1025* (2013.01);
(Continued)

(58) Field of Classification Search
CPC .... B25J 19/0029; B25J 19/0025; B25J 18/00; B25J 19/0004; B25J 19/0033; B25J 9/0003; B25J 9/1025; H02K 5/0069
See application file for complete search history.

(56) References Cited

U.S. PATENT DOCUMENTS

| | | | |
|---|---|---|---|
| 552,557 | A | 1/1896 | Weber |
| 1,290,140 | A | 1/1919 | Elleby |

(Continued)

FOREIGN PATENT DOCUMENTS

| | | |
|---|---|---|
| AU | 202413544 | 7/2024 |
| CA | 137209 | 5/2011 |

(Continued)

OTHER PUBLICATIONS

International Search Report for PCT/US2025/024817 dated Aug. 6, 2025.

(Continued)

*Primary Examiner* — Jake Cook

(57) ABSTRACT

A humanoid robot comprising first and second actuators interconnected by a wire bundle. The first actuator includes a printed circuit board (PCB) with a terminal on a first side, and a second side featuring an output portion, an actuator cover with a wire bundle opening, and an actuator opening extending through the second side. The second actuator similarly includes a PCB with a terminal. A wire bundle, having end connectors coupled to each PCB terminal, includes a plurality of wires routed through the actuator opening and the wire bundle opening of the first actuator. The wires include a first portion positioned within the first actuator arranged in one shape, and a second portion external to the first actuator arranged in a different shape. The robot may further include a head-mounted screen, indicator lights, and a computer running a vision-language-action (Continued)

model enabling autonomous operation in human-centric environments.

22 Claims, 29 Drawing Sheets

Related U.S. Application Data

(60) Provisional application No. 63/634,599, filed on Apr. 16, 2024, provisional application No. 63/633,920, filed on Apr. 15, 2024.

(51) Int. Cl.

| | |
|---|---|
| *B25J 9/10* | (2006.01) |
| *B25J 9/12* | (2006.01) |
| *B25J 18/00* | (2006.01) |
| *B62D 57/032* | (2006.01) |
| *H02K 7/00* | (2006.01) |
| *H05K 5/00* | (2025.01) |

(52) U.S. Cl.
CPC ............... *B25J 9/126* (2013.01); *B25J 18/00* (2013.01); *B25J 19/0004* (2013.01); *B62D 57/032* (2013.01); *H02K 7/00* (2013.01); *H05K 5/0069* (2013.01)

(56) References Cited

U.S. PATENT DOCUMENTS

| | | | |
|---|---|---|---|
| 2,362,597 | A | 11/1944 | Vince |
| 3,060,445 | A | 10/1962 | Brockman |
| 3,458,864 | A | 8/1969 | Austin |
| D246,201 | S | 10/1977 | Ogawa |
| D251,627 | S | 4/1979 | McQuarrie |
| D255,283 | S | 6/1980 | Piche |
| 4,804,220 | A | 2/1989 | Rosheim |
| 4,834,761 | A | 5/1989 | Walters |
| 4,986,723 | A | 1/1991 | Maeda |
| 5,394,766 | A | 3/1995 | Johnson |
| 5,447,403 | A | 9/1995 | Engler, Jr. |
| 5,673,367 | A | 9/1997 | Buckley |
| 6,477,058 | B1 | 11/2002 | Luebs |
| D476,404 | S | 6/2003 | Chen |
| 6,732,015 | B2 | 5/2004 | Maeda |
| 6,901,313 | B2 | 5/2005 | Mori |
| 6,980,889 | B2 | 12/2005 | Ito |
| 7,024,276 | B2 | 4/2006 | Ito |
| 7,031,806 | B2 | 4/2006 | Kuroki |
| 7,072,741 | B2 | 7/2006 | Nagashima |
| 7,099,747 | B2 | 8/2006 | Mikami |
| 7,113,849 | B2 | 9/2006 | Kuroki |
| 7,230,402 | B2 * | 6/2007 | Kumagai ............. B25J 17/0241 |
| | | | 901/1 |
| 7,308,336 | B2 | 12/2007 | Takenaka |
| 7,319,917 | B2 | 1/2008 | Takenaka |
| 7,319,918 | B2 | 1/2008 | Takenaka |
| 7,330,775 | B2 | 2/2008 | Orita |
| 7,337,039 | B2 | 2/2008 | Takenaka |
| 7,337,040 | B2 | 2/2008 | Takenaka |
| 7,379,789 | B2 | 5/2008 | Takenaka |
| 7,386,364 | B2 | 6/2008 | Mikami |
| 7,496,428 | B2 | 2/2009 | Takenaka |
| 7,664,569 | B2 | 2/2010 | Shimizu |
| D622,332 | S | 8/2010 | Pence |
| D631,612 | S | 1/2011 | Tajima |
| 7,864,159 | B2 | 1/2011 | Sweetser |
| D641,808 | S | 7/2011 | Matsuda |
| 8,224,652 | B2 | 7/2012 | Wang |
| D668,758 | S | 10/2012 | Hall |
| D677,743 | S | 3/2013 | Koshiishi |
| D687,908 | S | 8/2013 | Hoang |
| 8,511,964 | B2 | 8/2013 | Linn |
| D689,566 | S | 9/2013 | Wong |

| | | | |
|---|---|---|---|
| 8,660,695 | B2 | 2/2014 | De La Rosa Tames |
| 8,706,299 | B2 | 4/2014 | Sanders |
| 8,770,749 | B2 | 7/2014 | Mccabe |
| D712,598 | S | 9/2014 | Mehra |
| 8,942,849 | B2 | 1/2015 | Maisonnier |
| D732,999 | S | 6/2015 | Siegel |
| 9,134,547 | B2 | 9/2015 | Mccabe |
| 9,180,595 | B2 * | 11/2015 | Inada .................. B25J 19/0029 |
| 9,205,556 | B1 | 12/2015 | Magnusson |
| 9,205,560 | B1 | 12/2015 | Edsinger |
| 9,302,393 | B1 | 4/2016 | Rosen |
| 9,346,165 | B1 | 5/2016 | Metzger |
| 9,383,594 | B2 | 7/2016 | Mccabe |
| 9,494,415 | B2 | 11/2016 | Sweetser |
| D774,148 | S | 12/2016 | Hong |
| 9,569,976 | B2 | 2/2017 | Krauss |
| 9,574,646 | B1 | 2/2017 | Edsinger |
| 9,575,335 | B1 | 2/2017 | Mccabe |
| 9,592,603 | B2 | 3/2017 | Hardouin |
| 9,669,280 | B2 | 6/2017 | Hua |
| D794,692 | S | 8/2017 | Haranaka |
| D795,320 | S | 8/2017 | Liu |
| D795,321 | S | 8/2017 | Liu |
| D800,229 | S | 10/2017 | Baker |
| 9,789,607 | B1 | 10/2017 | Whitman |
| 9,789,612 | B2 | 10/2017 | Hoffman |
| 9,796,078 | B2 | 10/2017 | Angle |
| 9,821,466 | B2 | 11/2017 | Bingham |
| 9,842,585 | B2 | 12/2017 | Huang |
| 9,868,210 | B1 | 1/2018 | Whitman |
| 9,975,248 | B2 | 5/2018 | Stephens, Jr. |
| 9,992,474 | B2 | 6/2018 | Grunnet-Jepsen |
| 10,007,994 | B2 | 6/2018 | Grunnet-Jepsen |
| 10,018,256 | B1 | 7/2018 | Magnusson |
| D831,308 | S | 10/2018 | Lu |
| D835,214 | S | 12/2018 | Xiong |
| D838,759 | S | 1/2019 | Kowalski |
| 10,189,158 | B2 | 1/2019 | Edsinger |
| D841,708 | S | 2/2019 | Koshiishi |
| 10,203,209 | B2 | 2/2019 | Roumeliotis |
| 10,310,362 | B2 | 6/2019 | Grunnet-Jepsen |
| 10,349,245 | B2 | 7/2019 | Tokuchi |
| D856,593 | S | 8/2019 | Burke |
| 10,369,071 | B2 | 8/2019 | Klassen |
| 10,399,238 | B2 | 9/2019 | Waita |
| D866,684 | S | 11/2019 | Früh |
| D868,866 | S | 12/2019 | Gable |
| D872,152 | S | 1/2020 | Xiong |
| D873,320 | S | 1/2020 | Clerc |
| 10,532,464 | B1 | 1/2020 | Guzman |
| 10,537,998 | B2 | 1/2020 | Salisbury |
| 10,545,497 | B1 | 1/2020 | Cui |
| 10,571,896 | B2 | 2/2020 | Benaim |
| D885,451 | S | 5/2020 | Chen |
| D888,120 | S | 6/2020 | Hurst |
| D892,886 | S | 8/2020 | Klassen |
| D892,887 | S | 8/2020 | Klassen |
| D893,573 | S | 8/2020 | Yan |
| 10,780,578 | B2 | 9/2020 | Blankespoor |
| D898,789 | S | 10/2020 | Nazarikhorram |
| D900,251 | S | 10/2020 | Ouyang |
| D901,608 | S | 11/2020 | Okabe |
| 10,890,921 | B2 | 1/2021 | Gillett |
| D911,459 | S | 2/2021 | Xiong |
| 10,921,558 | B2 | 2/2021 | Yao |
| 10,924,638 | B2 | 2/2021 | Swaminathan |
| 10,946,528 | B2 | 3/2021 | Gupta |
| 10,960,539 | B1 | 3/2021 | Kalakrishnan |
| 10,988,192 | B1 | 4/2021 | Thorne |
| D918,979 | S | 5/2021 | Mullan |
| D921,081 | S | 6/2021 | Laplante |
| D932,531 | S | 10/2021 | Xu |
| 11,179,848 | B2 | 11/2021 | Hume |
| 11,180,205 | B2 | 11/2021 | Amino |
| 11,188,821 | B1 | 11/2021 | Kalakrishnan |
| 11,200,816 | B2 | 12/2021 | Wang |
| 11,247,738 | B2 | 2/2022 | Lavalley |
| 11,292,126 | B2 | 4/2022 | Christensen |
| 11,333,954 | B2 | 5/2022 | Bull |

(56) References Cited

U.S. PATENT DOCUMENTS

| | | |
|---|---|---|
| 11,347,030 B2 | 5/2022 | Yao |
| 11,416,003 B2 | 8/2022 | Whitman |
| 11,435,745 B2 | 9/2022 | Lee |
| 11,498,223 B2 | 11/2022 | Williams |
| D972,815 S | 12/2022 | Wang |
| D975,363 S | 1/2023 | Paulson |
| 11,546,504 B2 | 1/2023 | Kim |
| 11,554,484 B2 | 1/2023 | Jung |
| 11,600,010 B2 | 3/2023 | Doutre |
| 11,602,853 B2 | 3/2023 | Stoianovici |
| 11,623,354 B2 * | 4/2023 | Caron L'Ecuyer et al. ............... B25J 19/0029 403/321 |
| 11,632,991 B2 | 4/2023 | Hull |
| D985,643 S | 5/2023 | Li |
| 11,645,444 B2 | 5/2023 | Scheutz |
| 11,686,884 B2 | 6/2023 | Shinohara |
| D991,347 S | 7/2023 | Ding |
| 11,699,884 B2 | 7/2023 | Braun |
| 11,707,852 B1 | 7/2023 | Hurst |
| 11,736,677 B2 | 8/2023 | Grunnet-Jepsen |
| 11,807,067 B2 | 11/2023 | Mancini |
| 11,833,680 B2 | 12/2023 | Deits |
| 11,850,738 B2 | 12/2023 | Chernyak |
| 11,851,120 B2 | 12/2023 | Fay |
| 11,924,023 B1 | 3/2024 | Smith |
| D1,024,427 S | 4/2024 | Li |
| 11,999,423 B2 | 6/2024 | Whitman |
| 12,036,670 B2 | 7/2024 | Geating |
| 12,054,208 B2 | 8/2024 | Swilling |
| 12,070,863 B2 | 8/2024 | Whitman |
| 12,077,229 B2 | 9/2024 | Whitman |
| 12,097,626 B2 | 9/2024 | Ikeda |
| 12,122,044 B2 | 10/2024 | Webb |
| D1,051,193 S | 11/2024 | Mahoor |
| 12,134,181 B2 | 11/2024 | Klingensmith |
| 12,172,537 B2 | 12/2024 | Gonano |
| 12,205,214 B2 | 1/2025 | Starke |
| 12,214,497 B2 | 2/2025 | Whitman |
| 12,235,652 B2 | 2/2025 | Whitman |
| 12,240,117 B2 | 3/2025 | Chebotar |
| 12,246,441 B1 | 3/2025 | Abate |
| 12,251,831 B2 | 3/2025 | Murphy |
| D1,069,875 S | 4/2025 | Belon |
| 12,318,940 B2 | 6/2025 | Ishizuka |
| D1,082,878 S | 7/2025 | Grummas |
| D1,082,881 S | 7/2025 | Wang |
| D1,085,192 S | 7/2025 | Abroff |
| 12,365,094 B2 | 7/2025 | Mccall |
| D1,089,451 S | 8/2025 | Lin |
| 12,403,611 B2 | 9/2025 | Mccall |
| 12,420,434 B1 | 9/2025 | Goldsmith |
| 12,472,648 B1 | 11/2025 | Hadas |
| D1,107,770 S | 12/2025 | Wang |
| D1,114,356 S | 2/2026 | Dau |
| D1,114,898 S | 2/2026 | Feldman |
| 12,539,618 B1 | 2/2026 | Mccall |
| 12,558,791 B1 | 2/2026 | Bernards |
| 12,558,801 B2 | 2/2026 | Shannon |
| D1,115,887 S | 3/2026 | Wang |
| D1,117,383 S | 3/2026 | Wang |
| D1,118,726 S | 3/2026 | Mccall |
| 2002/0157167 A1 | 10/2002 | Paul |
| 2003/0070202 A1 | 4/2003 | Paul |
| 2003/0120388 A1 | 6/2003 | Kuroki |
| 2003/0173926 A1 | 9/2003 | Hattori |
| 2004/0003950 A1 | 1/2004 | Ogawa |
| 2004/0044417 A1 | 3/2004 | Finn |
| 2004/0075168 A1 | 4/2004 | Azuma |
| 2004/0103740 A1 | 6/2004 | Townsend |
| 2004/0176875 A1 | 9/2004 | Iribe |
| 2005/0072558 A1 | 4/2005 | Whitney |
| 2006/0217838 A1 | 9/2006 | Sugino |
| 2007/0035143 A1 | 2/2007 | Blackwell |
| 2008/0239678 A1 | 10/2008 | Ploeg |
| 2008/0240889 A1 | 10/2008 | Yokoyama |
| 2009/0059033 A1 | 3/2009 | Shimada |
| 2009/0321150 A1 | 12/2009 | Kwon |
| 2010/0229663 A1 | 9/2010 | Wang |
| 2010/0280662 A1 | 11/2010 | Abdallah |
| 2011/0040408 A1 | 2/2011 | De La Rosa Tames |
| 2011/0058800 A1 | 3/2011 | Lee |
| 2011/0067517 A1 | 3/2011 | Ihrke |
| 2011/0067520 A1 | 3/2011 | Ihrke |
| 2011/0067521 A1 | 3/2011 | Linn |
| 2011/0068595 A1 | 3/2011 | Ihrke |
| 2011/0071671 A1 | 3/2011 | Ihrke |
| 2011/0071673 A1 | 3/2011 | Ihrke |
| 2011/0071678 A1 | 3/2011 | Ihrke |
| 2011/0178636 A1 | 7/2011 | Kwon |
| 2011/0186362 A1 | 8/2011 | Alfayad |
| 2012/0072215 A1 | 3/2012 | Yu |
| 2012/0078419 A1 | 3/2012 | Kim |
| 2012/0155775 A1 | 6/2012 | Ahn |
| 2012/0215539 A1 | 8/2012 | Juneja |
| 2012/0310412 A1 | 12/2012 | Seo |
| 2013/0175816 A1 | 7/2013 | Kawasaki |
| 2013/0345863 A1 | 12/2013 | Linder |
| 2014/0039675 A1 | 2/2014 | Ead |
| 2014/0132210 A1 | 5/2014 | Partovi |
| 2014/0217762 A1 | 8/2014 | Ihrke |
| 2014/0265401 A1 | 9/2014 | Allen Demers |
| 2014/0279432 A1 | 9/2014 | Holman |
| 2015/0192399 A1 | 7/2015 | Raab et al. |
| 2015/0238842 A1 | 8/2015 | Hua |
| 2015/0290795 A1 | 10/2015 | Oleynik |
| 2016/0008988 A1 | 1/2016 | Kennedy |
| 2016/0052574 A1 | 2/2016 | Khripin |
| 2016/0064263 A1 | 3/2016 | Hosek |
| 2017/0028551 A1 | 2/2017 | Hemken |
| 2017/0028563 A1 | 2/2017 | Hemken |
| 2017/0032035 A1 | 2/2017 | Gao |
| 2017/0075143 A1 | 3/2017 | Saylor |
| 2017/0080582 A1 | 3/2017 | Mugnier |
| 2017/0106738 A1 | 4/2017 | Gillett |
| 2017/0125008 A1 | 5/2017 | Maisonnier |
| 2017/0299898 A1 | 10/2017 | Gallina |
| 2017/0326736 A1 | 11/2017 | Nagatsuka |
| 2018/0104823 A1 | 4/2018 | Kaku |
| 2018/0136912 A1 | 5/2018 | Venkataramani |
| 2018/0182260 A1 | 6/2018 | Ciniello et al. |
| 2018/0186015 A1 | 7/2018 | Xiong |
| 2018/0232201 A1 | 8/2018 | Holtmann |
| 2018/0281179 A1 | 10/2018 | Michalakis |
| 2018/0293517 A1 | 10/2018 | Browne |
| 2018/0357552 A1 | 12/2018 | Campos |
| 2019/0005374 A1 | 1/2019 | Shankar |
| 2019/0025611 A1 | 1/2019 | Saylor |
| 2019/0079924 A1 | 3/2019 | Sugiura |
| 2019/0082811 A1 | 3/2019 | Gray |
| 2019/0100263 A1 | 4/2019 | Amino |
| 2019/0105783 A1 | 4/2019 | Al Moubayed |
| 2019/0278079 A1 | 9/2019 | Mccabe |
| 2019/0329413 A1 | 10/2019 | Johnson |
| 2019/0337166 A1 | 11/2019 | Keeney-Ritchie |
| 2019/0371307 A1 | 12/2019 | Zhao |
| 2019/0374161 A1 | 12/2019 | Ly |
| 2020/0009739 A1 | 1/2020 | Moon |
| 2020/0086479 A1 | 3/2020 | Messier et al. |
| 2020/0096792 A1 | 3/2020 | Mccabe |
| 2020/0180145 A1 | 6/2020 | Xiong |
| 2020/0180146 A1 | 6/2020 | Xiong |
| 2020/0180167 A1 | 6/2020 | Xiong |
| 2020/0182336 A1 | 6/2020 | Xiong |
| 2020/0182337 A1 | 6/2020 | Xiong |
| 2020/0330246 A1 | 10/2020 | Tognetti |
| 2020/0409183 A1 | 12/2020 | Saylor |
| 2021/0146214 A1 | 5/2021 | Lim |
| 2021/0162602 A1 | 6/2021 | Kawaguchi |
| 2021/0221004 A1 | 7/2021 | Gupta |
| 2021/0387346 A1 | 12/2021 | Gillett |
| 2022/0226996 A1 | 7/2022 | Ishizuka |
| 2022/0227010 A1 | 7/2022 | Takabu |
| 2022/0287853 A1 | 9/2022 | Ren |

(56) References Cited

U.S. PATENT DOCUMENTS

| | | |
|---|---|---|
| 2022/0294062 A1 | 9/2022 | Kamon |
| 2022/0388174 A1 | 12/2022 | Stathis |
| 2022/0390952 A1 | 12/2022 | Yu |
| 2022/0395974 A1 | 12/2022 | Balasubramanian |
| 2022/0410378 A1 | 12/2022 | Deits |
| 2022/0410380 A1 | 12/2022 | Lu |
| 2023/0033779 A1 | 2/2023 | Gazeau |
| 2023/0048725 A1 | 2/2023 | Barbour |
| 2023/0112596 A1 | 4/2023 | Yang |
| 2023/0143315 A1 | 5/2023 | Whitman |
| 2023/0154055 A1 | 5/2023 | Besenbruch |
| 2023/0173683 A1 | 6/2023 | Gomez |
| 2023/0182296 A1 | 6/2023 | Sermanet |
| 2023/0347514 A1 | 11/2023 | Xiao |
| 2023/0390948 A1 | 12/2023 | Hsu et al. |
| 2024/0003380 A1 | 1/2024 | Vyas |
| 2024/0044331 A1 | 2/2024 | Sterling |
| 2024/0091964 A1 | 3/2024 | Smith |
| 2024/0181637 A1 | 6/2024 | Gillett |
| 2024/0217104 A1 | 7/2024 | Neville |
| 2024/0228191 A1 | 7/2024 | Kumar |
| 2024/0289606 A1 | 8/2024 | Wang |
| 2024/0294219 A1 | 9/2024 | Gildert |
| 2024/0299195 A1 | 9/2024 | Perry |
| 2024/0300109 A1 | 9/2024 | Shaw |
| 2024/0430464 A1 | 12/2024 | Kalva |
| 2025/0042024 A1 | 2/2025 | Dijkman |
| 2025/0050507 A1 | 2/2025 | Camasmie |
| 2025/0091222 A1 | 3/2025 | Mccall |
| 2025/0131347 A1 | 4/2025 | Wells |
| 2025/0147517 A1 | 5/2025 | Swilling |
| 2025/0187202 A1 | 6/2025 | Mccall |
| 2025/0196326 A1 | 6/2025 | Katz |
| 2025/0196327 A1 | 6/2025 | Geating |
| 2025/0205908 A1 | 6/2025 | Goldsmith |
| 2025/0242500 A1 | 7/2025 | Mccall |
| 2025/0269518 A1 | 8/2025 | Ragusila |
| 2025/0312911 A1 | 10/2025 | Ragusila |
| 2025/0319614 A1 | 10/2025 | Michael |
| 2025/0322372 A1 | 10/2025 | Dana |
| 2025/0375905 A1 | 12/2025 | Goldsmith |
| 2026/0016809 A1 | 1/2026 | Shu-Xing Cheng |
| 2026/0027736 A1 | 1/2026 | Yeganeh |
| 2026/0034678 A1 | 2/2026 | Mccall |
| 2026/0070216 A1 | 3/2026 | Webb |
| 2026/0084309 A1 | 3/2026 | Wu |

FOREIGN PATENT DOCUMENTS

| | | |
|---|---|---|
| CA | 233700 | 7/2025 |
| CN | 102357889 | 2/2012 |
| CN | 302064216 S | 9/2012 |
| CN | 302255798 | 12/2012 |
| CN | 302255798 S | 12/2012 |
| CN | 303298408 | 7/2015 |
| CN | 304998646 S | 1/2019 |
| CN | 305154358 S | 5/2019 |
| CN | 209615545 | 11/2019 |
| CN | 210998685 | 7/2020 |
| CN | 306231734 | 12/2020 |
| CN | 212287717 | 1/2021 |
| CN | 112959343 | 6/2021 |
| CN | 306894068 S | 10/2021 |
| CN | 114147745 A | 3/2022 |
| CN | 307563528 | 9/2022 |
| CN | 307563528 S | 9/2022 |
| CN | 115503013 | 12/2022 |
| CN | 115649316 | 1/2023 |
| CN | 218802294 | 4/2023 |
| CN | 116714698 | 9/2023 |
| CN | 117047810 | 11/2023 |
| CN | 117301022 | 12/2023 |
| CN | 117462367 | 1/2024 |
| CN | 308675468 S | 6/2024 |
| CN | 308157136 S | 8/2024 |
| CN | 309180560 S | 3/2025 |
| DE | 3345607 A1 | 6/1985 |
| DE | 112018003604 T5 | 5/2020 |
| DE | 402020100743 | 2/2021 |
| DE | 112018003604 | 11/2023 |
| EP | 2186552 A1 | 5/2010 |
| ES | 59639 U | 6/1957 |
| FR | 2595950 A1 | 9/1987 |
| GB | 2446885 A | 8/2008 |
| GB | 2472046 | 4/2013 |
| GB | 2496335 | 5/2013 |
| GB | 90038381840001 | 11/2017 |
| GB | 6367851 | 6/2024 |
| GB | 6420068 | 2/2025 |
| GB | 6420070 | 2/2025 |
| JP | 1162349 | 1/2003 |
| JP | 2003266362 A | 9/2003 |
| JP | 1301180 | 5/2007 |
| JP | 1412554 | 5/2011 |
| JP | D1638014 | 7/2019 |
| JP | 6775862 B1 | 10/2020 |
| JP | 1698172 | 10/2021 |
| KR | 20180107353 | 10/2018 |
| KR | 300994127 | 2/2021 |
| SU | 1734994 | 5/1992 |
| TW | 105306360 | 2/2018 |
| WO | 2009030922 | 3/2009 |
| WO | 2017103682 A2 | 6/2017 |
| WO | 2019234706 | 12/2019 |
| WO | 2020190594 A1 | 9/2020 |
| WO | 2022207106 | 10/2022 |
| WO | 2023107501 | 6/2023 |
| WO | 2023110778 | 6/2023 |
| WO | D224613 | 10/2023 |
| WO | 2023246994 | 12/2023 |
| WO | 2023246995 | 12/2023 |
| WO | 2024058844 | 3/2024 |
| WO | 2024072966 | 4/2024 |
| WO | 2024085904 | 4/2024 |
| WO | 2024111509 A1 | 5/2024 |
| WO | 2024112350 | 5/2024 |
| WO | 2024112351 | 5/2024 |
| WO | 2024123766 | 6/2024 |
| WO | 2024163992 | 8/2024 |
| WO | 2025019583 | 1/2025 |
| WO | 2025042802 | 2/2025 |
| WO | 2025072321 | 4/2025 |
| WO | 2025103557 A1 | 5/2025 |

OTHER PUBLICATIONS

Tsagarakis et al., The design of the lower body of the compliant humanoid robot "cCub", 2011, IEEE, p. 2035-2040 (Year: 2011).

Tsagarakis et al., Lower Body Design of the 'iCub' a Human-baby like Crawling Robot, 2006, IEEE., p. 450-455 (Year: 2006).

Park et al., Whole-body walking pattern using pelvis-rotation for long stride and arm swing for yaw angular momentum compensation, 2021, IEEE, p. 47-52 (Year: 2021).

Kawamura et al., One-leg Jumping with Virtual Spring Principle, 2008, IEEE, p. 34-39 (Year: 2008).

Lohmeier et al., Modular joint design for performance enhanced humanoid robot LOLA, 2006, IEEE, p. 88-93 (Year: 2006).

Haywood et al., A novel 3D printed leg design for a biped robot, 2017, IEEE, p. 1-6 (Year: 2006).

Asano et al., Achievement of twist squat by musculoskeletal humanoid with screw-home mechanism, 2013, IEEE, p. 4649-4654 (Year: 2013).

Mike, date published Dec. 18, 2023), Tesla Optimus Gen 2 Humanoid Robot, Mikeshouts.com, URL: (https://mikeshouts.com/ tesla-optimus-gen-2-humanoid-robot/, (Year: 2023).

Garcia, Gabriel, Robert Griffin, and Jerry Pratt. "0-step capturability, motion decomposition and global feedback control of the 3D variable height-inverted pendulum." arXiv preprint arXiv:1912.06078 (2019).

Gia et al., "Densely Connected Feature Pyramid Network for Image Segmentation," 2020 8th International Conference on Digital Home (ICDH).

(56) References Cited

OTHER PUBLICATIONS

Griffin, Robert J., et al. "Capture point trajectories for reduced knee bend using step time optimization." 2017 IEEE-RAS 17th International Conference on Humanoid Robotics (Humanoids). IEEE, 2017.

Griffin, Robert J., et al. "Footstep planning for autonomous walking over rough terrain." 2019 IEEE-RAS 19th international conference on humanoid robots (humanoids). IEEE, 2019.

Griffin, Robert J., et al. "Straight-leg walking through underconstrained whole-body control." 2018 IEEE International Conference on Robotics and Automation (ICRA). IEEE, 2018.

Griffin, Robert J., et al. "Walking stabilization using step timing and location adjustment on the humanoid robot, atlas." 2017 IEEE/RSJ International Conference on Intelligent Robots and Systems (IROS). IEEE, 2017.

Gupta, Abhishek, et al. "Bootstrapped autonomous practicing via multi-task reinforcement learning." arXiv preprint arXiv:2203.15755 (Mar. 29, 2022).

Gupta, Abhishek, et al. "Relay policy learning: Solving long-horizon tasks via imitation and reinforcement learning." arXiv preprint arXiv:1910.11956 (Oct. 25, 2019).

Haddadin et al., The "DLR crash report": Towards a standard crash-testing protocol for robot safety—Part II: Discussions, 2009, IEEE, p. 280-287 (Year: 2009).

Han et al., Mechanical design of robot lower body based on four-bar linkage structure for energy efficient bipedal walking, 2016, IEEE, p. 402-407 (Year: 2016).

Hao et al., Design and kinematics analysis of a 4-DOF articulated steering mechanism, 2015, IEEE, p. 5875-5880 (Year: 2015).

Hebi Robotics, "T-Series Actuator," Jan. 29, 2024.

Heravi, Negin, et al. "Visuomotor control in multi-object scenes using object-aware representations." arXiv preprint arXiv:2205.06333 (May 12, 2022).

Htp://www.analyticsinsight.net/artificial-inteligence/xiaomis-cyberone-a-new-humanoid-obot-to-fight-teslabot(Sep. 8, 2022) (Year: 2022).

https://electrek.co/2023/05/16/tesla-bot-sideshow-new-footage-robots/5/16/2023 (Year: 2023).

https://lifearchitect.ai/humanoids/ (Year: 2023).

https://robotsguide.com/robots/figure (Year: 2023).

https://robotsguide.com/robots/hrp4 (Year: 2010).

https://robotsguide.com/robots/optimus (Year: 2022).

https://startup-weekly.com/Figure-announces-70m-Seres-A-to-support-commercialization-of-Figure-01-humanoid-obot5/312/2023 ( Year: 2023).

https://supercarblondie.com/unitree-humanoid-robot-word-speed-record/(Year 2024).

https://web.archive.org/web/20220702203427/https://singularityhub.com/2010/01/20/ iwalk-presents-worlds-first-actively-powered-foot-and-ankle/ (Year: 2010).

https://www.cnn.com/2022/09/30/business/tesla-bot-robot Oct. 1, 2022 (Year: 2022).

https://www.economist.com/science-and-technology/2024/06/05/he-uesto-buld-obots-that-look-and-behavelike-humans(Year 2024).

https://www.hola.com/US/celebrities/20221003337667/elon-musk-unveils-robot/ Oct. 3, 2022 (Year: 2022).

https://www.humanoidsdaily.com/news/figure-reveals-fgure-03-in-new-teaser-full-unveling-set-for-october-10 (Oct. 7, 2025) (Year: 2025).

Jang, Eric, et al. "Bc-z: Zero-shot task generalization with robotic imitation learning." Conference on Robot Learning. PMLR, (Feb. 4, 2022).

Jeung et al., Realization of human neck motion with novel robotic mechanism, 2016, IEEE, p. 482-486 (Year: 2016).

Jin et al., "Unified Language-Vision Pretraining in LLM With Dynamic Discrete Visual Tokenization," arXiv:2309.04669v3 [cs.CV] Mar. 22, 2024.

Keselman et al., "Intel RealSense stereoscopic depth cameras," in Proceedings of the IEEE Conference on Computer Vision and Pattern Recognition Workshops, pp. 1-10, 2017.

Kim et al., "Giving Robots a Hand: Learning Generalizable Manipulation with Eye-in-Hand Human Video Demonstrations," arXiv:2307.05959v1 (Jul. 12, 2023).

Kim et al., "Parallel Feature Pyramid Network for Object Detection," ECCV 2018.

Kirillov et al., "Panoptic Feature Pyramid Networks," IEEE Xplore (2019).

Lee et al., "Learning Robot Activities from First-Person Human Videos Using Convolutional Future Regression," IEEE Xplore (2017).

Li et al., "Supervision Exists Everywhere: A Data Efficient Contrastive Language-Image Pre-Training Paradigm," arXiv:2110.05208v2 (Mar. 14, 2022).

Li et al., BLIP: Bootstrapping Language-Image Pre-training for Unified Vision-Language Understanding and Generation, Proceedings of the 39 th International Conference on Machine Learning, Baltimore, Maryland, USA, PMLR 162, 2022.

Lim et al., Basic emotional walking using a biped humanoid robot, 1999, IEEE, p. 954-959 (Year: 1999).

Lin et al., "Feature Pyramid Networks for Object Detection," IEEE Xplore (2017).

Lin et al., "Feature Pyramid Networks for Object Detection," IEEE Xplore (2024).

Liu et al., "A Survey of Attacks on Large Vision-Language Models: Resources, Advances, and Future Trends," Journal of Latex Class Files, vol. 14, No. (Aug. 8, 2021).

Liu et al., "Imitation from Observation: Learning to Imitate Behaviors from Raw Video via Context Translation," arXiv:1707.03374v2 (Jun. 18, 2018).

Liu et al., "RoBERTa: A Robustly Optimized BERT Pretraining Approach," arXiv: 1907.11692v1 (Jul. 26, 2019).

Liu et al., "Visual Instruction Tuning," 37th Conference on Neural Information Processing Systems (NeurIPS 2023).

Luo et al., Human body trajectory generation using point cloud data for robotics massage applications, 2014, IEEE, p. 5612-5617 (Year: 2014).

Lynch, Corey, and Pierre Sermanet. "Language conditioned imitation learning over unstructured data." arXiv preprint arXiv:2005.07648 (Jul. 7, 2020).

Lynch, Corey, et al. "Interactive language: Talking to robots in real time." IEEE Robotics and Automation Letters (Oct. 12, 2023).

Lynch, Corey, et al. "Learning latent plans from play." Conference on robot learning. Pmlr, (Dec. 20, 2020).

Lynch, Corey, Kamelia Aryafar, and Josh Attenberg. "Images don't lie: Transferring deep visual semantic features to large-scale multimodal learning to rank." Proceedings of the 22nd ACM SIGKDD international conference on knowledge discovery and data mining. (Nov. 20, 2015).

Machine translation of CN-114147745-A (Year: 2022).

Machine translation of DE-112018003604-T5 (Year: 2020).

Machine translation of WO-2020190594-A1. (Year: 2020).

Mandi et al., "Towards More Generalizable One-shot Visual Imitation Learning," bencharXiv: 2110.13423v2 [cs.RO] Feb. 8, 2022.

Maniparambil et al., "Do Vision and Language Encoders Represent the World Similarly?" IEEE Xplore (2024).

Merged original document (KR 20180107353) with English Translation (Year: 2018).

Merged original document with English translation (CN 112959343); Paragraphs added for citation purposes. (Year: 2021).

Mokhtari et al., Taban:A Retro-Projected Social Robotic—Head for Human-Robot Interaction, 2019, IEEE, p. 46-51 (Year: 2019).

Nakada et al., Deep Learning of Neuromuscular and Visuomotor Control of a Biomimetic Simulated Humanoid, 2020, IEEE, p. 3952-3959 (Year: 2020).

Netzev et al., "Many Faced Robot—Design and Manufacturing of a parametric, Modular and Open Source Robot Head," IEEE, p. 342-348 (2019).

Netzev et al., Design and implementation of a spherical joint for mobile manipulators, 2019, IEEE, p. 342-348 (Year: 2019).

Ophaswongse et al., Optimal Design of a Novel 3-DOF Orientational Parallel Mechanism for Pelvic Assistance on a Wheelchair: An Approach Based on Kinematic Geometry and Screw Theory, 2020, IEEE, p. 3315-3322 (Year: 2020).

(56) References Cited

OTHER PUBLICATIONS

Or, Computer Simulations of a Humanoid Robot Capable of Walking Like Fashion Models, 2012, IEEE, p. 241-248 (Year: 2012).

Or, Humanoids Grow a Spine: The Effect of Lateral Spinal Motion on the Mechanical Energy Efficiency, 2012, IEEE, p. 1-11 (Year : 2012).

Park et al., Mechanical Design of Humanoid Robot Platform KHR-3 (KAIST Humanoid Robot 3: HUBO), 2005, IEEE, pgl., 321-3226 (2005).

Park et al., Design of a lower limb exoskeleton including roll actuation to assist walking and standing up, 2015, IEEE, p. 359-354 ( Year: 2015).

Pateromichelakis et al., Head-eyes system and gaze analysis of the humanoid robot Romeo, 2014, IEEE, p. 1374-131379 (Year: 2014).

Peng et al., "DeepMimic: Example-Guided Deep Reinforcement Learning of Physics-Based Character Skills," ACM Trans. Graph., vol. 37, No. 4, Article 143. Publication date: Aug. 2018.

Pirk, Sören, et al. "Online object representations with contrastive learning." arXiv preprint arXiv:1906.04312 (Jun. 10, 2019).

Radford et al., "Improving Language Understanding by Generative Pre-Training," 2018.

Radford et al., "Language Models are Unsupervised Multitask Learners," 2019.

Radford et al., "Learning Transferable Visual Models From Natural Language Supervision," Proceedings of the 38 th International Conference on Machine Learning, PMLR 139, 2021.

Raffel et al., "Exploring the Limits of Transfer Learning with a Unified Text-to-Text Transformer," Journal of Machine Learning Research 21 (2020) 1-67.

Ramachandruni et al., "Attentive Task-Net: Self Supervised Task-Attention Network for Imitation Learning using Video Demonstration," 2020 IEEE International Conference on Robotics and Automation (ICRA) May 31—Paris, France. (Aug. 31, 2020).

Rombach et al., "High-Resolution Image Synthesis with Latent Diffusion Models," IEEE Xplore (2022).

Sanh et al., "DistilBERT, a distilled version of BERT: smaller, faster, cheaper and lighter," arXiv: 1910.01108v4 (Mar. 1, 2020).

Schulman et al., "Proximal Policy Optimization Algorithms," arXiv: 1707.06347v2 (Aug. 28, 2017).

Sermanet, Pierre, et al. "Time-contrastive networks: Self-supervised learning from video." 2018 IEEE international conference on robotics and automation (ICRA). IEEE, (Mar. 20, 2018).

Shafti et al., Real-time Robot-assisted Ergonomics, 2019, IEEE, p. 1975-1981 (Year: 2019).

Sharma et al., "Third-Person Visual Imitation Learning via Decoupled Hierarchical Controller," 33rd Conference on Neural Information Processing Systems (NeurIPS 2019), Vancouver, Canada.

Sieb et al., "Graph-Structured Visual Imitation," 3rd Conference on Robot Learning (CoRL 2019), Osaka, Japan. (May 12, 2020).

Smith et al., "AVID: Learning Multi-Stage Tasks via Pixel-Level Translation of Human Videos, "arXiv:1912.04443v3 (Jun. 21, 2020).

Souissi et al., Influence of the number of humanoid vertebral column pitch joints in flexion movements, 2011, IEEE, p. 227-282 ( Year: 2011).

Stadie et al., "Third-Person Imitation Learning," arXiv:1703. 01703v2 (Sep. 22, 2019).

Sun et al., "Learning by Watching via Keypoint Extraction and Imitation Learning," Machines 2022, 10, 1049. https://doi.org/10. 3390/machines10111049 (Nov. 9, 2022).

Touvron et al., "Llama 2: Open Foundation and Fine-Tuned Chat Models," arXiv:2307.09288v2 (Jul. 19, 2023).

Tsagarakis et al., Lower body realization of the baby humanoid 'iCub', 2007, IEEE, p. 3616-3622 (Year: 2007).

ttps/startu-wey.com/Figure-announces-70m-Seres-A-to-suppor-commercialzaton-of-Figure-01-humanoid-robot/531/2023(Year: 2023).

Vaswani et al., "Attention Is All You Need," 31st Conference on Neural Information Processing Systems (NIPS 2017), Long Beach, CA, USA. (Jun. 12, 2017).

Wang et al., "Structbert: Incorporating Language Structures Into Pre-Training for Deep Language Understanding,," arXiv:1908. 04577v3 (Sep. 27, 2019).

Wiedebach, Georg, et al. "Walking on partial footholds including line contacts with the humanoid robot atlas." 2016 IEEE-RAS 16th International Conference on Humanoid Robots (Humanoids). IEEE, 2016.

Xiong et al., "Learning by Watching: Physical Imitation of Manipulation Skills from Human Videos," arXiv:2101.07241v2 (Nov. 14, 2021).

Yaghoubi et al., Region-Based CNNs for Pedestrian Gender Recognition in Visual Surveillance Environments, 2019, IEEE, p. 1-5 (Year: 2019).

Yao et al., "FILIP: Fine-Grained Interactive Language-Image Pre-Training," arXiv:2111.07783v1 (Nov. 9, 2021).

Yin et al., "A Survey on Multimodal Large Language Models," arXiv:2306.13549v2 (Apr. 1, 2024).

Zhang et al., "An Object Attribute Guided Framework for Robot Learning Manipulations from Human Demonstration Videos," 2019 IEEE/RSJ International Conference on Intelligent Robots and Systems (IROS) Macau, China, (Nov. 4, 2019).

Zhou et al., "Watch, Try, Learn: Meta-Learning From Demonstrations and Rewards," arXiv:1906.03352v4 (Jan. 30, 2020).

Zitkovich, Brianna, et al. "Rt-2: Vision-language-action models transfer web knowledge to robotic control." Conference on Robot Learning. PMLR, (Jul. 28, 2023).

"A lightweight robotic leg prosthesis replicating the biomechanics of the knee, ankle, and toe joint", published Nov. 23, 2022 retrieved from Wayback machine URLhttps://www.science.org/doi/10.1126/scirobotics.abo3996 on Feb. 22, 2026 (Year: 2022).

Albers et al., Upper Body of a new Humanoid Robot—the Design of Armar III, 2006, IEEE, p. 308-309 (Year: 2006).

Available online at https://youtu.be/SS3Ga2HQQ0s?si=Dwr3sJuCsOeUoSLj, at least as early as Nov. 20, 2023.

Available online at https://www.youtube.com/watch?v=_mQJw8VhZ7w, at least as early as Oct. 5, 2022.

Available online at https://www.youtube.com/watch?v=_mQJw8VhZ7w&t=111s, as least as early as Oct. 5, 2022.

Available online at https://www.youtube.com/watch?v=1fC7b2LjVW4, at least as early as Jul. 12, 2016.

Available online at https://www.youtube.com/watch?v=20GHG-R9eFI, at least as early as Mar. 6, 2023.

Available online at https://www.youtube.com/watch?v=67CUudkjEG4, at least as early as Oct. 26, 2009.

Available online at https://www.youtube.com/watch?v=a-R4H8-8074, at least as early as Jun. 6, 2015.

Available online at https://www.youtube.com/watch?v=Bmglbk_Op64&t=1s, at least as early as Nov. 10, 2011.

Available online at https://www.youtube.com/watch?v=CUhuhleQNos, at least as early as May 22, 2019.

Available online at https://www.youtube.com/watch?v=dY57qnD_O7U, at least as early as Jul. 27, 2021.

Available online at https://www.youtube.com/watch?v=Fb_R6IDDU4A, at least as early as Oct. 9, 2020.

Available online at https://www.youtube.com/watch?v=IE-YBaYjbqY, at least as early as Dec. 10, 2013.

Available online at https://www.youtube.com/watch?v=ioOkbUQqmZO, at least as early as Nov. 9, 2022.

Available online at https://www.youtube.com/watch?v=LBem19AmTT4, at least as early as Apr. 7, 2015.

Available online at https://www.youtube.com/watch?v=0XBYZxa25vc&t=1s, at least as early as Apr. 3, 2013.

Available online at https://www.youtube.com/watch?v=q8ldbodRG14, at least as early as Feb. 26, 2024.

Available online at https://www.youtube.com/watch?v=q8ldbodRG14, at least as early as May 22, 2019.

Available online at https://www.youtube.com/watch?v=UPOLcE1vwA0, at least as early as Apr. 28, 2016.

Available online at https://www.youtube.com/watch?v=y-j4dixQQml&t=222s, at least as early as May 22, 2012.

Available online at https://www.youtube.com/watch?v=yBmatGQ0giY&t=1s, at least as early as Aug. 11, 2022.

(56) References Cited

OTHER PUBLICATIONS

Available online at https://www.youtube.com/watch?v=zkBnFPBV3f0, at least as early as Jul. 11, 2013.

Available online at https://x.com/elonmusk/status/1752516361799258318, at least as early as Jan. 30, 2024.

Available online at https://youtu.be/_MBd_XfXy9M?si=PbEHUJpRUFqaxS3J, at least as early as Jun. 26, 2023.

Available online at https://youtu.be/BNSZ8Fwcd20?si=_YnVgjYblVuhASk1, at least as early as Oct. 27, 2023.

Available online at https://youtu.be/BvFxD-8AhJA?si=Vx1F4a76tbQDUX48, at least as early as Nov. 16, 2023.

Available online at https://youtu.be/cpraXaw7dyc?si=JvPaT6eMA18psrmU, at least as early as Dec. 13, 2023.

Available online at https://youtu.be/GtPs_ygfaEA?si=7lv6MEFvFoaacKfa, at least as early as Aug. 15, 2023.

Available online at https://youtu.be/SHPxcRBIXNO?si=VbJqbK7jzUqtZGmn, at least as early as Sep. 26, 2023.

Available online at https://youtu.be/sihlDeJ4Hmk?si=fJsKpvRFPzFejmS6, at least as early as Dec. 27, 2023.

Available online at https://youtu.be/XiQkeWOFwmk?si=1qOPC8gXgmmGvXRT, at least as early as May 16, 2023.

Barker et al., Natural head movement for HRI with a muscular-skeletal head and neck robot, 2017, IEEE, p. 587-592 (Year: 2017).

Brohan, Anthony, et al. "Rt-1: Robotics transformer for real-world control at scale." arXiv preprint arXiv:2212.06817 (Dec. 13, 2022).

Brown et al., "Language Models are Few-Shot Learners," arXiv:2005.14165v4 (Jul. 22, 2020).

Calvert, Duncan, et al. "A fast, autonomous, bipedal walking behavior over rapid regions." 2022 IEEE-RAS 21st International Conference on Humanoid Robots (Humanoids). IEEE, 2022.

Chang et al., "A Survey on Evaluation of Large Language Models," ACM Trans. Intell. Syst. Technol., vol. 15, No. 3, Article 39. (Mar. 2024).

Chen et al., "InternVL: Scaling up Vision Foundation Models and Aligning for Generic Visual-Linguistic Tasks," https://github.com/OpenGVLab/InternVL (2024).

Cheng et al., "Human Posture Estimation Using Voxel Data for "Smart" Airbag Systems: Issues and Framework," IEEE, p. 84-89 (2004).

Cheng et al., Human posture estimation using voxel data for "smart" airbag systems: issues and framework, 2004, IEEE, p. 84-89 (Year: 2004).

Dafarra, Stefano, et al. "Non-linear trajectory optimization for large step-ups: Application to the humanoid robot atlas." 2020 IEEE/RSJ International Conference on Intelligent Robots and Systems (IROS). IEEE, 2020.

Ding, Tianli, et al. "Goalseye: Learning high speed precision table tennis on a physical robot." arXiv preprint arXiv:2210.03662 (Oct. 13, 2022).

Driess, Danny, et al. "Palm-e: An embodied multimodal language model." (Mar. 6, 2023).

Droeschel et al., "Learning to Interpret Pointing Gestures with a Time-of-Flight Camera," IEEE, p. 481-488 (2011).

Duran-Hernandez et al., "Control Implementation in a Low-cost Designed Biped Robot to Reproduce Squats," The 10th International Conference on Control, Mechatronics and Automation, Nov. 9, 2022.

Dwibedi, Debidatta, et al. "Learning actionable representations from visual observations." 2018 IEEE/RSJ international conference on intelligent robots and systems (IROS). IEEE, Feb. 2, 2018).

Englsberger et al., "Overview of the Torque-Controlled Humanoid Robot TORO," 2014 14th IEEE-RAS International Conference on Humanoid Robots (Humanoids), Nov. 18-20, 2014. Madrid, Spain.

Frohlich et al., "Design and Impementation of a Spherical Joint for Mobile Manipulators," IEEE, p. 251-258 (2016).

Gao et al., Development of a low motion-noise humanoid neck: Statics analysis and experimental validation, 2010, IEEE, p. 1203-1208 (Year: 2010).

* cited by examiner 1386.2.8.2.8 — 1376.2

1376.1.2

1376

1376.10

1376.1.4

1378.2

1386.2.4

1386.2.12

1386.2.8.2

1386.2.8

1386,1378.4

1386.6

1386.2

1386.2.10

1386.2.14.2

1386.2.14

1386.2.8.2.8

1376.2.2.2,1377.4

1376

1377.10

1377.6

1377.2

1377.12

1377.12.2

1386.2.8.2

1386.2.8.4.6

1386.2.8.4.8

1386.2.8

1386.2.8.6

1386.2

1386.2.8.2.6

1550

1550.2

1386.2.8.2.4

1386.2.8.2

1386.2.8.6

1386.2.8.4.6

1386.2.8.4.8

1386.2.8

1550

1376.1.2

1376

1376.1.4

1378.2

1386.2.8.2

1386.2.8

1386.2.4

1386.2

1378.4

1386.2.14

HUMANOID ROBOT WITH ADVANCED WIRING ASSEMBLY

CROSS REFERENCE TO RELATED APPLICATIONS

This application is a continuation of PCT/US25/24817 filed on Apr. 15, 2025, which claims the benefit of and priority to U.S. Provisional Patent Application Nos. 63/633,920 filed on Apr. 15, 2024 and 63/634,599 filed on Apr. 16, 2024, each of which is expressly incorporated by reference herein in its entirety.

Reference is hereby made to: (i) PCT Application Nos. PCT/US25/10425, PCT/US25/11450, PCT/US25/12544, PCT/US25/16930, PCT/US25/23325, PCT/US25/23064, PCT/US25/019793; (ii) U.S. patent application Ser. Nos. 18/919,263, 18/919,274, 19/000,626, 19/006,191, 19/038,657, 19/064,596, 19/066,122, 29/998,761; and (iii) U.S. Provisional Patent Application Nos. 63/556,102, 63/557,874, 63/561,311, 63/561,313, 63/561,317, 63/561,318, 63/558,373, 63/561,307, 63/561,315, 63/565,077, 63/573,226, 63/573,543, 63/574,349, 63/614,499, 63/615,766, 63/617,762, 63/620,633, 63/625,362, 63/625,370, 63/625,381, 63/625,384, 63/625,389, 63/625,405, 63/625,423, 63/625,431, 63/626,028, 63/626,030, 63/626,034, 63/626,035, 63/626,037, 63/626,039, 63/626,040, 63/626,105, 63/632,630, 63/632,683, 63/633,113, 63/633,405, 63/633,931, 63/633,941, 63/634,697, 63/635,152, 63/696,507, 63/696,533, 63/706,768, 63/564,741, 63/685,856, 63/700,749, 63/707,547, 63/708,003, 63/722,057, and 63/766,911, each of which is expressly incorporated by reference herein in its entirety.

TECHNICAL FIELD

This disclosure relates to a humanoid robot with an advanced wiring assembly, wherein said wiring assembly includes a plurality of wiring bundles that extend through an extent of a disclosed actuator.

BACKGROUND

Contemporary industrial and commercial sectors face significant operational challenges that stem from persistent labor shortages. It is estimated that over ten million jobs in the United States alone remain unfilled, often categorized as unsafe, physically demanding, or otherwise undesirable. These vacancies are prevalent across critical industries such as manufacturing (including automotive assembly), construction, logistics (e.g., parcel sorting, warehousing, and last-mile delivery), agriculture, and healthcare support. The tasks associated with these roles frequently involve repetitive motion, heavy lifting, exposure to hazardous materials or conditions, and prolonged monotonous activity, making them unattractive to the available human workforce. This persistent labor deficit directly impedes productivity, hinders economic growth, contributes to supply chain vulnerabilities, and can compromise workplace safety standards.

To mitigate these challenges, the development and deployment of sophisticated robotic systems capable of undertaking these demanding tasks have become a strategic imperative. General-purpose humanoid robots, in particular, offer a promising solution paradigm. Their anthropomorphic design allows them to potentially operate within environments primarily designed for humans, utilize tools intended for human use, and navigate complex, unstructured spaces with greater dexterity than many specialized robotic platforms. Achieving the requisite level of functionality, adaptability, and robustness in such a humanoid robot necessitates significant advancements beyond the current state-of-the-art in robotics.

Existing robotic solutions often fall short of meeting the demands of these applications. Many industrial robots are highly specialized, designed for repetitive tasks within structured, predictable environments (e.g., assembly lines). While effective in their niche, they lack the versatility and kinematic complexity required to handle the diverse range of tasks and unpredictable conditions found in sectors like construction or dynamic logistics operations. Their limited adaptability restricts their utility in environments where tasks may change frequently, or where interaction with a variable environment is required. Consequently, businesses may need to invest in multiple, disparate robotic systems, thereby increasing capital expenditure, integration complexity, and operational overhead.

Furthermore, the inherent complexity of human-centric workspaces poses substantial challenges. Environments such as construction sites, warehouses, or even manufacturing floors are often cluttered, dynamically changing, and require systems capable of safe co-existence and interaction with human personnel. Effective operation in such settings demands advanced perception, sophisticated motion planning, and high-dexterity manipulation capabilities far exceeding those of typical industrial robots. Current systems often struggle to match human levels of situational awareness, fine motor control, and adaptive decision-making in these scenarios. Integration with existing infrastructure also presents hurdles, as many facilities were not designed with robotic automation in mind, potentially requiring costly modifications and workflow disruptions.

An important subsystem limiting the performance, reliability, and maintainability of advanced robots, particularly humanoid platforms with numerous degrees of freedom (DOF), is the internal power and data transmission architecture-specifically, the wiring assembly. A functional humanoid robot requires a multitude of actuators (e.g., motors, servos), sensors (e.g., position, force, vision, proximity), and processing units distributed throughout its structure, including limbs, joints, torso, and end-effectors. Each of these components necessitates reliable power delivery and high-bandwidth data communication pathways.

Conventional wiring approaches, often involving external harnesses routed along or around limbs and joints, present significant drawbacks in this context. Such harnesses can be bulky, restricting the robot's range of motion and potentially interfering with the environment or the robot's own movements. The repeated flexion, extension, and rotation experienced at joints place substantial mechanical stress on external wires, leading to fatigue, abrasion, potential insulation failure, and eventual electrical discontinuity. This compromises system reliability and increases maintenance requirements. Furthermore, routing numerous wires externally complicates assembly, adds weight non-optimally, and increases the susceptibility of the wiring to environmental damage (e.g., snagging, impact, contaminants). Signal integrity can also be compromised due to electromagnetic interference (EMI) when power and data lines are bundled externally without adequate shielding or separation.

Therefore, there exists a pronounced and unmet need for an advanced wiring assembly specifically designed for the complex architecture of a general-purpose humanoid robot. Such an assembly should be capable of efficiently managing the distribution of power and data to a large number of distributed components while overcoming the limitations of conventional wiring methods. Specifically, there is a need for a wiring solution that minimizes bulk, protects conductors from mechanical stress and environmental hazards, facilitates a high degree of joint rotational freedom without compromising wire integrity, simplifies assembly and maintenance, and ensures robust signal transmission. The disclosed advanced wiring assembly meets these and other unmet needs for an advanced wiring assembly that is specifically designed for the complex architecture of a general-purpose humanoid robot.

SUMMARY OF INVENTION

The presently disclosed subject matter is directed to a humanoid robot comprising a first actuator having a first side, a first actuator printed circuit board (PCB) positioned near said first side of the first actuator and including a first PCB terminal, and a second side that is opposed to the first side. The second side includes: (i) an output, (ii) an actuator cover coupled to the output and having a wire bundle opening formed therein, and (iii) an actuator opening formed through an extent of the second side. The humanoid robot further comprises a second actuator having a first side, and a second actuator printed circuit board positioned near said first side of the second actuator and including a second PCB terminal. The humanoid robot also includes a wire bundle having a first end connector coupled to the first PCB terminal, a second end connector coupled to the second PCB terminal, and a plurality of wires that extend between the first end connector and the second end connector, wherein said plurality of wires extends through the actuator opening of the second side of the first actuator and the wire bundle opening formed in the actuator cover.

In some embodiments, the actuator opening of the first actuator is formed in a first plane, and the wire bundle opening in the actuator cover is formed in a second plane that is angled relative to the first plane. The angle formed between the first and second planes is between 30 degrees and 190 degrees. Additionally, the first side of the first actuator is fixed within a first housing of the robot, and the first side of the second actuator is fixed within a second housing of the robot. Further, the first actuator has a first rotational axis, and the output of the second actuator rotates around a second rotational axis of the second actuator; and wherein the first rotational axis is substantially perpendicular to the second rotational axis.

In some embodiments, the first and second actuators are positioned within an arm of the robot. Also, the second actuator includes a second side, and wherein the first side of the second actuator is positioned closer to the first actuator than the second side of said second actuator. Additionally, the first PCB terminal includes: (i) a plurality of signal pins, (ii) a first positive voltage pin, and (iii) a ground pin. Further, the first positive voltage pin is a high voltage pin. Moreover, the humanoid robot further comprises a second positive voltage pin, and wherein said second positive voltage pin is a lower voltage pin. In some embodiments, the first positive voltage pin is configured to conduct 48 volts, while the second positive voltage pin is configured to conduct 24 volts. In other embodiments, the signal pins are configured to transfer a first set of data signals via a first twisted pair of wires, and a second set of data signals via a second twisted pair of wires. Finally, the first PCB terminal includes a first plurality of pins, and the second PCB terminal includes a second plurality of pins; and wherein a number of pins in the first plurality of pins is greater than a number of pins in the second plurality of pins.

In some embodiments, the plurality of wires includes a first portion positioned within the first actuator, and a second portion positioned outside of the actuator. Also, the first portion twists within the first actuator when the output of the first actuator moves. Additionally, the second portion does not substantially move relative to the output when said first actuator moves. Moreover, the first portion of the plurality of wires includes an extent that is arranged in a first general shape, and the second portion includes an extent that is arranged in a second general shape that is different from the first general shape. In some embodiments, the first general shape includes a circular extent, and the second general shape is rectangular. In other embodiments, the actuator opening is substantially centered within the first actuator. In further embodiments, the wire bundle opening is non-circular, the actuator opening is circular, and/or the output includes only an output plate.

In some embodiments, the output may include: (i) a cylinder portion, and (ii) a plate portion coupled to the cylinder portion. Also, the wire bundle may include a rectangular cross-sectional profile adjacent to the wire bundle opening. Additionally, a strain relief member may be coupled to the wire bundle and the output. Further, the first end connector is removably coupled to the first PCB terminal. In some embodiments, the second end connector is removably coupled to the second PCB terminal. In other embodiments, the first PCB terminal has a curvilinear extent and a planar extent. Finally, the first end connector includes a first wire coupler that facilitates the coupling of the first end of the wire bundle to the first actuator output.

In some embodiments, the first wire coupler is coupled to the first actuator PCB via a threaded nut. Also, the wire bundle may not be coated in an external housing that substantially encases all wires. Additionally, the humanoid robot further comprises a removable connector positioned between the first and second ends. Further, an extent of the removable connector may be coupled to an extent of the second end of the first actuator. In some embodiments, the first actuator printed circuit board may further include a third actuator coupler. Finally, the third actuator coupler is configured to be coupled to a second wire bundle, and wherein an extent of the second wire bundle is a third actuator.

The presently disclosed subject matter is directed to a humanoid robot comprising a first actuator having a length and including a first side, a first actuator printed circuit board (PCB) positioned near said first side of the first actuator and including a first PCB terminal, a second side that is opposed to the first side and includes an output and an actuator cover coupled to the output and having a wire bundle opening formed therein, and an actuator opening formed through an extent of the second side and along a majority of the length of the first actuator. The humanoid robot further comprises a wire bundle having a first end connector coupled to the first PCB terminal, a second end connector, and a plurality of wires that extend between the first end connector and the second end connector, and wherein said plurality of wires extends through the actuator opening of the second side and along a majority of the length of the first actuator, and wherein at least one of the second end connector and an extent of the plurality of wires are coupled to the actuator cover.

The presently disclosed subject matter is directed to a humanoid robot comprising a first actuator having a first side, a second side, and a length that extends between the first and second sides, and including an actuator opening. The humanoid robot further comprises a wire bundle having a first end connector electrically coupled to an extent of the first actuator, and a plurality of wires with: (i) a first portion electrically connected to the first end connector and extending along a majority of the length of the actuator opening, and wherein said first portion has a first general shape, and (ii) a second portion extending from the first portion and including an extent that is positioned outside of the actuator opening, and wherein said second portion has a second general shape that is different from the first general shape.

The presently disclosed subject matter is directed to a humanoid robot comprising a torso, an arm assembly coupled to the torso, the arm assembly comprising a plurality of actuators arranged in a kinematic chain, wherein each actuator includes a central opening, a power distribution assembly housed within the torso and configured to provide power to the plurality of actuators, and an actuator wiring assembly electrically coupling adjacent actuators in the kinematic chain. The actuator wiring assembly comprises a first actuator printed circuit board (PCB) positioned near a first side of a first actuator in the kinematic chain, a second actuator PCB positioned near a first side of a second actuator adjacent to the first actuator in the kinematic chain, and a wire bundle electrically coupling the first actuator PCB to the second actuator PCB, wherein the wire bundle comprises a through-bore portion extending through the central opening of the first actuator and an adjacent actuator bundle portion extending between the first actuator and the second actuator, wherein the adjacent actuator bundle portion has a flattened shape relative to the through-bore portion.

The presently disclosed subject matter is directed to a method of assembling an actuator wiring assembly for a humanoid robot, comprising positioning a first actuator printed circuit board (PCB) near a first side of a first actuator, wherein the first actuator includes a central opening extending through the first actuator, positioning a second actuator PCB near a first side of a second actuator adjacent to the first actuator, preparing a wire bundle comprising a plurality of wires, wherein the plurality of wires includes power wires of a first gauge and signal wires of a second gauge smaller than the first gauge, inserting a first end of the wire bundle through the central opening of the first actuator, coupling the first end of the wire bundle to the first actuator PCB, coupling a second end of the wire bundle to the second actuator PCB, and shaping an adjacent actuator bundle portion of the wire bundle into a flattened configuration having a rectangular cross-sectional profile.

The presently disclosed subject matter is directed to an actuator wiring assembly for a humanoid robot, comprising a first actuator printed circuit board (PCB) positioned near a first side of a first actuator, wherein the first actuator includes a central opening extending through the first actuator, a second actuator PCB positioned near a first side of a second actuator adjacent to the first actuator, and a wire bundle electrically coupling the first actuator PCB to the second actuator PCB. The wire bundle comprises a through-bore portion extending through the central opening of the first actuator, the through-bore portion having a substantially circular cross-section, an adjacent actuator bundle portion extending between the first actuator and the second actuator, the adjacent actuator bundle portion having a flattened rectangular cross-section, and a strain relief member disposed between the through-bore portion and the adjacent actuator bundle portion, wherein the strain relief member includes an adhesive to secure wires of the wire bundle.

The presently disclosed subject matter is directed to a humanoid robot arm assembly, comprising a plurality of actuators arranged in a kinematic chain, wherein each actuator includes a central opening extending through the actuator, and an actuator wiring assembly electrically coupling adjacent actuators in the kinematic chain. The actuator wiring assembly comprises a first actuator printed circuit board (PCB) positioned near a first side of a first actuator in the kinematic chain, a second actuator PCB positioned near a first side of a second actuator adjacent to the first actuator in the kinematic chain, and a wire bundle electrically coupling the first actuator PCB to the second actuator PCB, wherein the wire bundle comprises a first end connector coupled to a first end of the wire bundle and configured to mechanically and electrically couple to the first actuator PCB, the first end connector including a chassis pin having an externally threaded portion and a nut threaded onto the externally threaded portion to secure the first end connector to the first actuator PCB.

The presently disclosed subject matter is directed to a method of manufacturing a humanoid robot, comprising assembling a torso, coupling an arm assembly to the torso, the arm assembly comprising a plurality of actuators arranged in a kinematic chain, wherein each actuator includes a central opening extending through the actuator, installing a power distribution assembly within the torso, and electrically coupling adjacent actuators in the kinematic chain using an actuator wiring assembly. Electrically coupling adjacent actuators comprises positioning a first actuator printed circuit board (PCB) near a first side of a first actuator in the kinematic chain, positioning a second actuator PCB near a first side of a second actuator adjacent to the first actuator in the kinematic chain, preparing a wire bundle comprising a plurality of power wires of a first gauge and a plurality of signal wires of a second gauge smaller than the first gauge, and electrically coupling the first actuator PCB to the second actuator PCB using the wire bundle, wherein the wire bundle comprises a through-bore portion extending through the central opening of the first actuator and having a substantially circular cross-section.

The presently disclosed subject matter is directed to an actuator for a humanoid robot, comprising a housing having a first end and a second end, a motor disposed within the housing, a central opening extending through the housing from the first end to the second end, a printed circuit board (PCB) positioned near the first end of the housing, the PCB including an opening aligned with the central opening of the housing, and a wire bundle. The wire bundle comprises a through-bore portion extending through the central opening and having a substantially circular cross-section, and a connector coupled to the PCB, the connector including a chassis pin having an externally threaded portion extending through the opening in the PCB and a nut threaded onto the externally threaded portion to secure the connector to the PCB, wherein the wire bundle is configured to electrically couple the actuator to an adjacent actuator in a kinematic chain of the humanoid robot.

The presently disclosed subject matter is directed to a method of wiring a humanoid robot, comprising identifying a kinematic chain of actuators in the humanoid robot, wherein each actuator includes a central opening extending through the actuator, and for each pair of adjacent actuators in the kinematic chain: positioning a first actuator printed circuit board (PCB) near a first side of a first actuator, the first actuator PCB including an opening aligned with the central opening of the first actuator, positioning a second actuator PCB near a first side of a second actuator, preparing a wire bundle comprising a plurality of power wires of a first gauge and a plurality of signal wires of a second gauge smaller than the first gauge, inserting a first end of the wire bundle through the central opening of the first actuator, coupling the first end of the wire bundle to the first actuator PCB using a first end connector having a chassis pin with an externally threaded portion that extends through the opening in the first actuator PCB, and coupling a second end of the wire bundle to the second actuator PCB.

The presently disclosed subject matter is directed to a humanoid robot, comprising a torso, an arm assembly coupled to the torso, the arm assembly comprising a plurality of actuators arranged in a kinematic chain, a power distribution assembly housed within the torso and configured to provide power to the plurality of actuators, and an actuator wiring assembly electrically coupling adjacent actuators in the kinematic chain. The actuator wiring assembly comprises a first actuator printed circuit board (PCB) positioned near a first side of a first actuator in the kinematic chain, a second actuator PCB positioned near a first side of a second actuator adjacent to the first actuator in the kinematic chain, and a wire bundle electrically coupling the first actuator PCB to the second actuator PCB, wherein the wire bundle comprises a through-bore portion extending through a central opening of the first actuator.

The presently disclosed subject matter is directed to a method of assembling an actuator wiring assembly for a humanoid robot, the method comprising positioning a first actuator printed circuit board (PCB) near a first side of a first actuator, positioning a second actuator PCB near a first side of a second actuator adjacent to the first actuator, preparing a wire bundle comprising a plurality of wires, inserting a first end of the wire bundle through a central opening of the first actuator, coupling the first end of the wire bundle to the first actuator PCB, and coupling a second end of the wire bundle to the second actuator PCB.

The presently disclosed subject matter is directed to an actuator wiring assembly for a humanoid robot, comprising a first actuator printed circuit board (PCB) positioned near a first side of a first actuator, a second actuator PCB positioned near a first side of a second actuator adjacent to the first actuator, and a wire bundle electrically coupling the first actuator PCB to the second actuator PCB. The wire bundle comprises a through-bore portion extending through a central opening of the first actuator, and an adjacent actuator bundle portion extending between the first actuator and the second actuator.

The presently disclosed subject matter is directed to a humanoid robot arm assembly, comprising a plurality of actuators arranged in a kinematic chain, and an actuator wiring assembly electrically coupling adjacent actuators in the kinematic chain. The actuator wiring assembly comprises a first actuator printed circuit board (PCB) positioned near a first side of a first actuator in the kinematic chain, a second actuator PCB positioned near a first side of a second actuator adjacent to the first actuator in the kinematic chain, and a wire bundle electrically coupling the first actuator PCB to the second actuator PCB, wherein the wire bundle comprises a through-bore portion extending through a central opening of the first actuator and an adjacent actuator bundle portion extending between the first actuator and the second actuator.

The presently disclosed subject matter is directed to a method of manufacturing a humanoid robot, comprising assembling a torso, coupling an arm assembly to the torso, the arm assembly comprising a plurality of actuators arranged in a kinematic chain, installing a power distribution assembly within the torso, and electrically coupling adjacent actuators in the kinematic chain using an actuator wiring assembly. Electrically coupling adjacent actuators comprises positioning a first actuator printed circuit board (PCB) near a first side of a first actuator in the kinematic chain, positioning a second actuator PCB near a first side of a second actuator adjacent to the first actuator in the kinematic chain, and electrically coupling the first actuator PCB to the second actuator PCB using a wire bundle, wherein the wire bundle comprises a through-bore portion extending through a central opening of the first actuator.

The presently disclosed subject matter is directed to an actuator for a humanoid robot, comprising a housing, a motor disposed within the housing, a central opening extending through the housing, a printed circuit board (PCB) positioned near a first end of the housing, and a wire bundle. The wire bundle comprises a through-bore portion extending through the central opening, and a connector coupled to the PCB, wherein the wire bundle is configured to electrically couple the actuator to an adjacent actuator in a kinematic chain of the humanoid robot.

The presently disclosed subject matter is directed to a method of wiring a humanoid robot, comprising identifying a kinematic chain of actuators in the humanoid robot, and for each pair of adjacent actuators in the kinematic chain: positioning a first actuator printed circuit board (PCB) near a first side of a first actuator, positioning a second actuator PCB near a first side of a second actuator, preparing a wire bundle comprising a plurality of wires, inserting a first end of the wire bundle through a central opening of the first actuator, coupling the first end of the wire bundle to the first actuator PCB, and coupling a second end of the wire bundle to the second actuator PCB.

The presently disclosed subject matter is directed to a humanoid robot wiring system, comprising a plurality of actuators arranged in a kinematic chain, a plurality of printed circuit boards (PCBs), each PCB positioned near a first side of a respective actuator, and a plurality of wire bundles, each wire bundle electrically coupling a pair of adjacent PCBs. Each wire bundle comprises a through-bore portion extending through a central opening of one actuator of the pair of adjacent actuators, and an adjacent actuator bundle portion extending between the pair of adjacent actuators.

The presently disclosed subject matter is directed to an actuator wiring kit for a humanoid robot, comprising a plurality of printed circuit boards (PCBs) configured to be positioned near first sides of respective actuators in a kinematic chain of the humanoid robot, and a plurality of wire bundles, each wire bundle configured to electrically couple a pair of adjacent PCBs. Each wire bundle comprises a through-bore portion configured to extend through a central opening of one actuator of a pair of adjacent actuators, an adjacent actuator bundle portion configured to extend between the pair of adjacent actuators, and connectors at each end of the wire bundle configured to couple with the PCBs.

The presently disclosed subject matter is directed to a method of upgrading a humanoid robot, comprising identifying a kinematic chain of existing actuators in the humanoid robot, and for each pair of adjacent actuators in the kinematic chain: removing an existing wiring assembly connecting the pair of adjacent actuators, installing a first actuator printed circuit board (PCB) near a first side of a first actuator, installing a second actuator PCB near a first side of a second actuator, preparing a wire bundle comprising a plurality of wires, inserting a first end of the wire bundle through a central opening of the first actuator, coupling the first end of the wire bundle to the first actuator PCB, and coupling a second end of the wire bundle to the second actuator PCB.

In various embodiments, systems and methods are disclosed for wiring adjacent actuators, such as within a robotic assembly. A wire bundle is configured to electrically connect components associated with a first actuator and a second actuator, typically their respective Printed Circuit Boards (PCBs). The wire bundle features distinct portions: a through-bore portion, often having a substantially circular cross-section, designed to pass through a central opening of the first actuator, and an adjacent actuator bundle portion routed between the first and second actuators. Critically, this adjacent actuator bundle portion is shaped into a flattened configuration, potentially a flattened rectangular cross-section, which differs from the through-bore portion. To manage the transition between these differently shaped portions and protect the constituent wires (which may include power and signal wires of different gauges), a strain relief member is disposed between the through-bore and adjacent actuator bundle portions. This strain relief member may incorporate an adhesive to further secure the wires. The wire bundle terminates in first and second end connectors configured for mechanical and electrical coupling to the respective actuator PCBs. Mechanical securement of a connector to a PCB can be achieved using a chassis pin integrated into the connector, featuring an externally threaded portion that passes through a PCB opening and is secured by a nut.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

Figure 1A:
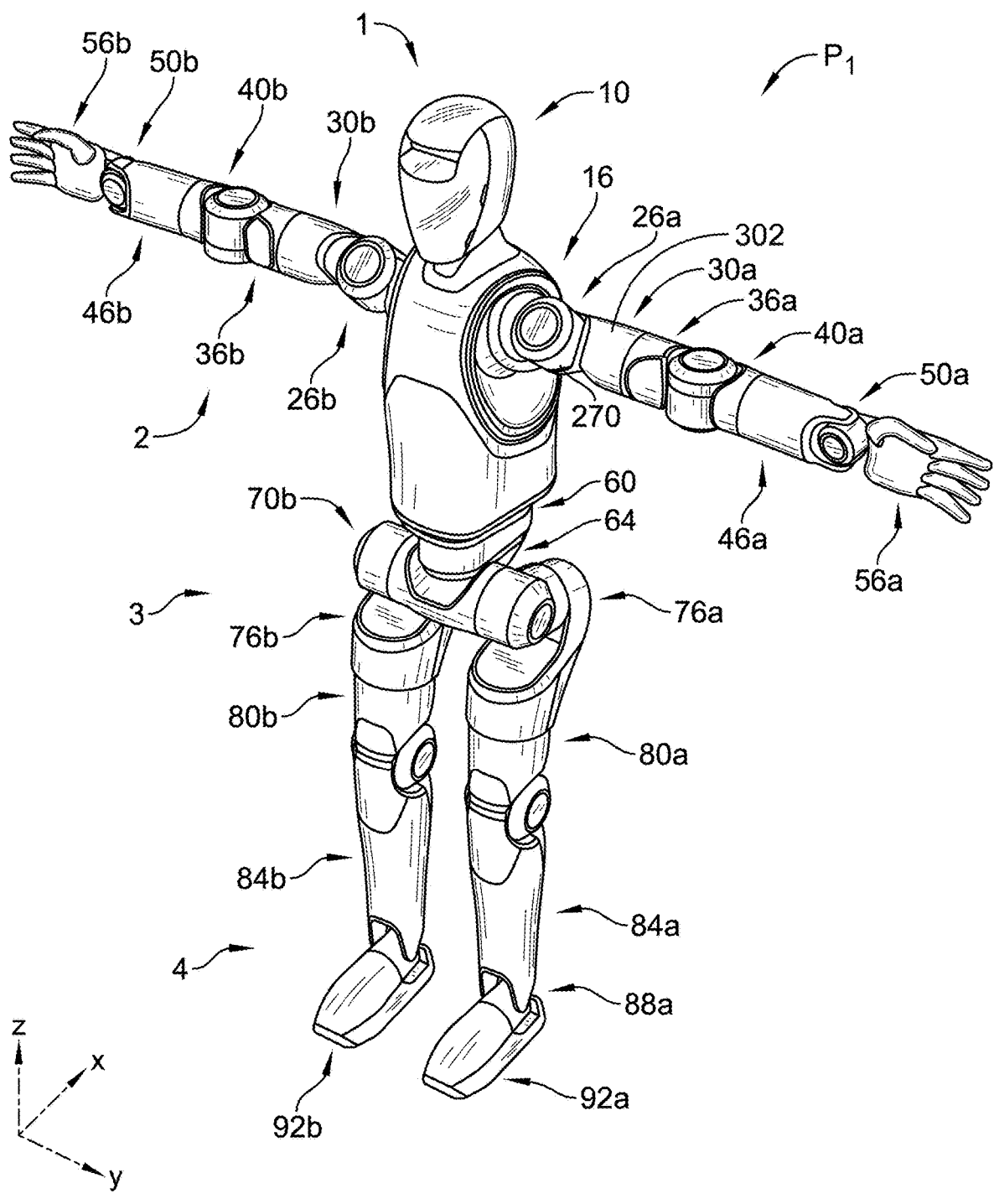
FIGS. 1A-1B are a perspective views of a robot standing in an upright, neutral position P1 and including: (i) a head and neck assembly, (ii) a torso, (iii) left and right arms, each of which includes a shoulder, an upper humerus, a lower humerus, an upper forearm, a lower forearm, and a wrist, wherein an elbow actuator couples the lower humerus and the upper forearm, (iv) hands, (v) left and right legs, each of which includes a hip, an upper thigh, a lower thigh, a shin, and a talus, wherein a knee actuator couples the lower thigh and shin, and (vi) left and right feet, where various actuators are contained within the housings of the components.

In the following detailed description, numerous specific details are set forth by way of examples in order to provide a thorough understanding of the relevant teachings. However, it should be apparent to those skilled in the art that the present teachings may be practiced without such details. In other instances, well-known methods, procedures, components, and/or circuitry have been described at a relatively high-level, without detail, in order to avoid unnecessarily obscuring aspects of the present disclosure.

While this disclosure includes several embodiments in many different forms, there is shown in the drawings and will herein be described in detail embodiments with the understanding that the present disclosure is to be considered as an exemplification of the principles of the disclosed methods and systems, and is not intended to limit the broad aspects of the disclosed concepts to the embodiments illustrated. As will be realized, the disclosed methods and systems are capable of other and different configurations, and several details are capable of being modified all without departing from the scope of the disclosed methods and systems. For example, one or more of the following embodiments, in part or whole, may be combined consistent with the disclosed methods and systems. As such, one or more steps from the flow charts or components in the Figures may be selectively omitted and/or combined consistent with the disclosed methods and systems. Additionally, one or more steps from the flow charts or the method of assembling the shoulder and upper arm may be performed in a different order. Accordingly, the drawings, flow charts, and detailed description are to be regarded as illustrative in nature, not restrictive or limiting.

A. Introduction

The current workplace landscape is characterized by an unprecedented labor shortage, particularly evident in over 10 million unsafe or undesirable jobs across the United States. To address this growing labor deficit, there is a need for advanced robots capable of performing unappealing and hazardous workplace tasks. However, conventional robots may have limitations in their ability to operate effectively in human-centric environments. This creates a need for: (i) advanced robots capable of handling undesirable and hazardous tasks, or (ii) advanced robots capable of generating data that can be utilized to develop cutting-edge artificial intelligence models (e.g., LLMs, VLMs, VLAs, and/or BAMs) to enable these robots to operate autonomously in human-centric environments.

The following undesirable and hazardous tasks may include walking long distances and obtaining objects from bins, among other general or specific tasks defined for an operational environment. These robot tasks may include a single robot task or multiple robot tasks in a generally human-centric environment and may be dangerous, routine, and/or repetitive. Unlike traditional automation systems, the humanoid robot tasks may be dexterous, human-like tasks that demand advanced motor skills, environmental adaptability, and decision-making processes. Examples of such robot tasks include, but are not limited to, assembling components (e.g., automotive parts) in a production line, welding, painting, precision machining, or operating heavy machinery. The tasks may also include gathering and packing items from storage bins, transporting items between storage and staging areas or in customer service roles by providing real-time assistance to human customers, such as giving directions, answering queries, and facilitating checkout processes. In other commercial or retail settings, the robots may perform tasks such as stocking shelves, unloading delivery vehicles, conducting inventory counts, rearranging displays, and sanitizing high-touch areas. In non-industrial settings, the robot tasks may include tidying up spaces, putting away groceries, cleaning, folding clothes, making beds, preparing meals, organizing closets, and/or setting tables.

These robots may include general-purpose humanoid robots specifically tailored for human-centric environments. General-purpose humanoid robots may emulate the human form and functionality, featuring two legs, two arms, and a screen. This emulation may necessitate the integration of various actuators within the robot to closely replicate human movements and capabilities. The actuators enable the robot to manipulate its arms, legs, and other assemblies to interact seamlessly with diverse objects in complex environments. Accordingly, it is advantageous to include optimized arrangements of parts, assemblies, and/or components to maximize the utilization of the robot and enable it to perform as many tasks as specified by the designer of the robot system.

In order to power and control the various actuators contained within the robot, the robot includes an advanced wiring arrangement to electrically couple a power distribution assembly and a whole body controller to said actuators positioned within the robot. The whole body controller may include one or more processors housed within various parts of the robot, where the one or more processors are electrically coupled and in data communication. For example, the whole body controller may include an actuator controller, a sensor monitor, and other control features not detailed in this application. In particular, the whole body controller may be configured to execute instructions on the one or more processors to control actuators, sensors, and other systems contained in the robot. For example, each of the actuators may be coupled to one or more actuator printed circuit boards (PCBs) that contain a processor and/or other electronic components.

The challenge of enabling humanoid robots to execute human movements and capabilities may be compounded by the vast array of potential positions, locations, and states that the robot could occupy in a dynamic operating environment. Therefore, it may be beneficial to optimize the arrangements of parts, assemblies, and components, particularly in the robot's kinematic chains, to ensure that the humanoid robot can replicate human movements and perform a wide range of tasks. Without such optimized kinematic configurations, advanced robots may not meet operational requirements. Thus, the inclusion of at least one optimized component or assembly, such as a single actuator, a hand, or an arm, may be desirable.

In this context, the arrangement of actuators within the robot provides a balance of functionality, form factor, and range of motion to ensure the robot may perform assigned tasks. A substantial majority of the electric actuators that are utilized in the disclosed robot include actuator wire bundles that have an internal wiring portion that passes through a region of the actuator, for example, the center of said actuator utilizing through-bore wiring. In particular, the through-bore wiring or internal wiring portion within various actuators reduces the interior volume needed to house the actuator within the robot part or component housing (e.g., elbow, knee, etc.). The actuator wiring within the disclosed robot is configured to electrically couple adjacent actuators such that a single wire or wire set/bundle intended to connect, power, and control the actuators does not extend across multiple actuators. Stated another way, said single wire or wire set/bundle does not extend across multiple degrees of freedom. This configuration helps ensure that the electrical power and control wires for each actuator are not accidentally pinched, cut, or damaged by the movement of said actuators.

In various embodiments, the through-bore wiring or internal wiring portion coupled to opposite sides of the actuator constrains the length of wires within the actuator that are required to move with the output. This defines two portions of the wiring: (i) a first wire portion in a specific location (i.e., the through-bore) that is designed (e.g., helical configuration) to rotate, and (ii) a second wire portion that may be fixed to an associated housing extension and move therewith. This wiring arrangement reduces wiring costs and other complexities. For the above reasons, the design and arrangement of the actuators and their various supporting components provide the robot 1 with substantial benefits over conventional robots.

The various actuators are positioned to form kinematic chains within an assembly of the robot (e.g., arm assembly, leg assembly). The individual actuators in the kinematic chain provide a predetermined range of motion and are positioned to provide specified degrees of freedom for said assembly. For example, the arm assembly of the illustrative robot includes six actuators between the torso and hand, where the arm assembly is further coupled to an arm actuator residing in the torso. Each actuator in the arm assembly is electrically coupled to the previous actuator. In this arrangement, the arm actuator housed in the torso is coupled to a power distribution assembly (i.e., battery) and the actuator controller. Each actuator in the arm assembly is configured to receive at least power and control signals from the previous actuator in series along the kinematic chain.

Various embodiments of the disclosed actuator wiring are designed to: (i) receive and transfer power and control signals between actuators, (ii) ensure that a single wire does not transverse more than one degree of freedom, and (iii) eliminate the need to route wires around the ends or peripheries of said actuator. This configuration helps eliminate pinch points, and helps simplify the packaging (e.g., industrial design) of the actuators within said robot 1. For the above reasons, the design and arrangement of the actuators and their various supporting components provide the disclosed robot with substantial benefits over conventional robots.

B. Robot

Figure 1B:
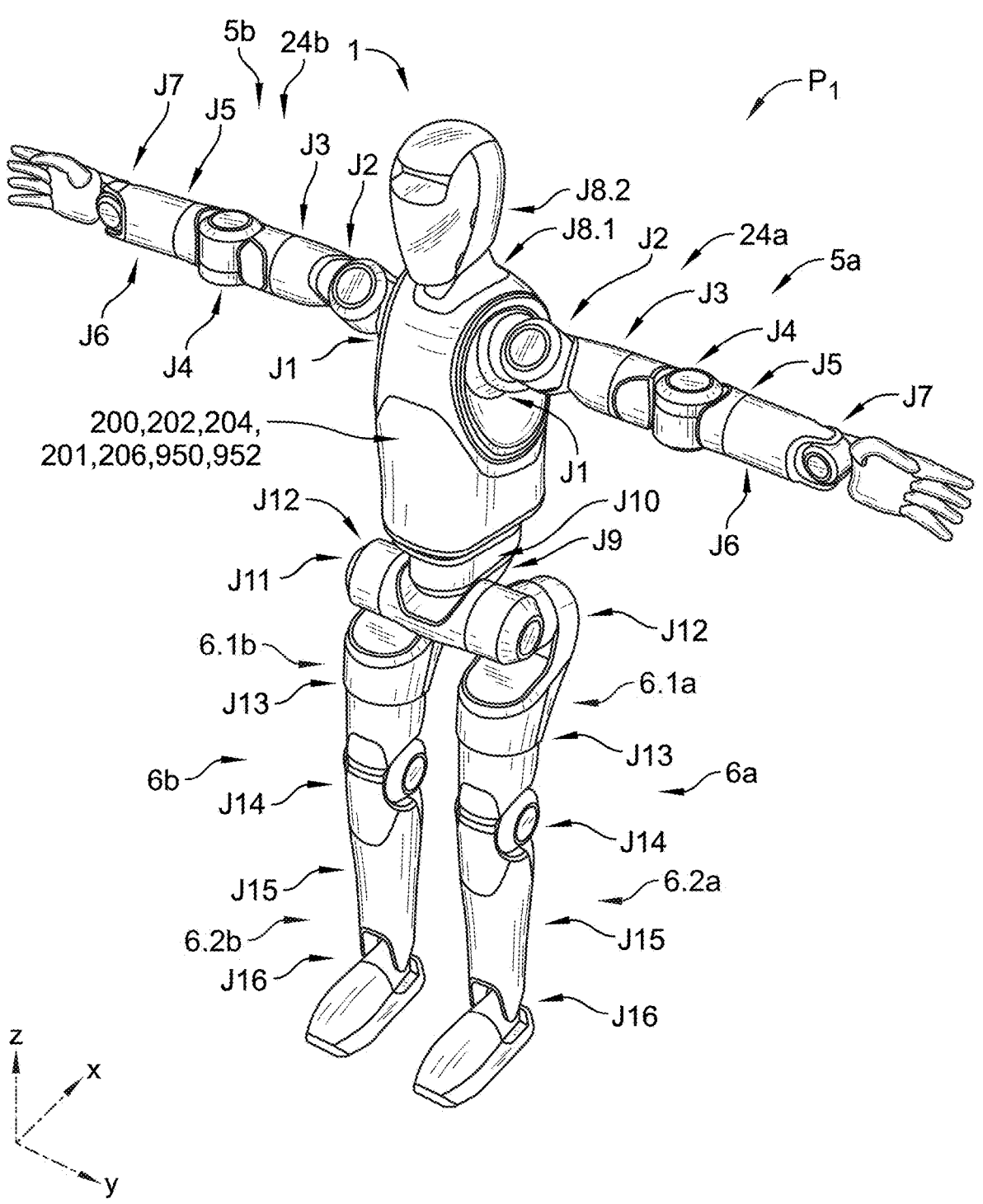

Referring to FIGS. 1A-1B, a humanoid robot 1 may include the following systems, assemblies, components and/ or parts: (i) an upper region 2 including a head/neck 10, a torso 16, left and right arms 5, and left and right hands 56; (ii) a central region 3 including a spine 60, a pelvis 64, and left and right upper leg assemblies, each upper leg including a hip 70, an upper thigh 76, and a lower thigh 80; and (iii) a lower region 4 including left and right lower leg assemblies, each lower leg including a shin 84 and a talus 88, and feet 92. Each arm 5 includes a shoulder 26, an upper humerus 30, a lower humerus 36, an upper forearm 40, a lower forearm 46, and a wrist 50. Each leg 6 includes a hip 70, an upper thigh 76, a lower thigh 80, a shin 84 and a talus 88.

Shown in at least FIG. 1B, the actuators contained within the physical robot 1 include actuators (J1-J16) housed within components or parts of the robot 1 to actuate movement of the components of said robot 1. In the illustrative embodiment, the left and right arms 5 extend from the torso 16 of the robot 1. The actuators in the upper arm assembly 24 include: (i) a shoulder actuator (J2) 280 configured to move the arm relative to the robot's torso 16, (ii) an upper arm twist actuator (J3) 320 configured to rotate the arm 5 relative to the robot's torso 16, and (iv) an elbow actuator (J4) 374 configured to bend the elbow or arm of the robot 1. The lower arm includes a lower arm twist actuator (J5) 468, a wrist pitch actuator (J6) 484, and a wrist pivot actuator (J7) 520. The arm actuator (J1) 190 contained in the torso 16 and the actuators (J2-J7) 280, 320, 374, 468, 484, 520 contained in the arm assembly 5 cooperate to position the hand 56 coupled to the wrist 50. Movement of the head 10 is controlled by head actuators (J8.1, J8.2) 120, 140 that cooperate and are coupled to an upper portion of the torso 16.

Further, the torso 16 is coupled to the pelvis 64 via the torso twist actuator (J10) 620 that resides in the spine 60 and is configured to twist the torso 16 and upper portion of the robot 1. The torso lean actuator (J9) 680 resides in the pelvis 64 and leans the torso 16 and upper portion of the robot 1 to the left or the right. The left and right legs 6 extend from the pelvis 64 of the robot 1. The actuators in the upper leg assembly 6.1 include: (i) a hip flex actuator (J11) 720 configured to move the leg 6 forward and backward relative to the robot's torso 16, (ii) a hip pivot actuator (J12) 768 configured to move the leg 6 sideways (e.g., to the left or right) relative to the robot's torso 16, (iii) a leg twist actuator (J13) 782 configured to rotate the leg 6 relative to the robot's torso 16, and (iv) a knee actuator (J14) 820 configured to bend the knee or leg of the robot 1. The lower leg assembly 6.2 includes a foot flex actuator (J15) 860 configured to change the pitch of the foot 92 and a foot roll actuator (J16) 900 configured to roll the foot 92.

The summary table below indicates the actuator reference names associated labels and respective axes within the robot 1, where each axis is defined by the rotational axis of the respective actuator. It should be understood that in other embodiments, some of these systems, assemblies, components and/or parts may be omitted, combined, or replaced with alternative systems, assemblies, components and/or parts. In some embodiments, one or more of the actuators listed below may use an alternative wiring arrangement to couple with an adjacent actuator.

TABLE 1

| Actuator | Actuator Name | Actuator Axis |
| --- | --- | --- |
| J1 (190) | Arm Actuator | Arm Axis, $A_1$ |
| J2 (280) | Shoulder Actuator | Shoulder Axis, $A_2$ |
| J3 (320) | Upper Arm Twist, Upper Arm X, or Upper Arm Roll Actuator | Upper Arm Twist, Upper Arm X, or Upper Arm Roll Axis, $A_3$ |
| J4 (374) | Elbow, Arm Z, Arm Yaw, or Lower Humerus Actuator | Elbow, Arm Z, Arm Yaw, or Lower Humerus Axis, $A_4$ |
| J5 (468) | Lower Arm Twist, Lower Arm X, or Lower Arm Roll Actuator | Lower Arm Twist, Lower Arm X, or Lower Arm Roll Axis, $A_5$ |
| J6 (484) | Wrist Flex, Wrist/Hand Y, Wrist/Hand Pitch, or Flick Actuator | Wrist Flex, Wrist/Hand Y, Wrist/Hand Pitch, or Flick Axis, $A_6$ |
| J7 (520) | Wrist Pivot, Wrist/Hand Z, Wrist/Hand Yaw, or Wave Actuator | Wrist Pivot, Wrist/Hand Z, Wrist/Hand Yaw, or Wave Axis, $A_7$ |
| J8.1 (120) | Head Twist, Head No, or First Head Actuator | Head Twist, Head No, or First Head Axis, $A_{8.1}$ |
| J8.2 (140) | Head Nod, Head Yes, or Second Head Actuator | Head Nod, Head Yes, or Second Head Axis, $A_{8.2}$ |
| J9 (680) | Torso Lean, Spine X, Torso/Spine Roll, or First Spine Actuator | Torso Lean Actuator, Spine X, Torso/Spine Roll, or First Spine Axis, $A_9$ |
| J10 (620) | Torso Twist, Spine Z, Torso/Spine Yaw, or Second Spine Actuator | Torso Twist, Spine Z, Torso/Spine Yaw, or Second Spine Axis, $A_{10}$ |
| J11 (720) | Hip Flex, Hip Y, Hip/Leg Pitch, Forward Kick, or First Hip Actuator | Hip Flex, Hip Y, Hip/Leg Pitch, Forward Kick, or First Hip Axis, $A_{11}$ |
| J12 (768) | Hip Pivot, Hip X, Hip/Leg Roll, Sideways Kick, or Second Hip Actuator | Hip Pivot, Hip X, Hip/Leg Roll, Sideways Kick, or Second Hip Axis, $A_{12}$ |
| J13 (782) | Leg Twist, Hip Z, or Hip/Leg Yaw Actuator | Leg Twist, Hip Z, or Hip/Leg Yaw Axis, $A_{13}$ |
| J14 (820) | Knee, Lower Thigh, Lower Leg Y, Lower Leg Pitch, or Rear Kick Actuator | Knee, Lower Thigh, Lower Leg Y, Lower Leg Pitch, or Rear Kick Axis, $A_{14}$ |
| J15 (860) | Foot Flex, Foot Y, Foot Pitch, or First Ankle Actuator | Foot Flex, Foot Y, Foot Pitch, or First Ankle Axis, $A_{15}$ |
| J16 (900) | Talus, Foot Roll, Foot X or Second Ankle Actuator | Talus, Foot Roll, Foot X or Second Ankle Axis, $A_{16}$ | a. Arrangement of Actuators

In the illustrative robot 1 of FIGS. 1A-1B, various actuators (J1-J16) are arranged within robot 1 to form kinematic chains within various robot part assemblies (e.g., arm assembly 5, leg assembly 6). The individual actuators in the kinematic chain provide a predetermined range of motion and are positioned to provide specified degrees of freedom for said assembly. For example, the arm assembly 5 of the illustrative robot 1 includes six actuators (J2-J7) between the torso 16 and hand 56, where the arm assembly 5 is further coupled to an arm actuator (J1) 190 residing in the torso 16. Each actuator (J2-J7) in the arm assembly is electrically coupled to the previous actuator (J1-J6, respectively). In this arrangement, the arm actuator (J1) housed in the torso 16 is coupled to a power distribution assembly (e.g., battery) and the actuator controller. Each actuator (J2-J6) in the arm assembly 5 is configured to receive at least power and control signals from the previous actuator (J1-J6) in series along the kinematic chain.

For example, the high level configuration of a kinematic chain for each arm 5 includes seven rotational axes ($A_1$-$A_7$) from the torso 16 to the wrist 50, providing seven degrees of freedom (DoF) for the arm 5 to position the hand 56 of the robot 1, where axis $A_1$ is located in the torso 16 and axes $A_2$-$A_7$ are associated with individual actuators position within the arm 5. Each hand further includes at least sixteen DoF to further grasp or manipulate objects. The high level configuration of a kinematic chain for each leg 6 includes six rotational axes ($A_{11}$-$A_{16}$) from the hip 60 to the foot 92 providing six DoF to position the foot 92. Additionally, the central rotational axes ($A_9$-$A_{11}$) provide three DoF to position the torso 16 with respect to the legs 6, where the pair of hip rotational axes ($A_{11}$) serve a dual purpose of rotating individual legs at the hip 60 and flexion/extension of the torso 16. Lastly, the head 10 includes rotational axes ($A_{8.1}$, $A_{8.2}$) for two DoF.

b. Actuators

Various actuators disclosed herein are electric rotary actuators that include: (i) a motor, (ii) a gearbox, (iii) a torque cell, (iv) encoder(s) or resolvers, and (v) at least one PCB assembly. The electric rotary actuators of said robot 1 may utilize a range and/or combination of advanced motor types, including brushless DC motors, stepper motors, servo motors, coreless DC motors, synchronous AC motors, asynchronous induction motors, linear motors, piezoelectric motors, direct-drive motors, switched reluctance motors, permanent magnet synchronous motors (PMSMs), axial flux motors, and hybrid stepper motors. These motors may employ rare-earth permanent magnets, such as neodymiumiron-boron (NdFeB) alloys, samarium-cobalt (SmCo) magnets, ferrite magnets, alnico magnets, flexible magnets, bonded rare-earth magnets, and high-temperature permanent magnets, to achieve high torque density and energy efficiency. Motor windings may include high-conductivity copper wire with advanced ceramic or polyimide insulation for superior thermal and electrical performance.

The actuator motors may be coupled with various high-reduction gearboxes or gear mechanisms designed for precision and load handling, such as strain wave gearboxes (e.g., Harmonic Drives®), cycloidal reducers, planetary gearboxes, bevel gear systems, worm gears, parallel shaft helical gear mechanisms, spur gear assemblies, crossed helical gear systems, double-enveloping worm gears, herringbone gears, hypoid gears, rack-and-pinion systems, bevel hypoid gears, epicyclic gear trains, and differential gear systems. Additionally, some implementations may incorporate custom gear profiles optimized for torque transfer efficiency, backlash reduction, and noise minimization. Moreover, the reduction ratio for a gearbox may be any reduction ratio, including 1:1.1 to 1:150. In particular, said reduction ratio may be 1:10, 1:20, 1:30, 1:50, and/or 1:100. In other words, said reduction ratio may be less than 1:1.1. In other embodiments, said reduction ratio may be more than 1:150. Further, said actuators may include brakes or clutches to protect the gearbox and/or to allow for power to be removed from the actuators without causing the robot 1 to fall to the ground.

Additionally, to achieve exceptional positional accuracy and ensure reliable operation, each motor of the actuators may be equipped with at least one PCB assembly that is coupled to a torque cell, advanced encoder, and/or a resolver. Said advanced encoder or resolver could be optical, magnetic, capacitive, inductive, resistive, piezoelectric, hall-effect, potentiometric, or ultrasonic. These encoders or resolvers may facilitate sub-millimeter-level accuracy, critical for applications requiring meticulous movement control. To complement positional data from the encoders or resolvers, said actuator PCB may include or be associated with integrated torque sensors that have strain gauges, piezoresistive sensors, magnetoelastic sensors, capacitive sensors, fiber-optic sensors, or rotary transformers. Additionally or alternatively, the actuators may include current sensors, such as Hall-effect sensors, shunt resistors, fluxgate sensors, Rogowski coils, or magnetoresistive sensors. Furthermore, the system may incorporate micro-electromechanical systems (MEMS) gyroscopes and/or accelerometers, which provide additional sensory data related to orientation, angular velocity, and linear acceleration. This sensory integration enhances the robot's ability to navigate complex environments and maintain stability during operation.

Further, the actuators or the output of the actuators may include bearing housings constructed using advanced materials like carbon-fiber-reinforced polymers (CFRPs), fiberglass-reinforced polymers (FRPs), metal alloys, polyetheretherketone (PEEK), thermoplastic composites, and ultra-high-molecular-weight polyethylene (UHMWPE). Additionally, the manufacturing processes for CFRPs, such as filament winding or automated fiber placement, allow for precise control over fiber orientation, further optimizing the mechanical performance of the housings. The bearings themselves can be fabricated from, include, or be processed using high-grade steel alloys (e.g., AISI 52100, M50, or 440C stainless steel), high-performance nickel-based super-alloys (e.g., Inconel 718 or Hastelloy®), cobalt-based alloys (e.g., Stellite™), advanced ceramics (e.g., alumina or zirconia-based composites), and polymer matrix composites reinforced with carbon or aramid fibers. These materials may also benefit from advanced heat treatments (e.g., vacuum hardening or cryogenic treatment), surface engineering processes (e.g., ion implantation or physical vapor deposition), or specialized coatings.

To further optimize performance, the rolling elements of the bearings may be composed of advanced ceramic materials (e.g., silicon nitride, tungsten carbide, or zirconia), sapphire, or composite materials combining ceramic with metal or polymer matrices. In another embodiment, the assembly may incorporate cylindrical roller bearings, angular contact ball bearings, or hybrid bearings that combine steel races with ceramic rolling elements. Additionally, spherical roller bearings, tapered roller bearings, needle roller bearings, magnetic bearings, or hybrids or combinations thereof may be used. Cutting-edge manufacturing techniques, including additive manufacturing methods like selective laser melting (SLM), could be employed to create complex bearing geometries. These geometries may integrate features such as internal cooling channels, lubrication reservoirs, or textured surfaces to enhance lubrication retention and minimize wear.

The incorporation of such features allows for improved thermal management, reduced friction, and consistent lubrication distribution, even under challenging operating conditions. Additive manufacturing also enables the production of customized bearing designs with minimal material waste, aligning with sustainable manufacturing practices. In addition to additive manufacturing, other advanced processes like precision machining, laser hardening, or chemical vapor deposition (CVD) coatings may be applied to enhance the surface properties of the bearings. These techniques can improve wear resistance, reduce friction, and provide protection against corrosion, further extending the operational life of the components. The integration of smart sensors within the bearing housing is another potential enhancement, allowing for real-time monitoring of parameters such as temperature, vibration, and load. This data can be used to predict maintenance needs and prevent unexpected failures, ensuring optimal performance and reliability.

c. Actuator Power

The robot 1 includes an electronics assembly 200 is housed within the torso 16. For example, the electronics assembly 200 may include a battery pack 202, a power distribution assembly 204, and a computing device 206. The battery pack 202 and power distribution assembly 204 are configured to provide power to various components, including actuators, positioned throughout the robot. The power distribution assembly 204 is configured to distribute power from the battery pack 202 to the actuators, sensors, and other robot systems contained in the robot 1. The power distribution assembly 204 is communicatively coupled to the torso computing device 206. The computing device 206 can also include data ports, such as an ethernet port and/or USB port that allow high speed access to data, with faster connections than 10G ethernet. The computing device 206 housed in the torso 16 may be communicatively coupled to other computing devices contained within the robot 1 and within a computing environment. For example, the computing device 206 may also be communicatively coupled to actuators and sensors contained within the robot 1.

In various embodiments, the power distribution assembly 204 may be configured to deliver power in more than one channel. For example, the battery pack 202 may generate a high voltage that can be delivered by power distribution assembly 204 in two separate channels (e.g., 48 volts) to power various systems. The power distribution assembly 204 may also deliver a low voltage (e.g., 24 volts) on separate channels.

d. Actuator Wiring

The robot 1 provides a computing environment 201 comprising one or more computing devices that are in data communication within the robot 1. For example, the computing environment 201 of robot 1 includes a computing device 206 housed in the torso 16 and additional computing devices (e.g., processor, CPU, GPU, MCU, etc.) housed in various parts of the robot 1. The whole body controller 950 is executed in the computing environment 201 to control the movement and position of robot 1, among other functions. The whole body controller 950 includes an actuator controller 952 and other features not detailed in this application. For example, the plurality of actuators (e.g., arm actuator (J1) 190, torso twist actuator (J10) 620, etc.) may individually include processors in data communication with the actuator controller 952 of the whole body controller 950. The whole body controller 950 may also receive sensor data from a plurality of sensors (e.g., actuator encoders, cameras, etc.). For example, each actuator PCB assembly may include a processor that is in data communication with the torso computing device 206. The components executed on the computing environment 201 include the whole body controller 950, and other applications, services, processes, systems, engines, or functionality not discussed in detail herein.

In various embodiments, individual actuator assemblies (J1-J16) may include or couple with one or more printed circuit board (PCB) assemblies that are associated with the individual actuators. For example, the PCB assembly associated with an individual actuator may include a processor and connectivity for data communication. In particular, a PCB assembly associated with an individual actuator may be configured to receive control commands from the actuator controller 952 and send actuator data and/or sensor data to the actuator controller 952. For example, in various embodiments, the individual actuator assembly may include a torque sensor, positional sensor, or temperature sensor, among others, where the sensors are communicatively coupled to the PCB assembly. Said PCB assembly is also configured to receive power from the power distribution assembly 204.

The actuator controller communication and power distribution are facilitated by the wiring bundles described herein. Each of the actuators in a kinematic chain (e.g., arm assembly 5, leg assembly 6) may include a PCB assembly that is coupled to the previous adjacent actuator to receive control data and power from the previous actuator in the kinematic chain. In an example shown in FIG. 2, the arm actuator (J1) 190 housed in the torso 16 may receive control signals and power from the power distribution assembly 204 and computing device 206. The adjacent shoulder actuator (J2) 280 may be coupled by wiring 294 to the arm actuator (J1) 190. Next, the upper arm twist actuator (J3) 320 may be coupled by wiring 334 to the shoulder actuator (J2) 280. In various embodiments, one or more of the subsequent actuators (e.g., J4-J7) in the kinematic chain may be similarly coupled. For example, the upper arm twist actuator assembly (J3) 320 includes a PCB assembly 322 configured to receive a data and power connection and is configured to couple with the PCB assembly 376 of the adjacent elbow actuator assembly (J4) 374.

A substantial majority of the electric actuators (J1-J16) that are utilized in the robot 1 include wires or leads that pass through a region of the actuator, for example, the center of said actuator utilizing through-bore wiring. In particular, said actuators include a PCB assembly that (i) receives electrical current and control signals from a first set or bundle of wires, where at least a portion of the wire bundle extends through an open bore or wire passage of the actuator, and (ii) is configured to couple to a second set or bundle of wires that extends from the PCB to an adjacent actuator. In some embodiments, the first set or bundle of wires may include two wire bundles coupled to an intermediate PCB assembly of the actuator. In some embodiments, the wire bundles between adjacent actuators may be one wire bundle with a portion configured to extend through the open bore. These wire sets or wire bundles are designed to: (i) receive and transfer power and control signals between actuators, (ii) ensure that a single wire does not transverse more than one degree of freedom, (iii) constrain the length of wires that are required to move to only the wires contained within the center of the actuator, and (iv) eliminate the need to position wires along the periphery of said actuator. This configuration helps eliminate pinch points, reduces the length of the wires required to move when said robot 1 moves, and helps simplify the packaging (e.g., industrial design) of the actuators within said robot 1. Additionally, constraining the length of wires that are required to move when said robot 1 moves enables the designer to: (i) include a wire in a specific location (i.e., the through-bore) that is designed (e.g., helical configuration) to rotate, and (ii) exclude wires that are designed to rotate in other locations (i.e., coupled to the input or output PCBs). This wiring arrangement reduces wiring costs and other complexities. For the above reasons, said design and arrangement of the actuators and their various supporting components provide the robot 1 with substantial benefits over conventional robots.

C. First Embodiment

Referring to FIGS. 2-10B, the illustrative robot 1 includes a first embodiment of an actuator wiring assembly 960 for a majority of the actuators (i.e., J1-J4 and J9-J14) housed within robot 1 include an actuator opening formed through the center of said actuator, referred to herein as a through-bore opening. The actuator opening or through-bore opening extends from a first side of the actuator to a second side, at least partially defined by the rotational axis of the actuator. In this embodiment, selected actuators of the robot 1 include wires or leads that pass through a region of the actuator. More specifically, these actuators utilize through-bore wiring that passes through the center of the actuator. Although these actuators may be sized differently (e.g., drive size, torque, etc.), said actuators include common elements and such as a similar or identical arrangement of components. Commonality between the actuators beneficially reduces costs, reduces assembly time, reduces the number of unique parts that are required, decreases debugging time, and increases modularity and serviceability. Generally, each rotary actuator includes a stationary, fixed, or non-moving portion and an output or moving portion that rotates about a central axis. In this embodiment, the common elements of said actuators include (i) an actuator opening or central through bore, (ii) a first or input PCB, and (iii) a second or output PCB, where the first and second PCBs are positioned on opposite sides of the actuator. For the purpose of discussion, the upper arm actuators (J2-J4) 280, 320, 374 of the left arm and associated wiring (e.g., wiring 294, 334, 386) connected thereto are used as an illustrative embodiment and can be relied upon for other sizes of actuators with a central through bore.

Figure 2:
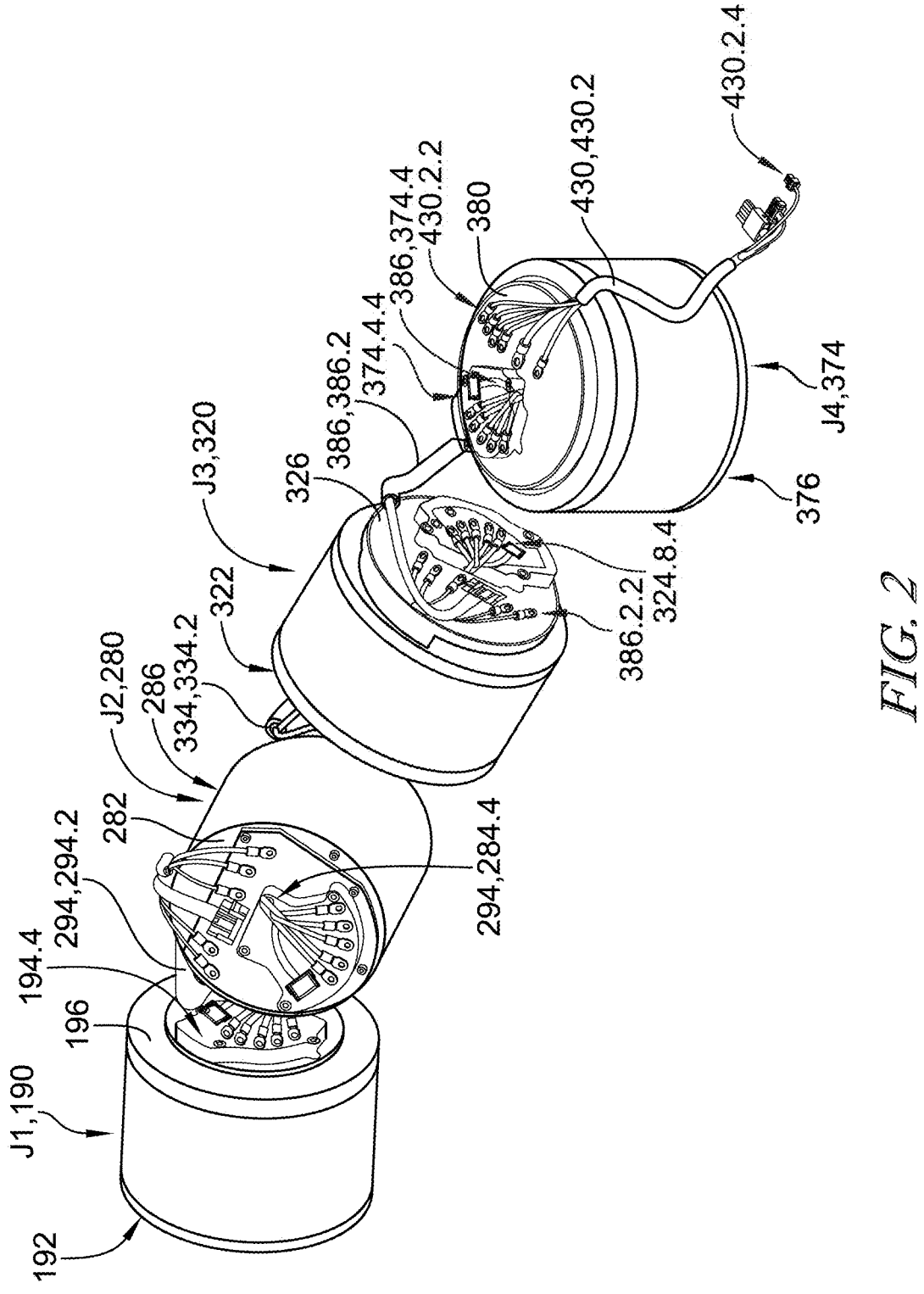
FIG. 2 is a perspective view of a first embodiment of wiring coupling various adjacent actuators in the torso and left arm of the robot of FIGS. 1A-1B, showing an arm actuator, a shoulder actuator, an arm twist actuator, an elbow actuator, and a lower twist actuator, and wherein these actuators includes through bore wiring connecting PCB assemblies.
Figure 3:
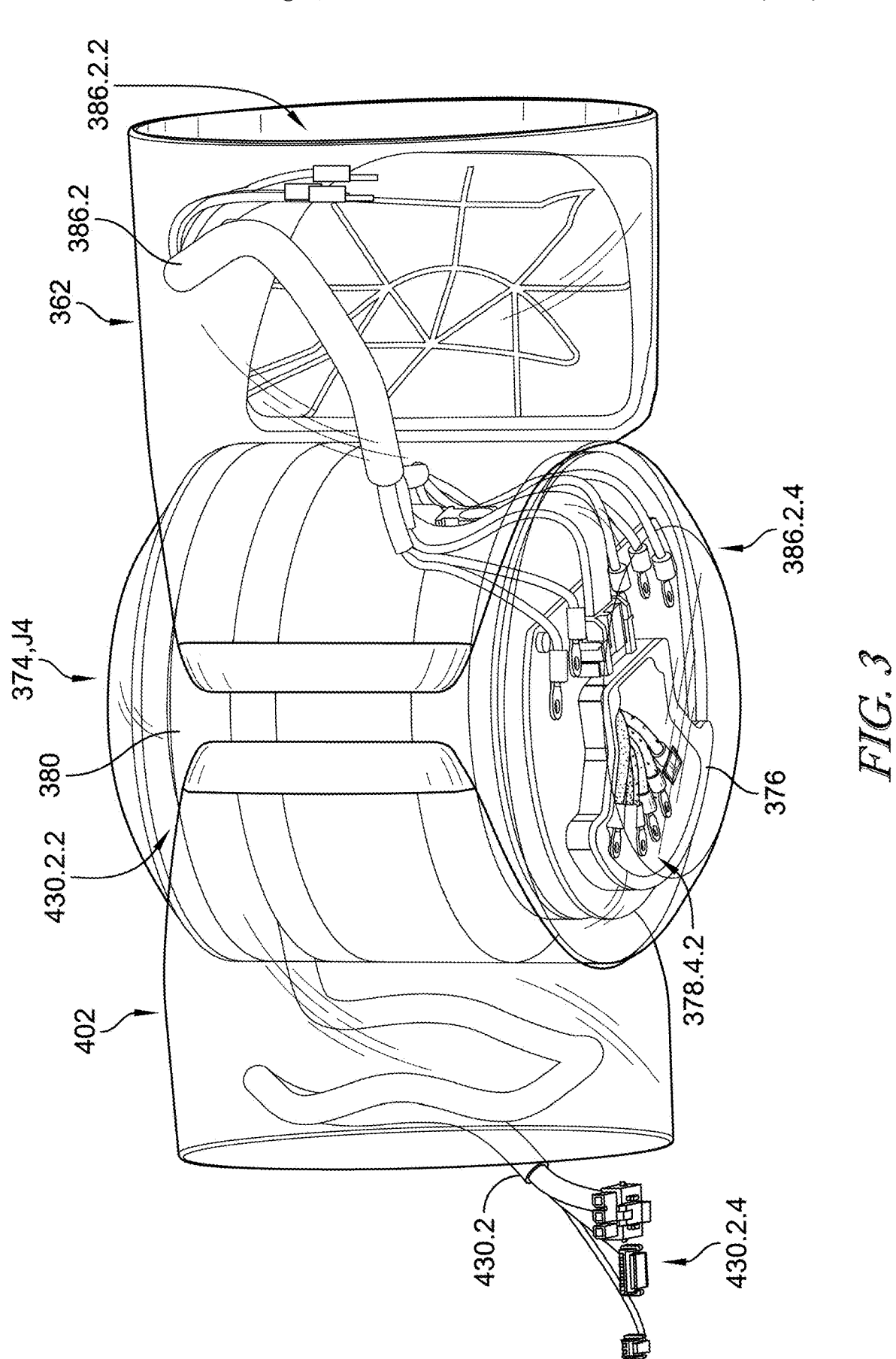
FIG. 3 is a rear perspective view of the elbow assembly of FIG. 1A, showing the elbow actuator enclosed within the lower humerus and upper forearm, wiring between adjacent actuators, and wherein the lower humerus housing and upper forearm housing are transparent, thereby showing the respective replaceable deformable members.
Figure 4:
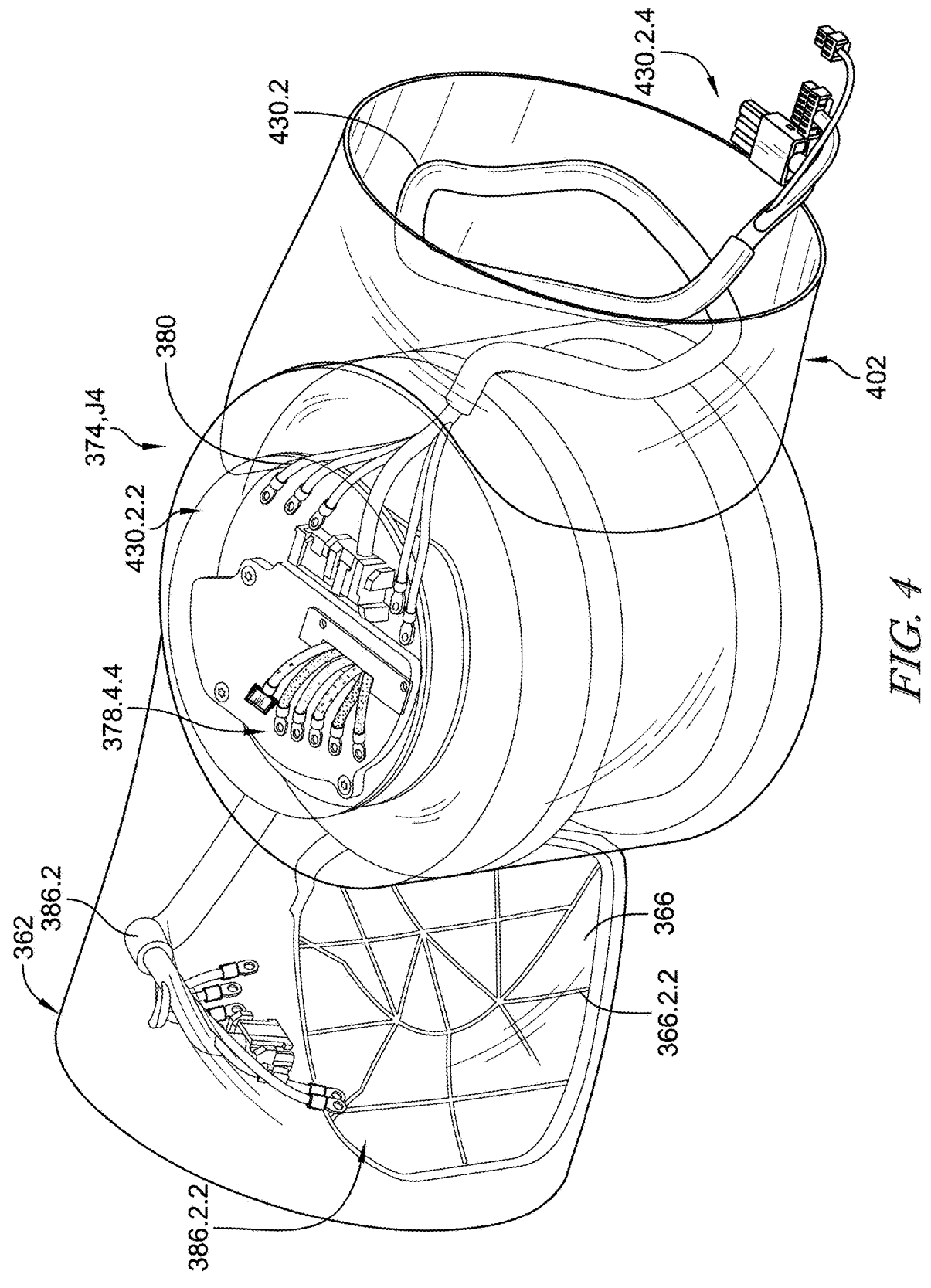
FIG. 4 is a front perspective view of the elbow assembly of FIG. 3.
Figure 5:
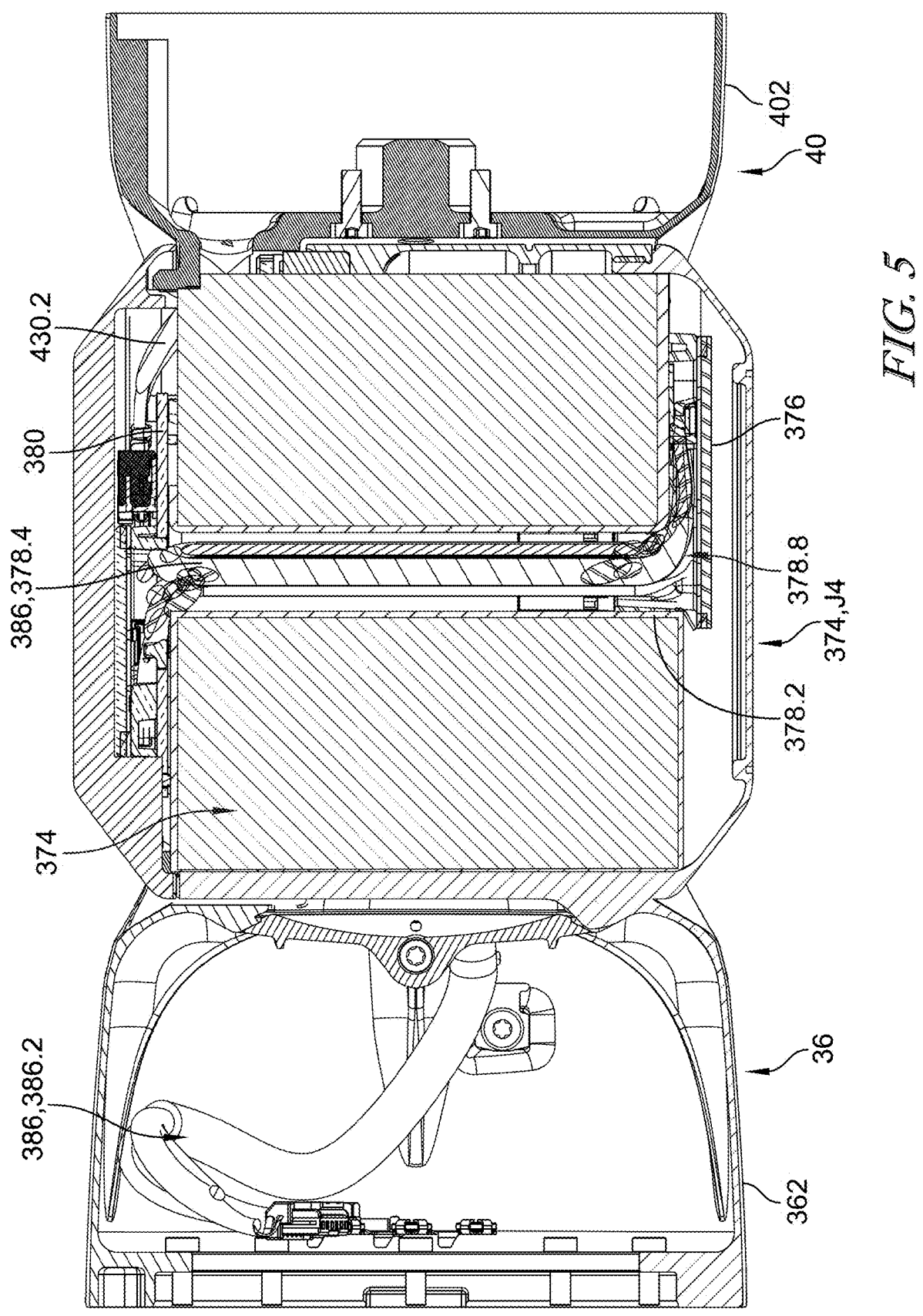
FIG. 5 is a cross-sectional view of the elbow assembly of FIG. 3, showing the through bore wiring in the elbow actuator.
Figure 6:
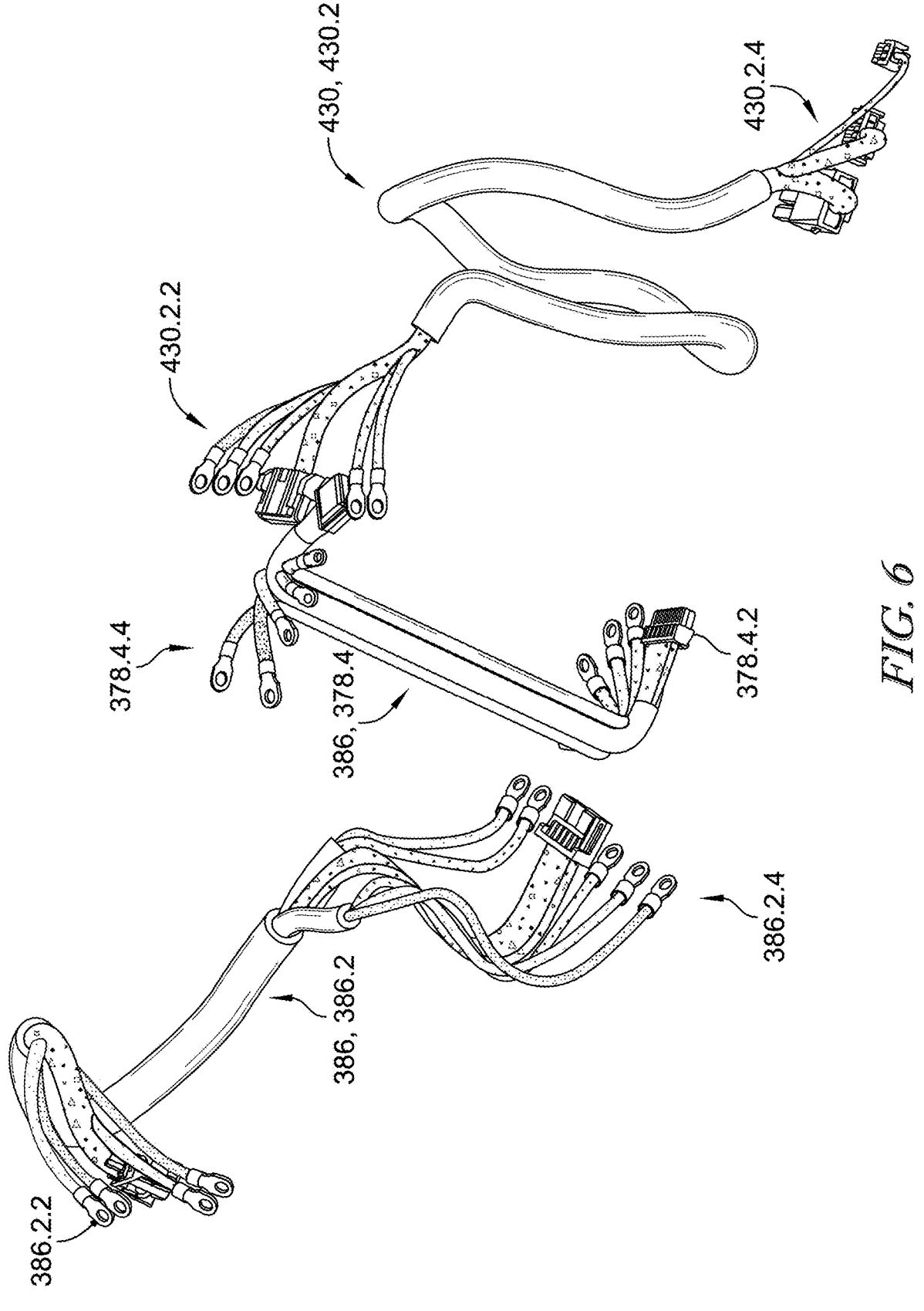
FIG. 6 is a perspective view of the wire bundles for the elbow actuator, showing wiring connections to adjacent actuators of the elbow assembly of FIG. 3.

In FIG. 2, an example of the actuator and wiring arrangements in the shoulder and upper arm assembly is shown. In particular, the actuator wiring 294, 334, 386 electrically couples the following actuators to one another: (i) the arm actuator assembly (J1) 190 that is positioned within the torso 16, (ii) the shoulder actuator assembly (J2) 280 that is positioned within the shoulder housing 270 that is coupled to arm actuator assembly (J1) 190, (iii) the upper humerus actuator assembly or arm twisting actuator assembly (J3) 320 that is positioned within the upper humerus housing 302, and (iv) the lower humerus actuator assembly or elbow actuator assembly (J4) 374. As such, the upper arm actuators (J2-J4) 280, 320, 374 of the left arm 5 are shown coupled in series to the arm actuator (J1) 190 that is housed in the torso 16. In this arrangement, the upper arm twist actuator (J3) 320 and the elbow actuator (J4) 374 are positioned such that the respective axes (A₃, A₄) are perpendicular to each other for rotation of the arm and bending at the elbow.

As discussed above, the arm actuator (J1) 190 housed in the torso 16 is coupled to a power distribution assembly 204 (e.g., power supply or battery) and the actuator controller 952, and the subsequent arm actuators (J2-J4) 280, 320, 374 are coupled in series by actuator wiring 294, 334, 386 providing power and data communication between adjacent actuators (e.g., J1-J2, J2-J3, J3-J4). The wiring 294, 334, 386 used to connect, power, and control the actuators (J2-J4) 280, 320, 374 does not extend across multiple actuators. Stated another way, said wiring 294, 334, 386 does not extend across multiple degrees of freedom. This helps ensure that the electrical power and control wires for each actuator (e.g., actuators J1-J4) are not accidentally pinched, cut, or damaged by the movement of said actuators.

a. Actuator Wiring Assembly

In this embodiment, the actuator wiring 294, 334, 386 includes (i) an adjacent actuator bundle 294.2, 334.2, 386.2 and (ii) an internal wire bundle 284.4, 324.4, 378.4. As best shown in FIGS. 2-6, each actuator is coupled to the previous actuator using an adjacent actuator bundle 294.2, 334.2, 386.2. This is accomplished by coupling the input PCB assemblies 282, 322, 376 for each actuator assembly (J2) 280, (J3) 320, (J4) 374 to the output PCB assemblies 196, 286, 326 of the previous actuator (J1, J2, J3, respectively) in the arm assembly. In particular, the output PCB 196 of the arm actuator assembly (J1) 190 is coupled to the input PCB 282 of the shoulder actuator assembly (J2) 280 via the arm-shoulder wire bundle 294.2. Additionally, the output PCB 286 of the shoulder actuator assembly (J2) 280 is coupled to the input PCB 322 of the upper arm twist actuator assembly (J3) 320 via the shoulder-upper humerus wire bundle 334.2. Further, the output PCB 326 of the upper arm twist actuator assembly (J3) 320 is coupled to the input PCB 376 of the elbow actuator assembly (J4) 374 via the upper humerus-lower humerus wire set/bundle 386.2.

In the illustrative embodiment, the elbow actuator assembly (J4) 374 is coupled between the lower humerus 36 and the upper forearm 40. As such, as shown in FIG. 2, the upper humerus-lower humerus wire set/bundle 386.2 couples the elbow actuator assembly (J4) 374 to the previous adjacent upper arm twist actuator assembly (J3) 320; the internal wire bundle 378.4 couples the first and second PCBs 376, 380 of the elbow actuator assembly (J4) 374; and the lower humerus-upper forearm wire 430.2 coupled to the second PCB 380 of the elbow actuator assembly (J4) 374 extends into the upper forearm 40. As illustrated in FIGS. 3-6, the upper humerus-lower humerus wire set/bundle 386.2 extends through the upper humerus housing 362 to the elbow actuator assembly (J4) 374. In particular, the upper humerus-lower humerus wire set/bundle 386.2 has a first end 386.2.2 and a second end 386.2.4, where the first end 386.2.2 configured to couple with the output PCB 326 of upper arm twist actuator assembly (J3) 320 (shown in FIG. 2) and the second end 386.2.4 is configured to couple to the first PCB 376 of the elbow actuator assembly (J4) 374. The internal wires 378.4 that extend through the elbow actuator assembly (J4) 374 have a first end 378.4.2 configured to couple to the first PCB 376 and a second end 378.4.4 configured to couple to the second PCB 380 of said actuator. The lower humerus-upper forearm wire 430.2 has a first end 430.2.2 coupled to the second PCB 380 of the elbow actuator assembly (J4) 374 and a second end 430.2.4 that extends through the upper forearm housing 402.

It should be understood that each of these wire bundles includes multiple wires (e.g., 294.2, 334.2, 386.2). In an alternative embodiment, said wire bundles may include multiple wires coupled to one another in a lengthwise/serial configuration. In other words, a single wire contained within the wire bundle may be fabricated from a plurality (e.g., between 1 and 10) of wires that are connected in series. Further, it should be understood that each wire contained within the wire bundle may include a single conductive wire or multiple conductive wire strands. Said conductive wires may be encased by a non-conductive sleeve and may be linearly arranged with one another. It should be understood that the wire sets contained in the adjacent actuator bundles are designed to be fixed in place in the robot 1 and are not designed to move relative to other components when the robot 1 moves. As such, said adjacent actuator bundles are tied down and do not need to have a more complex configuration to allow for twisting or bending. As such, the wires of the adjacent actuator bundles may be made from a material that is less expensive or may have a configuration that is less expensive to manufacture (e.g., fewer wires contained in said wire bundle), which also reduces the number of overall wire sets contained in said robot 1. Reducing the number of wire sets may be beneficial because it could increase reliability.

b. Through-Bore Wire Bundle

In this embodiment, each arm actuator assembly (J2) 280, (J3) 320, (J4) 374 includes an actuator 284, 324, 374 having a through-bore opening or receiver 284.8, 324.8, 378.8, a first or input PCB assembly 282, 322, 376, and a second or output PCB assembly 286, 326, 380. The wiring 294, 334, 386 includes (i) an internal wire bundle 284.4, 324.4, 378.4 and (ii) an adjacent actuator bundle 294.2, 334.2, 386.2. In particular, the first PCB assembly 282, 322, 376 of the respective actuator assembly (J2) 280, (J3) 320, (J4) 374 is coupled to the previous actuator assembly (J1) 190, (J2) 280, (J3) 320 by the adjacent actuator bundle 294.2, 334.2, 386.2 and coupled internally to the second PCB assembly 286, 326, 380 by the internal wire bundle 284.4, 324.4, 378.4.

To pass the electrical signals and current from the first or input PCB assemblies 192, 282, 322, 376 to the second or output PCB assemblies 196, 286, 326, 380, each illustrative actuator includes an opening formed through the center of said actuator, referred to herein as the through-bore opening or through-bore receiver 194.8, 284.8, 324.8, 378.8. In particular, the input PCB 192 of the arm actuator assembly (J1) 190 is coupled to the output PCB 196 of said arm actuator assembly (J1) 190 via a bundle of internal wires 194.4 that extend through an internal bore 194.2 associated with through-bore receiver 194.8. Additionally, the input PCB 282 of the shoulder actuator assembly (J2) 280 is coupled to the output PCB 286 of said shoulder actuator assembly (J2) 280 via a bundle of internal wires 284.4 that extend through an internal bore 284.2 associated with through-bore receiver 284.8. Further, the input PCB 322 of the upper humerus actuator assembly or twist actuator assembly (J3) 320 is coupled to the output PCB 326 of said upper humerus actuator assembly or twist actuator assembly (J3) 320 via a bundle of internal wires 324.4 that extend through an internal bore 324.2 associated with through-bore receiver 324.8. Moreover, the input PCB 376 of the lower humerus actuator assembly or elbow actuator assembly (J4) 374 is coupled to the output PCB 380 of said lower humerus actuator assembly or elbow actuator assembly (J4) 374 via a bundle of internal wires 378.4 that extend through the internal bore opening 378.8.

Figure 7:
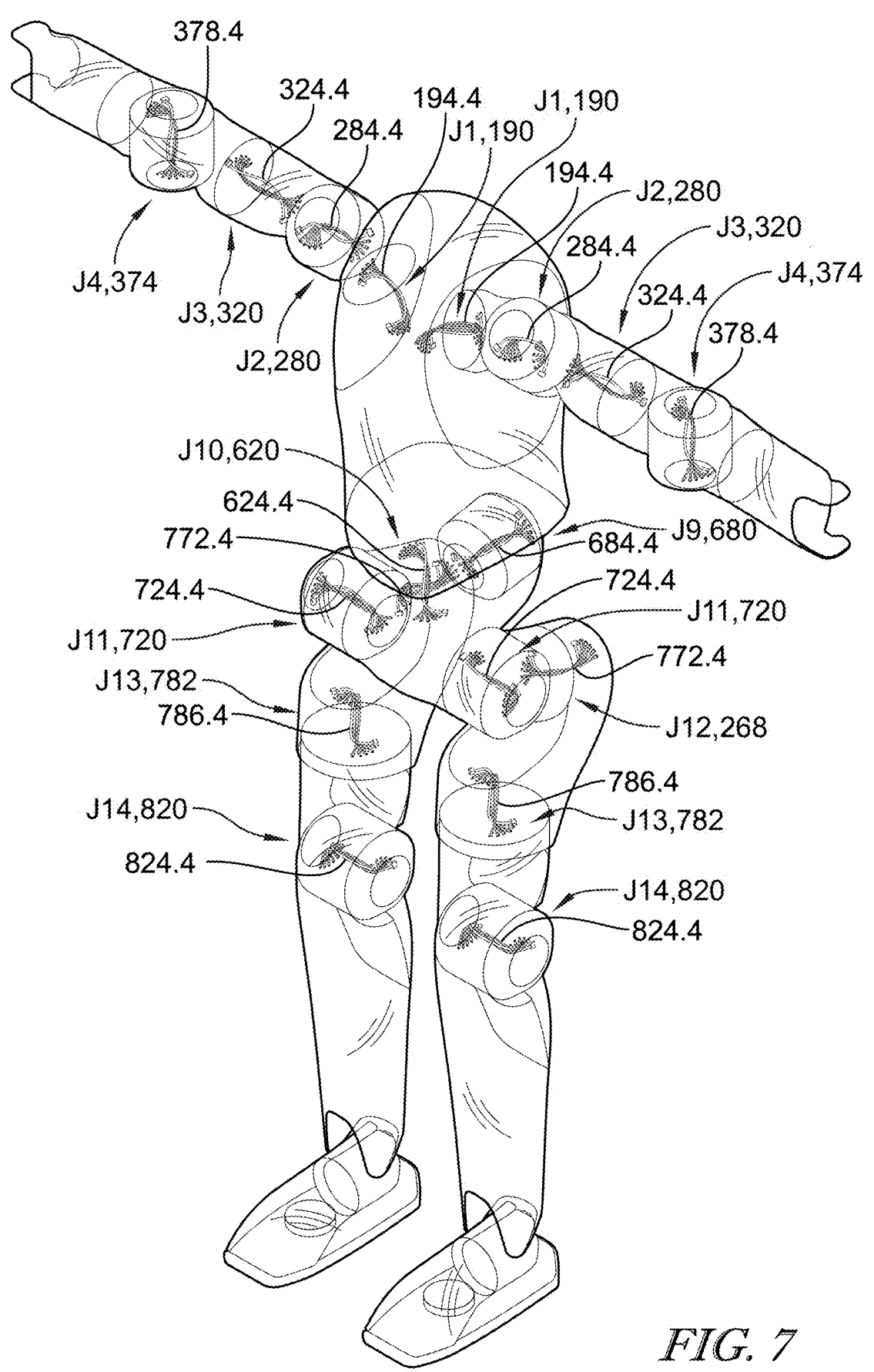
FIG. 7 is a perspective view of the robot of FIG. 1A, wherein the various housings of the robot have been made semi-transparent and internal components have been omitted in order to show the through-bore wiring associated with each actuator contained in said robot.
Figure 8:
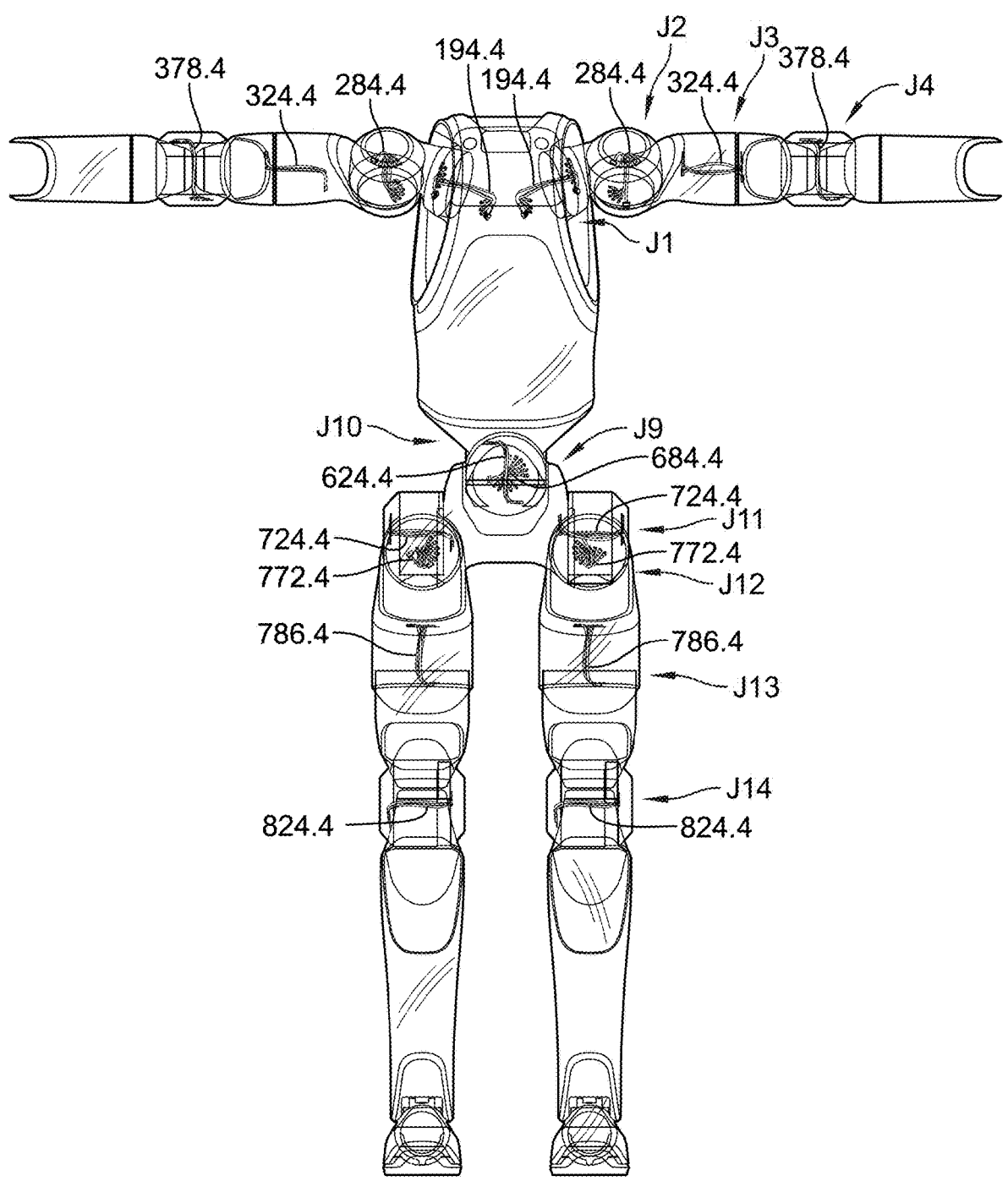
FIG. 8 is a front view of the robot of FIG. 7.
Figure 9:
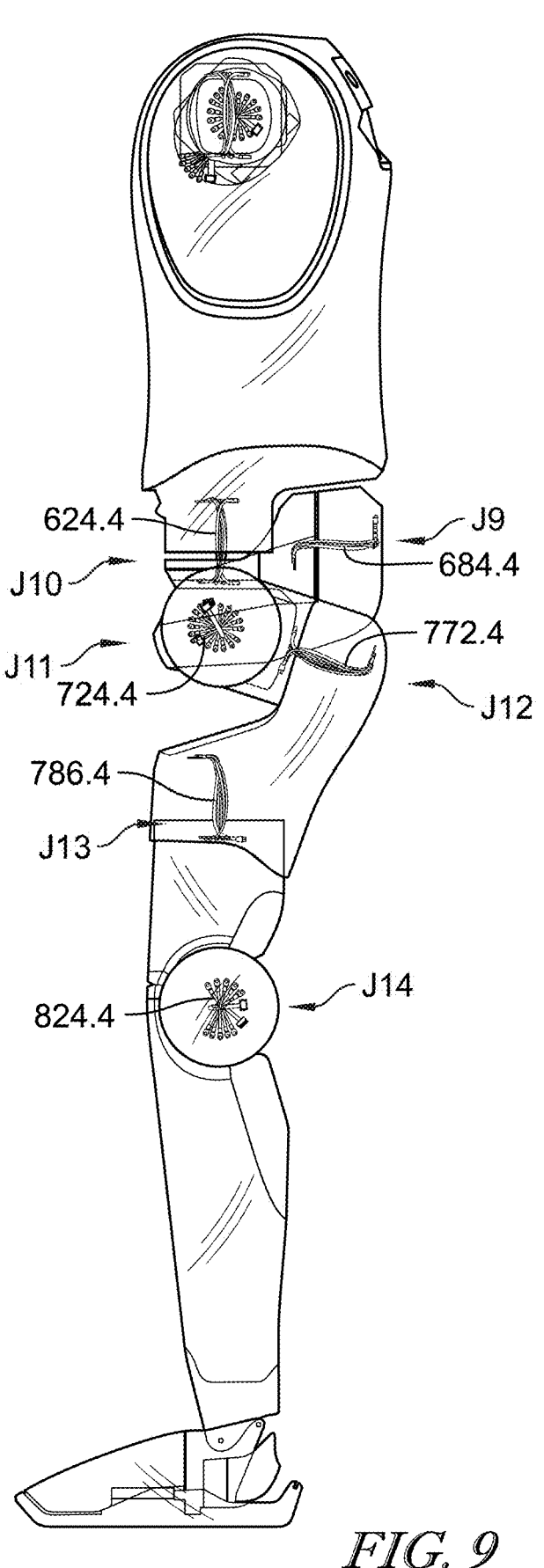
FIG. 9 is a side view of the robot of FIG. 7.

As shown in FIGS. 7-9, the through-bore wiring 194.4, 284.4, 324.4, 378.4, 624.4, 684.4, 724.4, 772.4, 786.4, 824.4 is associated with a majority of the actuators (i.e., J1-J4 and J9-J14) in robot 1. In summary, the through-bore opening (e.g., 378.2) extends completely through the actuators (J1) 190, (J2) 280, (J3) 320, (J4) 374, (J9) 680, (J10) 620, (J11) 720, (J12) 768, (J13) 782, (J14) 820. In some examples, said actuator may optionally include a central or output tube (e.g., 378.2). By extending said through-bore opening (e.g., 378.8) completely through the actuators, the internal wire bundles (e.g., 194.4, 284.4, 324.4, 378.4, 624.4, 684.4, 724.4, 772.4, 786.4, 824.4) can be positioned within these through-bore openings (e.g., 194.8, 284.8, 324.8, 378.8) in order to couple the input PCB assembly (e.g., 192, 282, 322, 376) to the output PCB assembly (e.g., 196, 286, 326, 380). This configuration is beneficial because it eliminates the need to route wires or make conductive paths that extend over a rotating joint, which in turn increases the durability of the robot 1.

The utilization of through-bore wire bundles allows almost all of the moving wires contained in said robot 1 to be positioned within the center of said actuators. This design is not only beneficial because it simplifies wire routing and industrial design of the robot 1, but it also helps protect said wires from damage (e.g., being pinched, bent, or contacting a foreign object, etc.). Additionally, it allows the robot designer to use less expensive wires to connect the actuators (as these wires are not configured to move) and more expensive wires within the through-bore wire bundles, which reduces wiring costs and saves weight. In other embodiments, more expensive wires can be used throughout the robot 1 to minimize utilization of different parts. Said through-bore wire bundles (e.g., 378.4) are specifically designed to rotate within the actuators, wherein a first end (e.g., 378.4.2) of said wire bundles is coupled to the non-moving side, or input side of the actuator and a second end (e.g., 378.4.2) of said wire bundles is coupled to the moving side or output side of the actuator. The first and second ends of the wire bundles are tied down to the input and output boards and are not configured to move relative to said boards. This design helps ensure that the connection between the wire bundles and the boards does not degrade or cause connector wear during use of said robot 1.

Figure 10A:
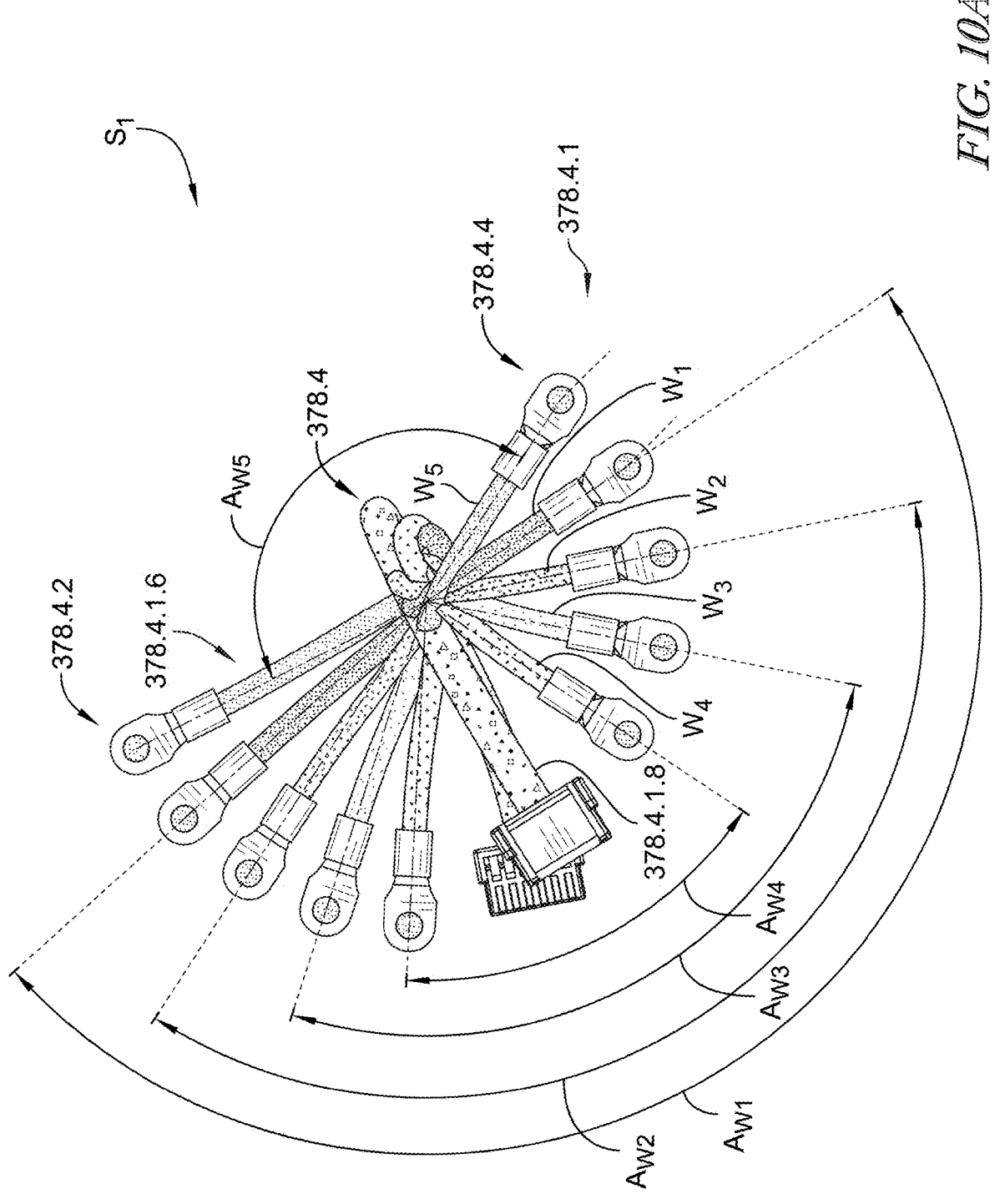
FIG. 10A is an end view of the through-bore wiring contained in the elbow actuator of FIG. 5, shown in an initial state or first state $(S_1)$, where the elbow actuator is the neutral position of FIGS. 1A-1B, wherein a plurality of first connectors associated with wires of the through-bore wiring are angularly arranged relative to a plurality of second connectors associated with said wires.
Figure 10B:
FIG. 10B is an end view of the through-bore wiring of FIG. 10A, shown in a second state $(S_2)$, where the elbow actuator is rotated about 90 degrees.
Figure 11:
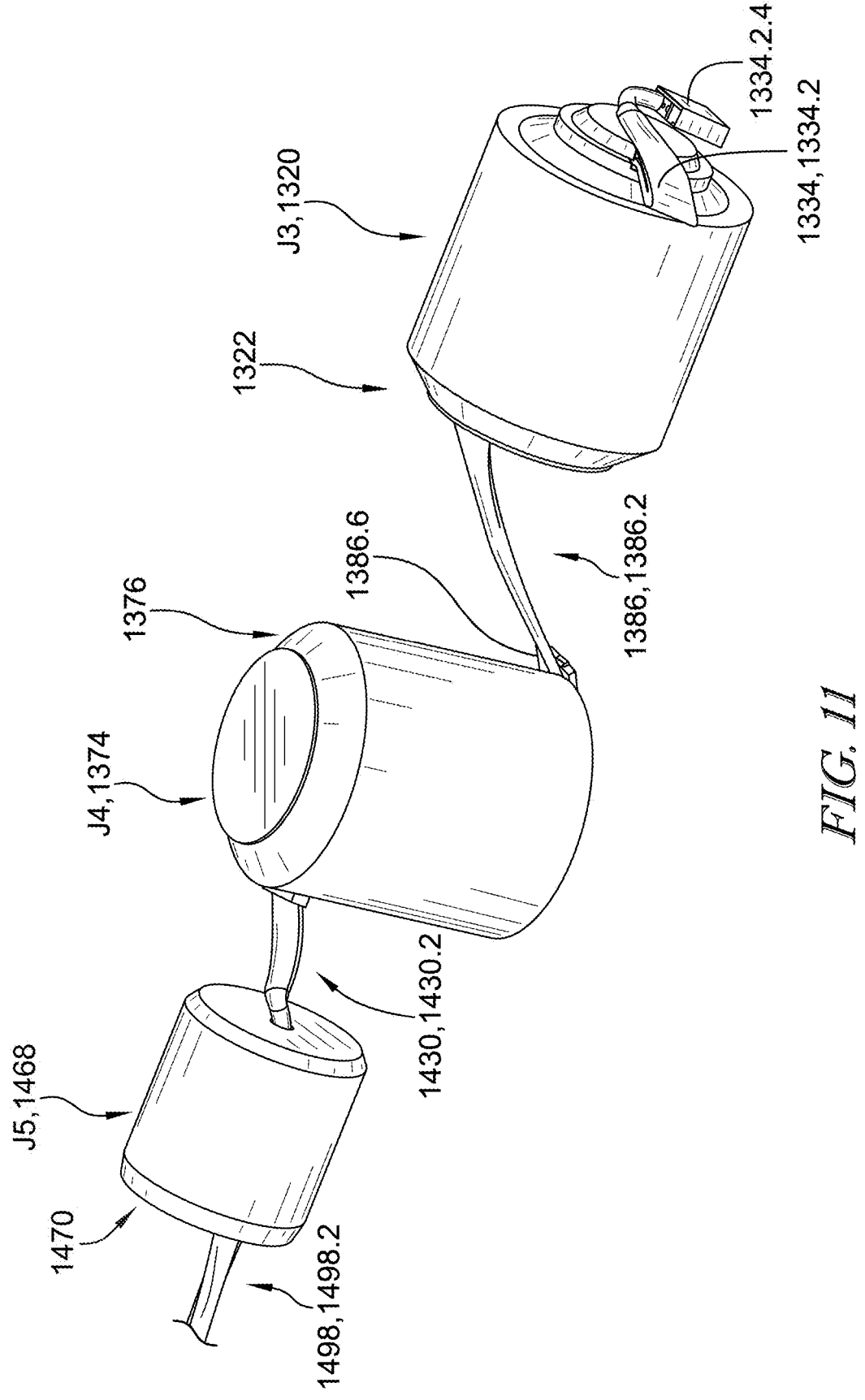
FIG. 11 is a perspective view of a second embodiment of wiring coupling various adjacent actuators in the right arm of the robot of FIG. 1A, showing an arm twist actuator, an elbow actuator, and lower twist actuator, and wherein these actuators include a PCB assembly and a wiring bundle that electrically connects the PCB assembly to a PCB assembly of an adjacent actuator.
Figure 12:
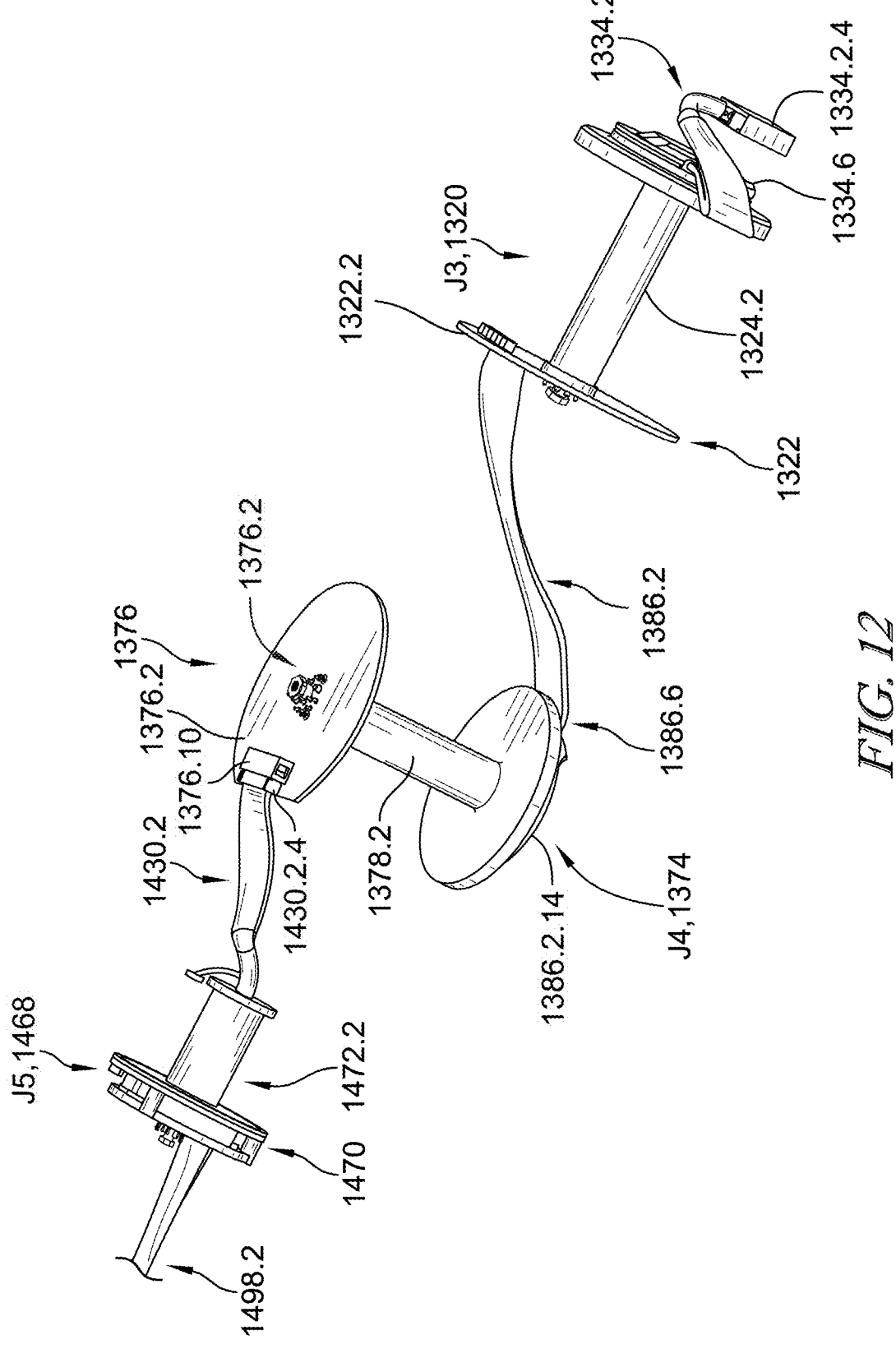
FIG. 12 is a perspective view showing an extent of the actuators of FIG. 11, wherein a majority of the actuator has been omitted to further show the wiring bundle coupling said actuators.
Figure 13:
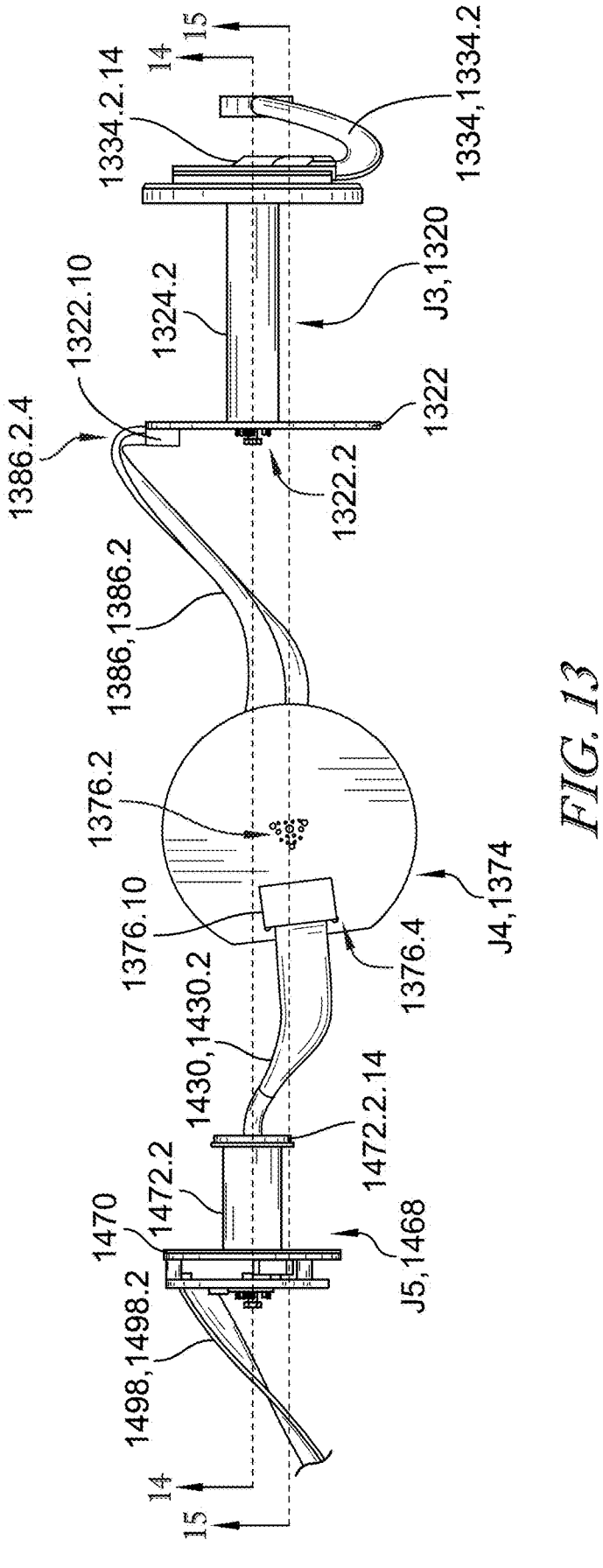
FIG. 13 is a top view of the actuators of FIG. 12.
Figure 14:
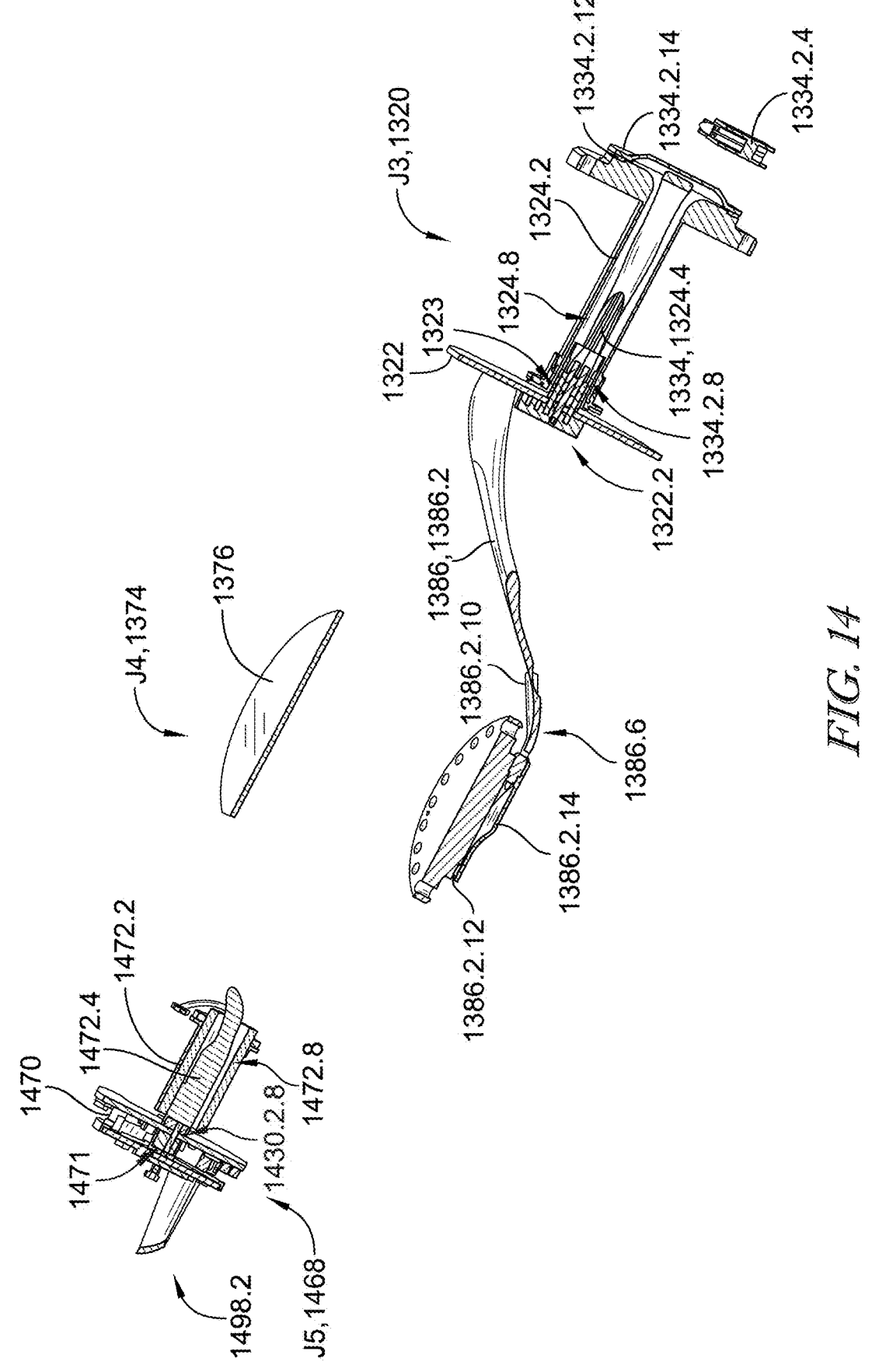
FIG. 14 is a perspective orientation of a cross-sectional view of the actuators and the associated wiring bundles taken along the section line 14-14 in FIG. 13.
Figure 15:
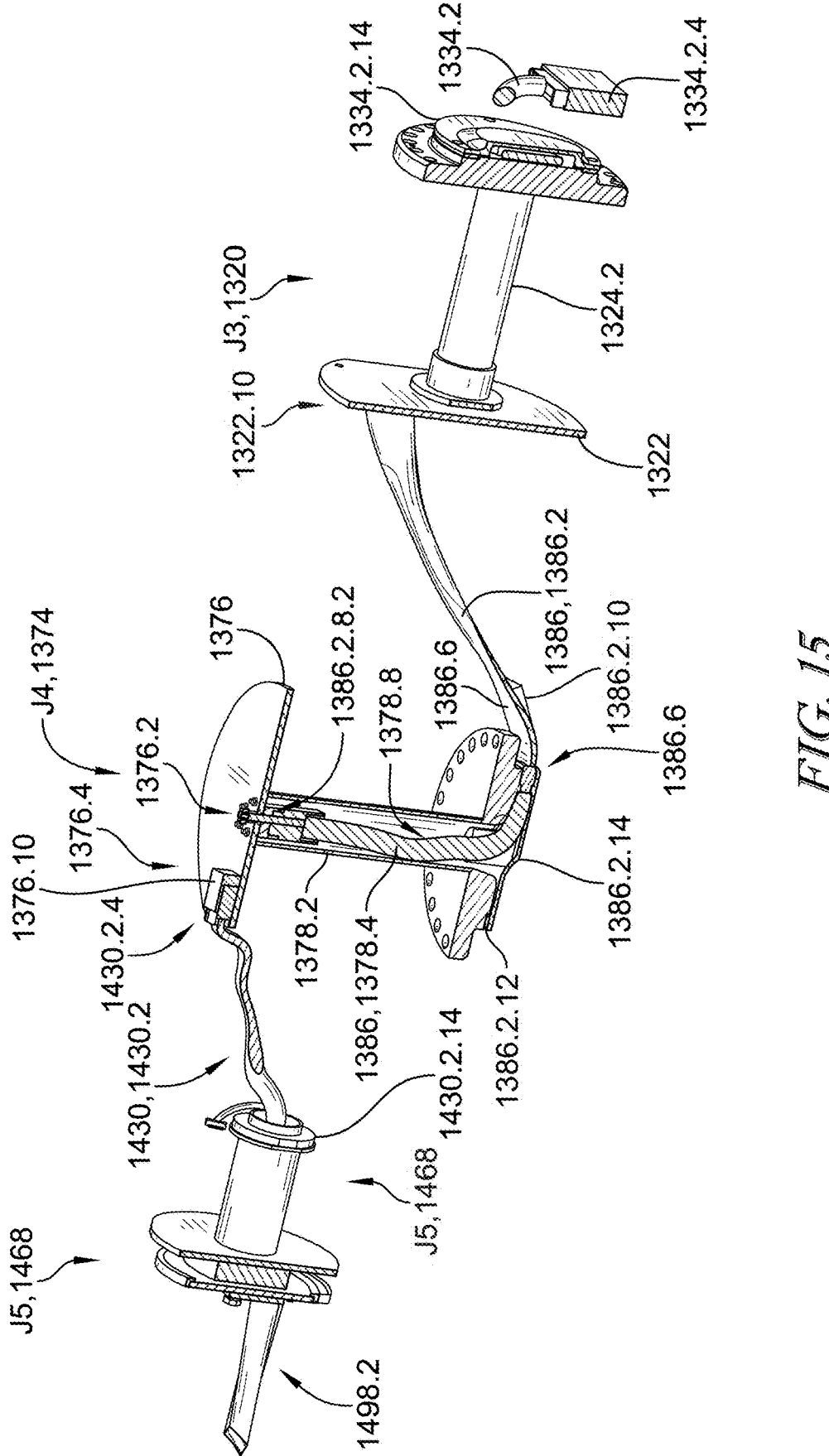
FIG. 15 is a perspective orientation of a cross-sectional view of the actuators and the associated wiring bundles taken along the section line 15-15 in FIG. 13.

Referring to FIGS. 10A-10B, the illustrative internal wire bundle 378.4 includes a plurality of wires 378.4.1 having first and second ends 378.4.2, 378.4.4 respectively. The plurality of wires 378.4.1 includes a set of power wires (W1-W5) 378.4.1.6 and a set of signal wires 378.4.1.8. Generally, the power wires 378.4.1.6 are of a first gauge or first type of wire to deliver power and the signal wires 378.4.1.8 are of a second gauge or second type of wire to deliver control signals and/or low voltage power. For example, the individual power wires 378.4.1.6 may be 18-22 gauge insulated wires and the individual signal wires

378.4.1.8 may be 26-28 gauge wire, where one or more of the individual wires are encased in a non-conductive sleeve.

The first and second ends 378.4.2, 378.4.4 of the internal wire bundle 378.4 include a plurality of connectors 378.4.2.2, 378.4.4.2 (representing collective connectors at each end) coupled to the plurality of wires 378.4.1. In this embodiment, the individual signal wires 378.4.1.8 are arranged and coupled to end connector plugs 378.4.2.8, 378.4.4.8 that may facilitate the connection with respective PCB boards 376, 380. The individual power wires (W1-W5) 378.4.1.6 each include connectors 378.4.2.6a-378.4.2.6e on the first end and 378.4.4.6a-378.4.4.6e on the second end. Collectively, the plurality of connectors 378.4.2.2 at the first end 378.4.2 of the internal wire bundle 378.4 includes connector plug 378.4.2.8 and individual first connectors 378.4.2.6a-378.4.2.6e, and the plurality of connectors 378.4.4.2 at the second end 378.4.4 of the internal wire bundle 378.4 includes connector plug 378.4.4.8 and individual second connectors 378.4.4.6a-378.4.4.6e.

In an example, FIG. 10A shows a top view of the internal wire bundle 378.4 of elbow actuator (J4) 374 in a first state $(S_1)$, where the actuator is in a normal or initial state. The first and second ends 378.4.2, 378.4.4 of the internal wire bundle 378.4, including their respective pluralities of connectors 378.4.2.2, 378.4.4.2, are not designed to be aligned with one another when the actuator is in the normal state. In fact, it is desirable to have the ends offset from one another by a minimum of 10 degrees and preferably more than 50 degrees.

In FIG. 10B, the elbow actuator (J4) 374 is moved to a second state $(S_2)$, which is rotated about 90 degrees. In this second state, the plurality of connectors 378.4.4.2 (specifically connectors like 378.4.4.6a-e and 378.4.4.8) coupled to the output PCB assembly 380 rotate with respect to a stationary extent of the actuator, causing the portion of wire bundle 378.4 to twist within the through-bore receiver 378.8. The initial offset arrangement in the first state $(S_1)$ reduces the amount of bending of the wires within the through-bore receiver 378.8 when moving to the second state $(S_2)$.

The offset range between the first and second plurality of connectors 378.4.2.2, 378.4.4.2 of the individual power wires (W1-W5) 378.4.1.6 are contained in the below table. In particular, shown are the angle offsets of the individual power wire connectors 378.4.2.6a-e and 378.4.24.6a-e in an initial state the illustrated example in FIG. 10A.

TABLE 2

| Wire Angle (Degrees) | Lower Bound | Upper Bound | Preferred Lower Bound | Preferred Upper Bound |
|---|---|---|---|---|
| $A_{w1}$ | 138 | 206 | 155 | 189 |
| $A_{w2}$ | 108 | 161 | 121 | 148 |
| $A_{w3}$ | 78 | 116 | 87 | 107 |
| $A_{w4}$ | 48 | 71 | 53 | 65 |
| $A_{w5}$ | 121 | 181 | 136 | 166 |

In certain embodiments, it is desirable to place the first plurality of connectors (e.g., 378.4.2.2) in a position that ensures that an input wire does not kink or bend when contacting the input PCB (e.g., 376). Based on this location, it is then desirable to rotate the second connection to the middle of the range of motion of said actuator. For example, if the first connector is placed at a first position, and the range of motion of the actuator is 240 degrees, then the second connector (e.g., 378.4.4.2) may be positioned at 120 degrees relative to the first connector. This will minimize the amount in either direction that said middle wire portion may need to rotate during the use of the actuator. In other embodiments, the outer or innermost connectors may be placed at the middle of said rotation of the actuator. And in further embodiments, each and every wire may have substantially the same offset between its first and second connectors (e.g., 378.4.2.2, 378.4.4.2) regardless of the range of motion of the actuator. Still other embodiments, may require that every set of wire bundles have a different offset between the first and second connectors (e.g., associated with 378.4.2.2 and 378.4.4.2) do to the positional relationship of the input and output boards. In summary, the offsets between the first and second connectors (e.g., 378.4.2.2 and 378.4.4.2) may be based on the range of motion of the associated actuator, may be set to a defined value for all actuators, may vary between actuators due to the positional relationships of the PCBs, may have a different configuration, or a combination of the above.

The above described offsets between the first and second connectors (e.g., 378.4.2.2 and 378.4.4.2) of said wire bundle allow the wires to have an integrated twist when the actuator is in a neutral position. Said integrated twist may be a helix or any other known type of twist. To enable the wire to move when said actuator moves, it should be understood that each wire contained within the wire bundle may include multiple conductive wire strands. Specifically, each wire may contain more than 20, and preferably more than 50, wire strands. It should be understood that increasing the number of wire strands within each wire allows said wire to be more flexible, which helps reduce wear on the wire as the actuator is moving (which causes said wire to rotate). Said conductive wire strands may be encased by a non-conductive sleeve.

D. Second Embodiment

Shown as a second embodiment of the actuator wiring assembly 1960 in FIGS. 11-29, robot 1001 includes a similar arrangement of actuators (J1-J16) as robot 1 described above, but with an alternative actuator wiring arrangement for coupling adjacent actuators. For the sake of brevity, the above disclosure in connection with arm assembly 5 will not be repeated below, but it should be understood that across embodiments, like numbers represent like structures. For example, individual part assemblies (e.g., arms 5, torso 16, pelvis 64, legs 5) of robot 1 are similarly numbered for robot 1001 (e.g., arms 1005, torso 1016, pelvis 1064, legs 1006). Also, the actuators are generally arranged within robot 1001 to provide the same number of degrees of freedom and similar ranges of motion as robot 1. In this embodiment, robot 1001 is configured such that all of the main actuators (J1-J16), except for those in the hands, are rotary actuators that include a through-bore opening. The main difference from the first embodiment is that the separate PCB assemblies (e.g., PCBs 376, 380) positioned on opposite sides of the individual actuators (e.g., elbow actuator (J4) 374) of the first embodiment, are consolidated to one PCB assembly (e.g., PCB 1376) on one side (e.g., a stationary, fixed, or non-moving portion) of the respective actuator (e.g., elbow actuator (J4) 1374) in the second embodiment. As such, the actuator wiring for adjacent actuators is modified to be one continuous wire bundle, where a first portion is a through-bore portion is positioned within the actuator and a second portion is positioned outside the actuator. As an illustrative example, the actuator wiring 1386 for elbow actuator (J4) 1374 and may be relied upon for any of the main actuators (J1-J16) in robot 1001.

In the illustrative example, the second embodiment of the actuator wiring assembly 1960 includes (i) a first PCB 1376 coupled to a first actuator (J4) 1374, (ii) a second PCB 1322 coupled to a second actuator (J3) 1320, and (iii) a wire bundle 1386 coupled between the first PCB 1376 and second PCB 1322. The first PCB 1376 and second PCB 1322 each including a first interface region 1376.2, 1322.2 with a first PCB terminal 1377, 1323 coupled thereto, and a second interface region 1376.4, 1322.4 with a second PCB terminal 1376.10, 1322.10 coupled thereto. The wire bundle 1386.2 includes: a first end connector 1386.2.8 designed to be coupled to the first PCB terminal 1377 of the first PCB 1376 and a second end connector 1386.2.4 designed to be coupled to the second PCB terminal 1322.10 of the second PCB 1322.

a. PCB Assembly

In this context, each arm actuator assembly (J3) 1320, (J4) 1374, (J5) 1468 includes an actuator 1324, 1378, 1472 with an actuator opening or through-bore receiver 1324.8, 1378.8, 1472.8 formed in the central portion of said actuator 1324, 1378, 1472 and PCB assembly 1322, 1376, 1470 positioned adjacent to one side of said actuator 1324, 1378, 1472. In particular, said actuator 1324, 1378, 1472 includes a central rotational axis that at least partially defines the through-bore receiver 1324.8, 1378.8, 1472.8. Further, said actuator 1324, 1378, 1472 may include a first side 1324.1, 1378.1, 1472.1 defined on a non-moving portion of said actuator and a second side 1324.9, 1378.9, 1472.9 defined on a moving or output portion of said actuator 1324, 1378, 1472. For example, the first side may be coupled or fixed within a housing (e.g., housing 1302, 1362, 1402) of the robot 1001. In the illustrative embodiment, the PCB assembly 1322, 1376, 1470 is positioned adjacent to the first side 1324.1, 1378.1, 1472.1 of said actuator 1324, 1378, 1472 and substantially perpendicular to the through-bore receiver 1324.8, 1378.8, 1472.8.

Each PCB assembly 1322, 1376, 1470 is configured with a substrate 1322.1, 1376.1, 1470.1 having a first surface 1322.1.2, 1376.1.2, 1470.1.2 facing outward from the respective actuator 1324, 1378, 1472 and a second surface 1322.1.4, 1376.1.4, 1470.1.4 facing the first side 1324.1, 1378.1, 1472.1 of said actuator 1324, 1378, 1472. To enable power and control signals to be transferred from an upstream actuator to said actuator, said substrate 1322.1, 1376.1, 1470.1 includes: (i) a first interface region 1322.2, 1376.2, 1470.2, and (ii) a second interface region 1322.4, 1376.4, 1470.4. In particular, the first interface region 1322.2, 1376.2, 1470.2 includes openings 1322.2.2, 1376.2.2, 1470.2.2 formed through the substrate 1322.1, 1376.1, 1470.1 configured to receive an extent of a first PCB terminal 1323, 1377, 1471.

Figure 22:
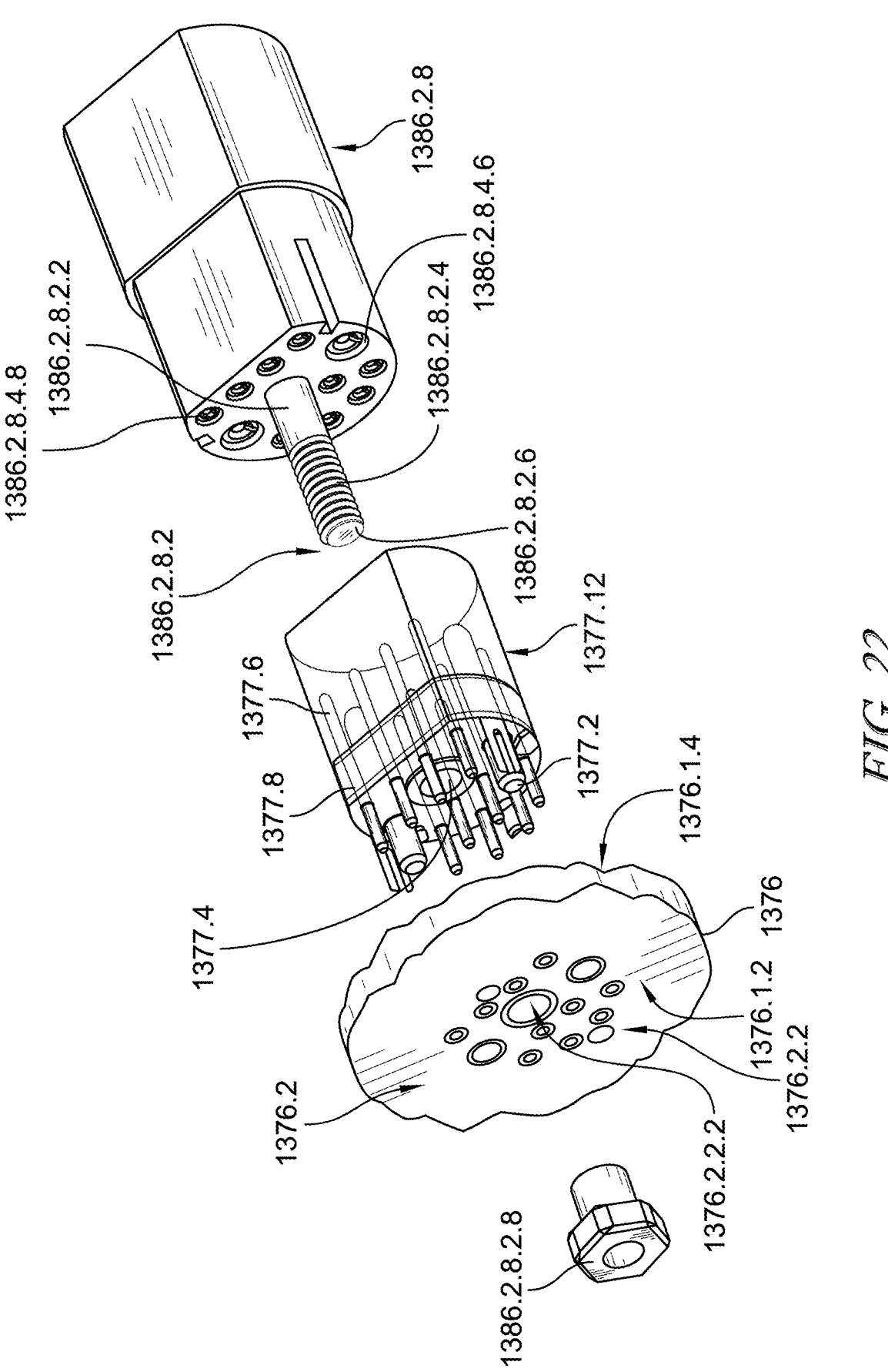
FIG. 22 is an exploded view of the first connection region of the elbow actuator PCB, a first PCB terminal, and the first end connector of an actuator wiring bundle of FIG. 21.

An illustrative example of the first PCB terminal 1377 is best shown in FIG. 22 and includes: (i) a base 1377.8 having a first surface 1377.8.2 and an opposite second surface 1377.8.4, (ii) a chassis opening 1377.4, (iii) a set of power pins 1377.2, (iv) a set of signal pins 1377.6, and (v) mounting projections 1377.10. The first PCB terminal 1377 is configured to be coupled to the second surface 1376.1.4 of the PCB 1376 in the first interface region 1376.2. The chassis opening 1377.4 is substantially centered and extends through the base 1377.8. The power pins 1377.2 (e.g., a positive voltage pin, a ground pin, etc.) and plurality of signal pins 1377.6 surround the chassis opening 1377.4 and extend through both surfaces 1377.8.2, 1377.8.4 of the base 1377.8, and the mounting projections 1377.10 extend from the first surface 1377.8.2 of the base 1377.8. An extent of the power pins 1377.2 and signal pins 1377.6 and the mounting projections 1377.10 extending from the first surface 1377.8.2 of the base 1377.8 are configured to be received by the openings 1376.2.2 in the first interface region 1376.2 of the PCB 1376 and soldered thereto, where the chassis opening 1377.4 aligns with a corresponding opening 1376.2.2.2 in the first interface region 1376.2. The extent of the power pins 1377.2 and signal pins 1377.6 extending from the second surface 1377.8.4 of the base 1377.8 are configured to mate with the first end connector 1386.2.8 of the wiring bundle 1386, where a chassis projection 1386.2.8.2.2 of the first end connector 1386.2.8 is received into the chassis opening 1377.4 and extends through the base 1377.8 and PCB 1376, protruding from the first surface 1376.1.2 of the PCB 1376.

The base 1377.8 of the first PCB terminal 1377 may have a perimeter with a substantially circular extent and a flat extent and be sized to mate with the first end connector 1386.2.8 of the actuator wiring 1386. A sheath 1377.12 can be coupled to the perimeter of the first PCB terminal 1377 to form a receiving portion 1377.12.2. The interior of the receiving portion 1377.12.2 conforms with the shape of the base 1377.8 of the first PCB terminal 1377 and is configured to receive an extent of the first end connector 1386.2.8. A flat extent of the first end connector 1386.2.8 corresponds with a flat extent of the receiving portion 1377.12.2 to ensure that the chassis pin 1386.2.8.2 is aligned with the chassis opening 1377.4 and the respective power and signal receivers 1386.2.8.4.6, 1386.2.8.4.8 are aligned with the power and signal pins 1377.2, 1377.6.

Additionally, the second interface region 1376.4, includes a second PCB terminal 1376.10 coupled to the first surface 1376.1.2 of the PCB 1376. The second PCB terminal 1376.10 may include a male set of pins that are designed to be received by the second end connector 1386.2.4, of the wiring bundle 1386.

b. Actuator Wire Assembly

Referring to FIGS. 12-15, adjacent arm actuators (J3) 1320, (J4) 1374, (J5) 1468 include actuator wiring 1334, 1386, 1430 configured to couple to the previous actuator (e.g., arm actuators J2, J3, J4, respectively). The actuator wiring 1334, 1386, 1430 includes (i) an actuator, internal, or through-bore portion 1324.4, 1378.4, 1472.4 (ii) an adjacent actuator bundle portion 1334.2, 1386.2, 1430.2 that extends to the previous actuator, and (iii) a transition portion 1334.6, 1386.6, 1430.6 therebetween. As discussed above, the rotary actuators (e.g., elbow actuator (J4) 1374) of robot 1001 include a through-bore opening (e.g., through-bore receiver 1378.8) and a PCB assembly (e.g., PCB 1376) on one side (e.g., a stationary, fixed, or non-moving portion) of the respective actuator. Optionally, the actuators may also include a central output tube 1324.2, 1378.2, 1472.2 to facilitate and/or contain the through-bore wire portion 1324.4, 1378.4, 1472.4. Generally, the through-bore portion 1324.4, 1378.4, 1472.4 of the bundle of wires 1334.1, 1386.1, 1430.1 is arranged in a first general shape and the adjacent actuator bundle portion 1334.2, 1386.2, 1430.2 is arranged in a second general shape. For example, the first general shape of the through-bore portion 1324.4, 1378.4, 1472.4 may include a circular extent configured to fit within the through-bore receiver 1324.8, 1378.8, 1472.8 and/or central output tube 1324.2, 1378.2, 1472.2 received therein. The second general shape of the adjacent actuator bundle portion 1334.2, 1386.2, 1430.2 may be rectangular or substantially flattened.

Generally, the actuator wiring 1334, 1386, 1430 includes a bundle of wires 1334.1, 1386.1, 1430.1 configured to deliver power and/or data. For example, wire bundles 1334.1, 1386.1, 1430.1 include a set of power wires 1334.1.6, 1386.1.6, 1430.1.6 and a set of signal wires 1334.1.8, 1386.1.8, 1430.1.8. For example, the individual power wires 1334.1.6, 1386.1.6, 1430.1.6 may be configured for a high voltage (e.g., 48 volts) or ground. The individual signal wires 1334.1.8, 1386.1.8, 1430.1.8 may be configured for data communication (e.g., ethernet), or low voltage power (e.g., 24 volts, 5 volts, ground, etc.).

Figure 16:
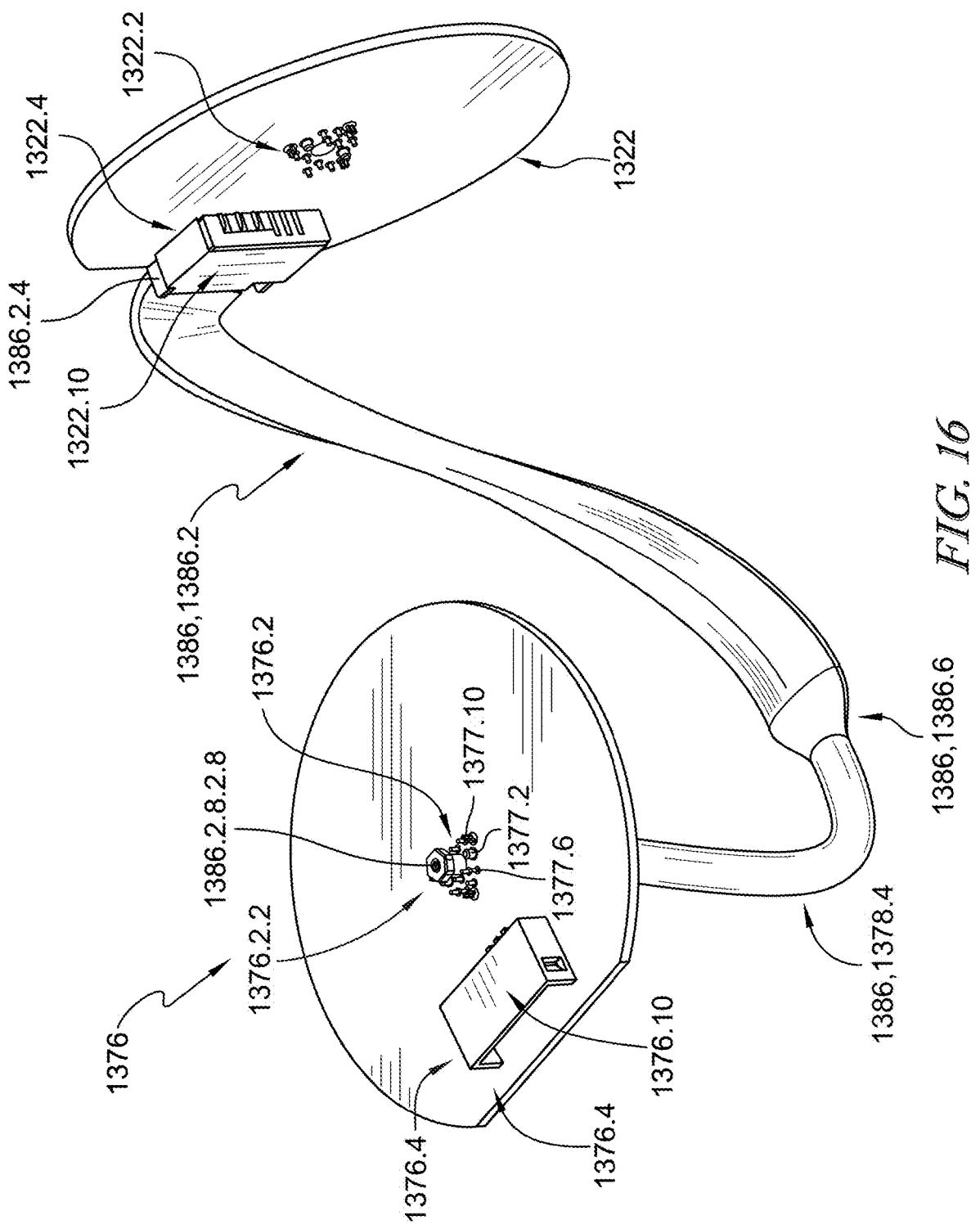
FIG. 16 is a first perspective view of a wiring bundle coupling the PCB of the elbow actuator and the PCB of the upper arm twist actuator of FIG. 12.
Figure 17:
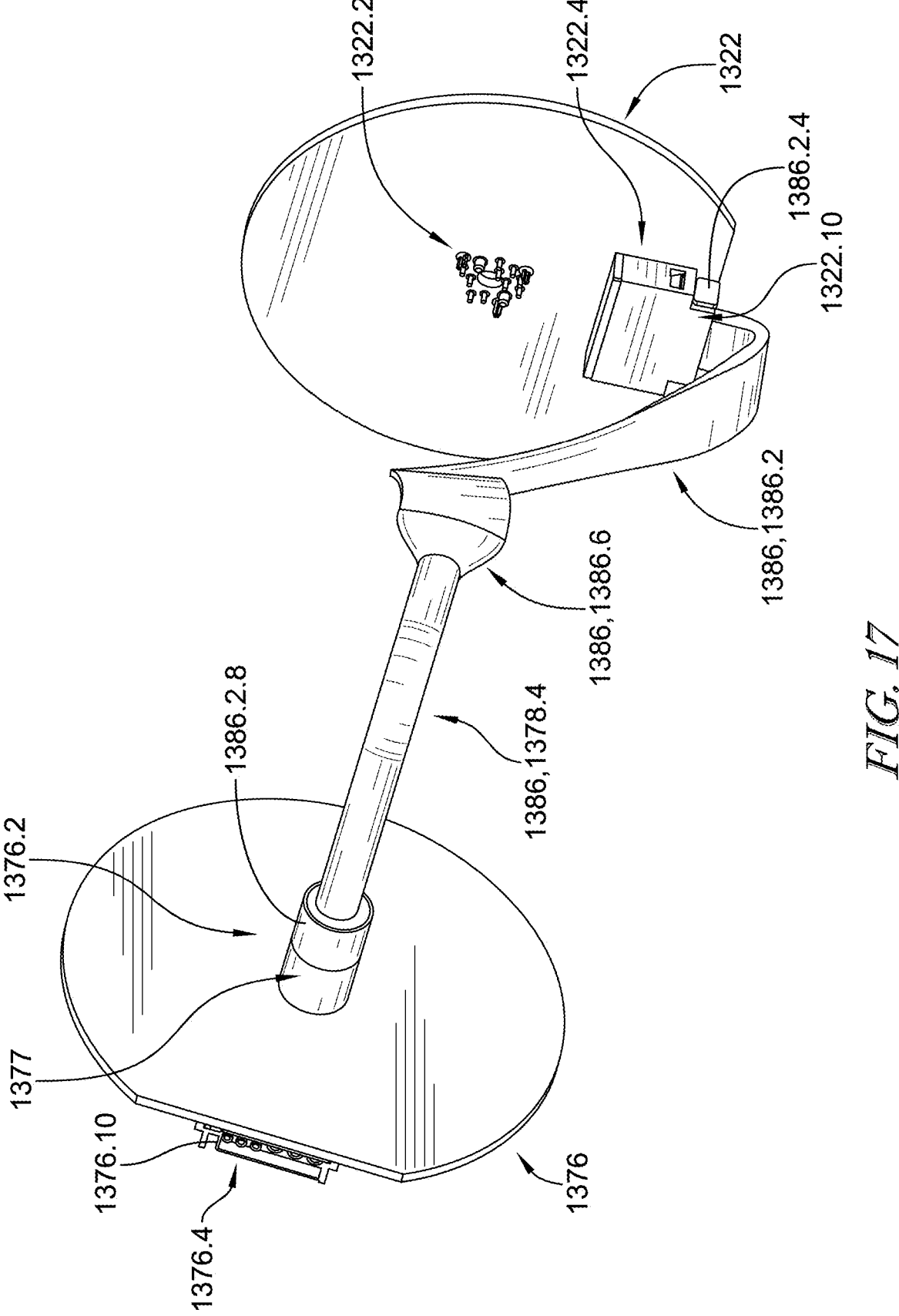
FIG. 17 is a second perspective view of the PCBs and the wire bundle of FIG. 16.

For example, as shown in FIGS. 16-17, the actuator wiring 1386 extends from a first end connector 1386.2.8 at a first end 1386.1.2 to the second end connector 1386.2.4 at the second end 1386.1.4. The first end connector 1386.2.8 at the first end 1386.1.2 is coupled to the PCB 1376 of the elbow actuator (J4) 1374 and the second end connector 1386.2.4 at the second end 1386.1.4 is coupled to the PCB 1322 of the upper arm twist actuator (J3) 1320. As shown, the actuator wiring 1386 includes a transition portion 1386.6 that includes the transition from the first shape to the second shape. Although the through-bore portion 1378.4 and the adjacent actuator bundle portion 1386.2 are discussed as two different portions, it should be understood that said portions are exactly that, portions of a continuous wire bundle. In other words, a single continuous wire that is coupled to a pin in the first end connector and a pin in the second end connector includes two portions, while being made from a single wire. Stated a different way, single continuous wires extend between the pins of the first and second end connectors (e.g, 1386.2.8, 1386.2.4), while also having different portions (e.g., a through-bore portion and an adjacent actuator bundle portion).

For example, the PCB assemblies 1322, 1376, 1470 of arm actuators (J3) 1320, (J4) 1374, (J5) 1468 may be configured to enable said actuator to accept power from an upstream source (e.g., previous adjacent actuator) and deliver power to a downstream source (e.g., next adjacent actuator), control the motor of said actuator, obtain measurements from the torque cell, encoder(s), and/or resolver (s). As shown, each PCB assembly 1322, 1376, 1470 is coupled to one side of the respective actuator (J3) 1320, (J4) 1374, (J5) 1468, wherein the PCB assembly 1322, 1376, 1470, is typically positioned adjacent to the motor and on the opposite side of the output and/or gearbox. Similar to the first embodiment, the arm assembly 1005 of the second embodiment robot 1001 includes six actuators (J2-J7) between the torso 1016 and hand 1056, where the arm assembly 1005 is further coupled to an arm actuator (J1) 1190 residing in the torso 1016. Each actuator (J2-J7) in the arm assembly 1005 is electrically coupled to the previous actuator (J1-J6), respectively. For example, the actuator wiring (e.g., 1334, 1386, 1430) extends from a first end connector (e.g., 1334.2.8, 1386.2.8, 1430.2.8) that couples to said PCB assembly (e.g., 1322, 1376, 1470) of an actuator (J3, J4, J5) and extends to a previous adjacent actuator (J2, J3, J4). Additionally, as shown in FIGS. 11-15, actuator wiring 1498 may further couple wrist flex actuator (J6) 1484 to lower arm twist actuator (J5) 1468. In this arrangement, the arm actuator (J1) 1190 housed in the torso 1016 is coupled to a power distribution assembly (e.g., battery) and the actuator controller.

It should be understood that each of these wire bundles 1334.1, 1386.1, 1430. 1 includes multiple wires, wherein the power wires 1334.1.6, 1386.1.6, 1430.1.6 are insulated from the signal wires 1334.1.8, 1386.1.8, 1430.1.8. For example, the power wires 1386.1.6 may be of a first gauge or first type of wire to deliver power (e.g., 18-22 gauge) and the signal wires 1386.1.8 may be of a second gauge or second type of wire to deliver control signals and/or low voltage power (e.g., 26-28 gauge). The signal wires 1386.1.8 may be arranged in twisted pairs in order to help avoid packet loss or EMI effects from the power wires 1386.1.6. In an alternative embodiment, said wire bundle assemblies may include multiple wires coupled to one another in a length-wise/serial configuration. In other words, a single wire contained within the wire bundle assemblies may be fabricated from a plurality (e.g., between 1 and 10) of wires that are connected in series. Further, it should be understood that each wire contained within the wire bundle assemblies may include a single conductive wire strand, but preferably multiple conductive wire strands. Said conductive wire strands may be encased by a non-conductive sleeve and may be linearly arranged with one another. Reducing the number of wire sets may be beneficial because it could increase reliability.

1. Through-Bore Wire Portion

The through-bore wire portion 1324.4, 1378.4, 1472.4 of the bundle of wires 1334.1, 1386.1, 1430.1 is associated with a majority of the actuators of the robot 1, and in the illustrative arm actuators (J3) 1320, (J4) 1374, (J5) 1468. To pass the electrical signals and current, in series, across the arm actuators (J3) 1320, (J4) 1374, (J5) 1468, each actuator (J3) 1320, (J4) 1374, (J5) 1468 includes a central output tube 1324.2, 1378.2, 1472.2 positioned within the through-bore receiver 1324.8, 1378.8, 1472.8 and extends from an extent of the PCB assembly 1322, 1376, 1470 to the opposing side of the actuator housing and is designed to receive the actuator or through-bore portion 1324.4, 1378.4, 1472.4 of actuator wiring 1334, 1386, 1430. Said through-bore wire portion 1324.4, 1378.4, 1472.4 may be specifically designed to rotate within the actuators, which may be facilitated by utilizing stranded wires that have strong flexibility rates, may have a pre-twisted configuration, and/or may have the largest gauge wire (i.e., smallest diameter) that can sufficiently meet the power and/or signal requirements.

This design is beneficial because it eliminates the need to route the wires or make conductive paths that extend over a rotating joint, which in turn increases the durability of the robot 1001. Additionally, it reduces the size of the package for the industrial design team, improves reliability due to accidental falls or contact with other objects, and helps ensure commonality between the PCB assemblies 1322, 1376, 1470. In the illustrative embodiments, the through-bore wire portions 1324.4, 1378.4, 1472.4 are substantially cylindrical in overall shape with a round diameter, which helps the wire be packaged within the through-bore passage of the actuator. In other embodiments, the through-bore wire portion may be any suitable shape that is able to be packaged within the actuator housing.

2. Strain Relief Member

The actuator wiring bundle 1334, 1386, 1430 may include a strain relief member 1334.2.10, 1386.2.10, 1430.2.10 disposed between the through-bore wire portion 1324.4, 1378.4, 1472.4 and the adjacent actuator bundle portion 1334.2, 1386.2, 1430.2. The strain relief member 1334.2.10, 1386.2.10, 1430.2.10 dresses and protects the wires actuator wiring bundle 1334, 1386, 1430 in the transition portion 1334.6, 1386.6, 1430.6. The strain relief member 1334.2.10, 1386.2.10, 1430.2.10 may also orient, space apart, and position the wires over the transition from the substantially round profile of the through-bore wire portion 1324.4, 1378.4, 1472.4 to the substantially flat profile of the adjacent actuator bundle portion 1334.2, 1386.2, 1430.2 and reduce wire strain that is associated with said wire transitions. For example, the strain relief member 1334.2.10, 1386.2.10, 1430.2.10 may include an adhesive to hold the wires in position.

Additionally, the transition portion 1334.6, 1386.6, 1430.6 may include a sealing member 1334.2.12, 1386.2.12, 1430.2.12, and an actuator cover 1334.2.14, 1386.2.14, 1430.2.14 that are designed to function together to: (i) seal the internal extent of the actuator (J3) 1320, (J4) 1374, (J5) 1468, and (ii) secure an extent of the wiring bundle to the actuator to help ensure that the actuator does not pinch the wire bundle 1334, 1386, 1430. The sealing member 1334.2.12, 1386.2.12, 1430.2.12 and actuator cover 1334.2.14, 1386.2.14, 1430.2.14 include a wire bundle opening 1334.2.14.2, 1386.2.14.2, 1430.2.14.2 to allow said wire bundle to exit the actuator. The sealing member 1334.2.12, 1386.2.12, 1430.2.12 and actuator cover 1334.2.14, 1386.2.14, 1430.2.14 may be integrally formed or formed as separate components. Additionally, said sealing member 1334.2.12, 1386.2.12, 1430.2.12 and actuator cover 1334.2.14, 1386.2.14, 1430.2.14 may be formed from any material and may be flexible, bendable, semi-rigid, and/or rigid. Thus, said sealing member 1334.2.12, 1386.2.12, 1430.2.12 and actuator cover 1334.2.14, 1386.2.14, 1430.2.14 may be formed using 3D printing or injection molding. The actuator cover 1334.2.14, 1386.2.14, 1430.2.14 may be coupled to the second side 1324.9, 1378.9, 1472.9 of the actuator (J3) 1320, (J4) 1374, (J5) 1468 to constrain the movement of the through-bore wire portion 1324.4, 1378.4, 1472.4 within the respective actuator.

3. Adjacent Actuator Bundle Portion

The adjacent actuator bundle portion 1334.2, 1386.2, 1430.2 of the wire bundle 1334, 1386, 1430 extends from the transition portion 1334.6, 1386.6, 1430.6 to the second end connector 1334.2.4, 1386.2.4, 1430.2.4 at the second end 1386.1.4 of the wire bundle 1334, 1386, 1430. In particular, the adjacent actuator bundle portion 1334.2, 1386.2, 1430.2 of the wire bundle 1334, 1386, 1430 extends from the respective actuator (J3-J5) 1320, 1374, 1468 to the previous adjacent actuator (J2) 1280, (J3) 1320, (J4) 1374, respectively. For example, the wire bundle 1386 extending from elbow actuator assembly (J4) 1374 to upper arm twist actuator assembly (J3) 1320 may reside in the lower humerus housing 1362. In other words, the wire bundles 1334, 1386, 1430 are designed to be positioned outside of the actuators.

As shown in the Figures, the adjacent actuator bundle portion 1334.2, 1386.2, 1430.2 has a flattened shape relative to the through-bore portions. For example, the connecting portions may be more of a ribbon or planar shape. The relatively flattened shape may allow the connecting portions to be packaged within the housing of the robot 1001, for example, between the part housing of the robot 1001 and the actuators. It should be understood that the use of the disclosed flatten shape is useful in this design to reduce the amount of space that is required to position the wires between the actuators and housing. In other embodiments, the adjacent actuator bundle portion 1334.2, 1386.2, 1430.2 may be embedded in or formed with the housings. In further embodiments, the through-bore wire portion 1324.4, 1378.4, 1472.4 may be omitted for certain actuators and instead the wire bundle 1334, 1386, 1430 may only include an adjacent actuator bundle portion 1334.2, 1386.2, 1430.2.

c. First End Connector

Figures 18, 19:
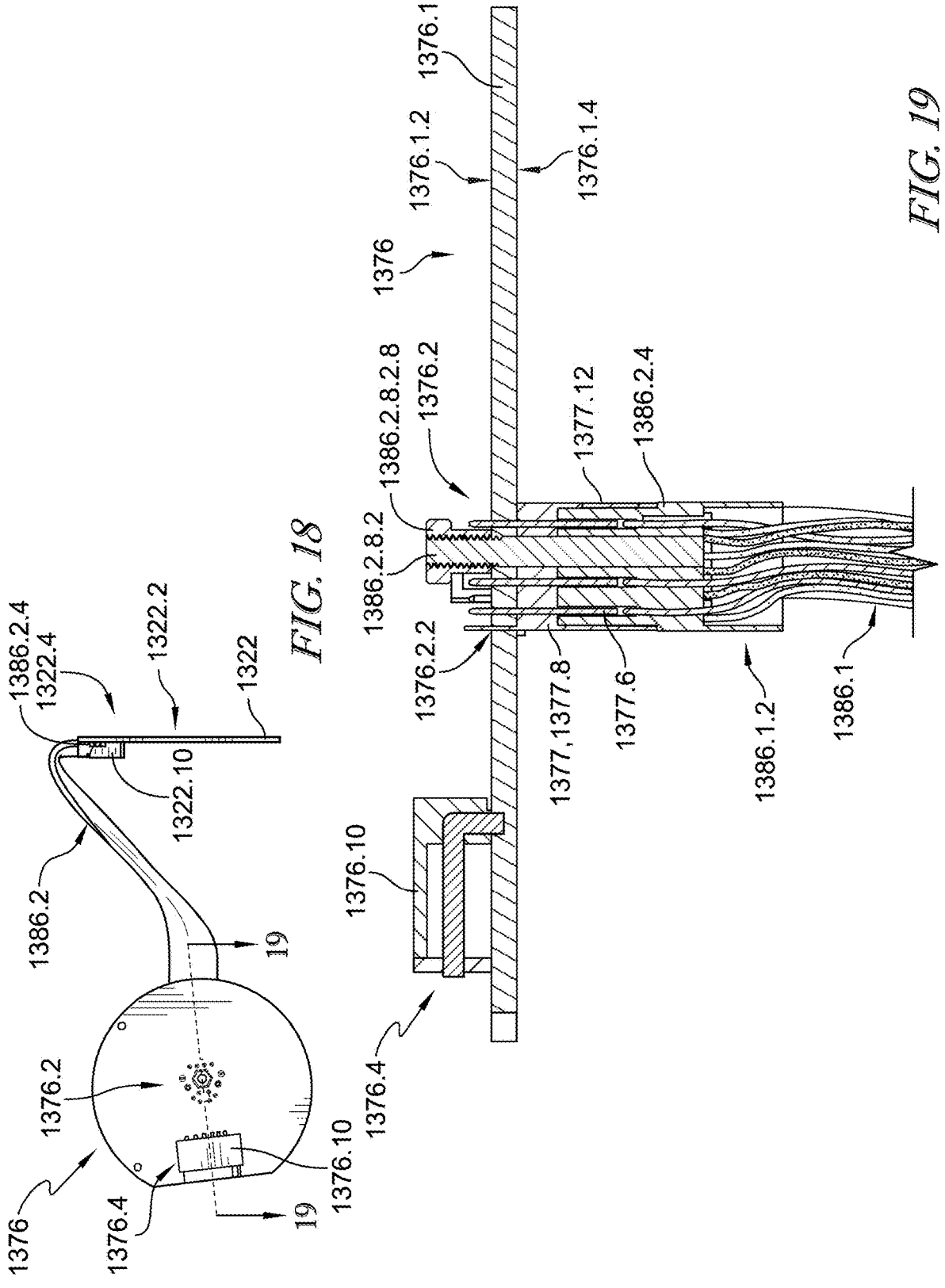
FIG. 18 is a top view of the PCBs and the wire bundle of FIG. 16.
FIG. 19 is a cross-sectional view of the elbow actuator PCB and the J3/J4 wiring bundle taken along line 19-19 in FIG. 18.
Figure 20:
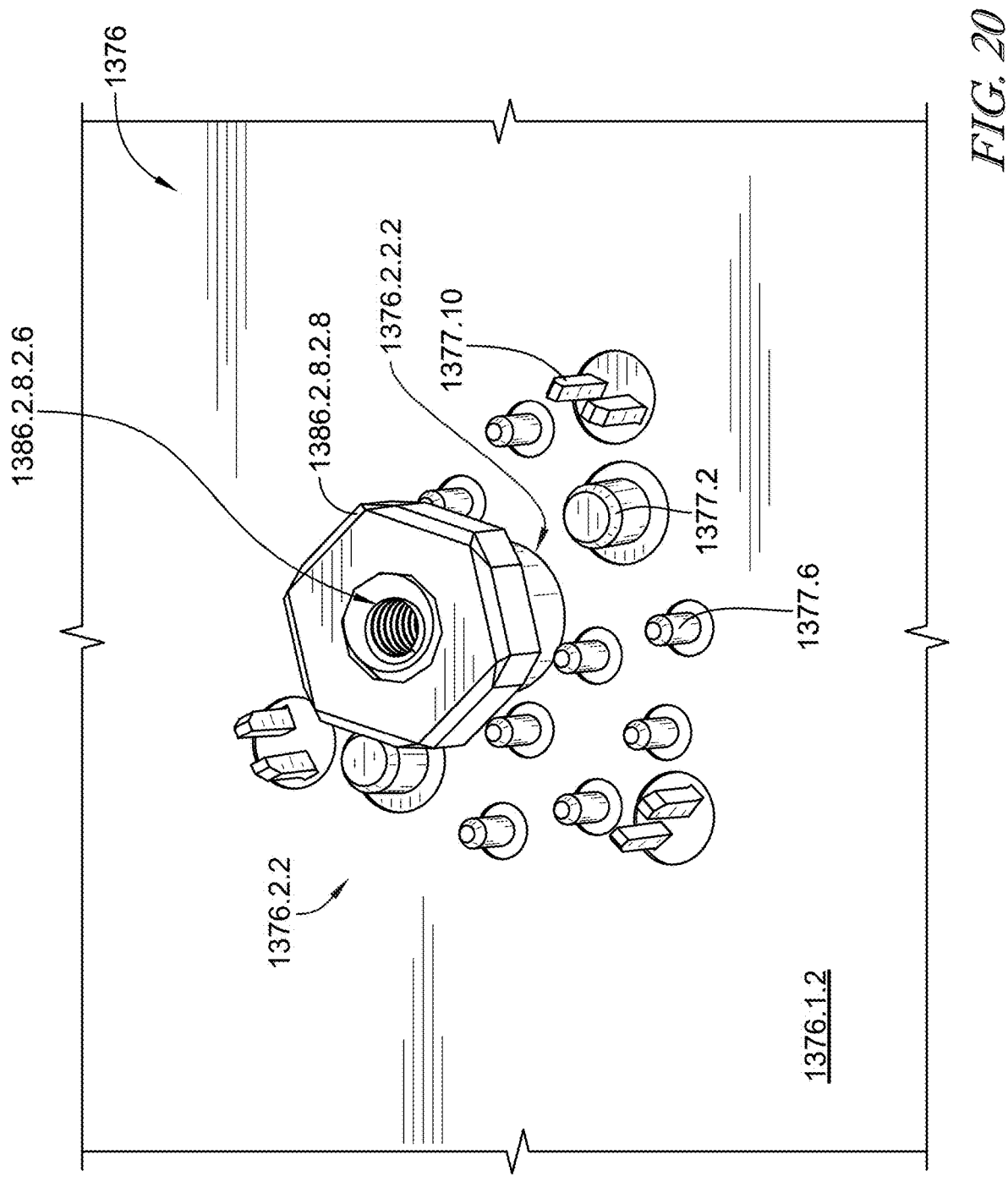
FIG. 20 is a zoomed in perspective view of an extent of the elbow actuator PCB, showing a first PCB terminal and an extent of the first end connector of an actuator wiring bundle coupled thereto.

As shown in the example of FIGS. 17-19, the first end connector 1386.2.8 at the first end 1386.1.2 of wire bundle 1386 couples the through-bore portion 1378.4 to the PCB assembly 1376. Specifically, the through-bore portion 1378.4 of wire bundle 1386 extends through the central output tube 1378.2 of elbow actuator (J4) 1374 and the first end connector 1386.2.8 is detachably coupled to the PCB assembly 1376 at the first PCB terminal 1377 of PCB 1376 of elbow actuator (J4) 1374. When coupled to the PCB assembly 1376, an extent of the first end connector 1386.2.8 is disposed internally within the through-bore receiver 1378.8, or the central tube 1378.2 of elbow actuator (J4) 1374.

Figure 23:
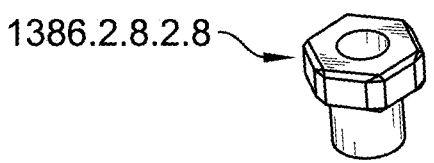
FIG. 23 is an exploded view of: (i) the first PCB terminal coupled to the first connection region of the elbow actuator PCB of FIG. 22, and (ii) the first end connector coupled to an extent of the actuator wiring bundle.
Figure 23:
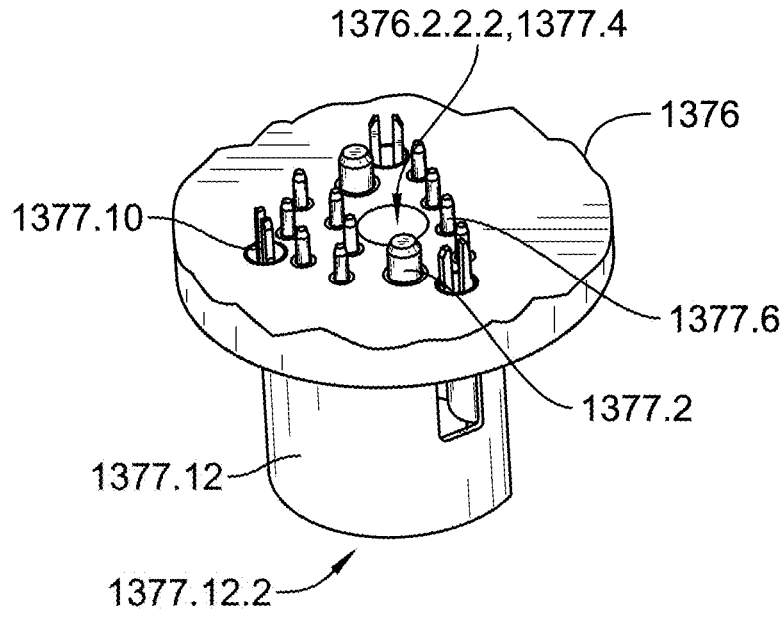
Figure 23:
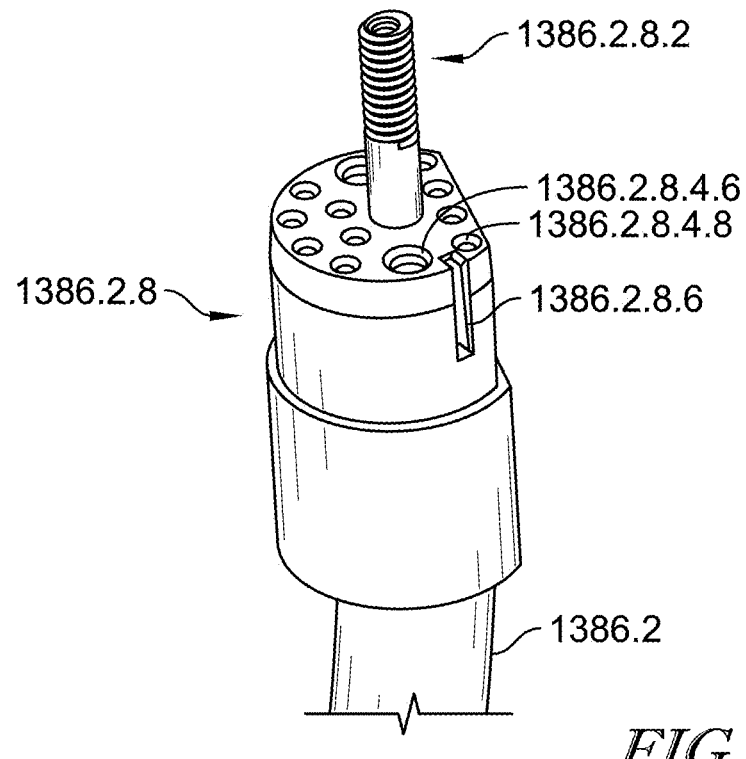

As best shown in FIG. 23, the first end connector 1386.2.8 includes (i) a plurality of receivers 1386.2.8.4, (ii) a chassis pin 1386.2.8.2, and (iii) alignment grooves 1386.2.8.6. The first end connector 1386.2.8 is shaped with a substantially circular extent and a flat extent and is sized to be slidably received by the through-bore receiver 1378.8 or the central tube 1378.2 of elbow actuator (J4) 1374 and couple to the first PCB terminal 1377 of the PCB 1376. The plurality of receivers 1386.2.8.4 of the first end connector 1386.2.8 includes power receivers 1386.2.8.4.6 and signal receivers 1386.2.8.4.8 individually coupled to the power wires 1386.1.6 and signal wires 1386.1.8 of the wire bundle 1386.1. In particular, the power receivers 1386.2.8.4.6 and signal receivers 1386.2.8.4.8 of the first end connector 1386.2.8 are configured to mate with the power pins 1377.2 and signal pins 1377.6 of the first PCB terminal 1377.

The plurality of receivers 1386.2.8.4 are arranged around the chassis pin 1386.2.8.2 which is substantially centered in the first end connector 1386.2.8. The chassis pin 1386.2.8.2 includes: (i) a projection 1386.2.8.2.2, (ii) an externally threaded extent 1386.2.8.2.4, and (iii) an internally threaded extent 1386.2.8.2.6. The projection 1386.2.8.2.2, enables the externally threaded extent 1386.2.8.2.4 to be positioned through the chassis opening 1377.4 of the first PCB terminal 1377 and extend through an upper surface 1376.1.2 of the PCB substrate 1376.1 in the first interface region 1376.2. The first end connector 1386.2.8 can be mechanically secured to the PCB assembly 1376 by threading a nut 1386.2.8.2.8 onto the externally threaded extent 1386.2.8.2.4 of the chassis pin 1386.2.8.2 that extends above the upper surface 1376.1.2 of the PCB substrate 1376.1. In other embodiments, this securement may be done using a screw, pogo pin, or any other suitable removable coupling. In other embodiments, the terminal/PCB header may be welded/soldered to the PCB assembly to fixedly couple an end of the through-bore portion of the wire bundle assembly to a respective PCB assembly.

d. Second End Connector

Figure 21:
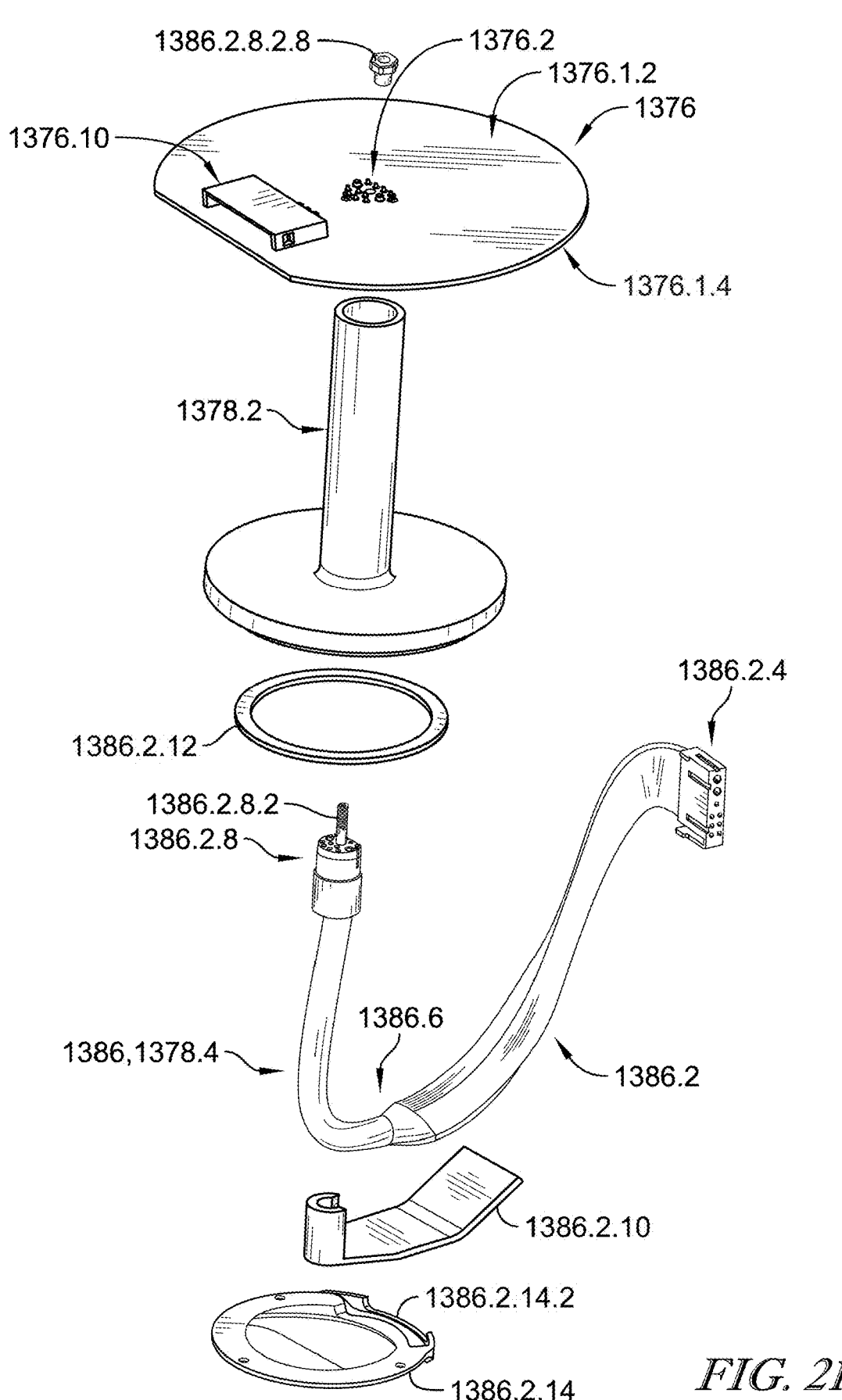
FIG. 21 is an exploded view of the elbow actuator and the actuator wiring bundle, wherein a majority of the elbow actuator has been omitted to further show a structure that creates an extent of a through-bore wire passage that is formed in the center of said elbow actuator.

As shown as an illustrative example in FIG. 21, the second end connector 1386.2.2 couples adjacent actuator bundle portion 1386.2 of the wire bundle 1386 of actuator (J4) 1374 to the PCB 1322 of the previous adjacent actuator (J3) 1320. In particular, the second end connector 1386.2.2 is configured to mate with the second PCB terminal 1322.10 of the previous adjacent actuator (J3) 1320 (FIGS. 16-18). The second end connector 1334.2.2, 1386.2.2, 1430.2.2 may be configured with apertures or sockets that are configured to mate with the protruding or male power pins and signal pins second PCB terminal (e.g., 1322.10) to conduct electrical power and control signals from the PCB (e.g., 1322) of the previous adjacent actuator (e.g., 1320).

Either the first end connector or the second end connector may comprise any suitable wire connection devices or junction. For example, the connectors may utilize a butt splice connection, soldering or crimping, twist-on wire connectors, bullet connectors, terminal blocks, screw clamps, push-in terminals, pluggable/spring connectors, screw terminals, push wire connectors, or any other suitable device or method. Additionally or alternatively the connectors and/or wire bundle assembly may include strain relief measures. For example the wire bundle assembly may include a strain relief assembly head, a compression strain relief bushing, zip ties routed through the wires to take stress off the connections, an underwriter's knot, potting material, or other suitable knot to prevent the wire from being pulled from electrical terminals.

e. Method of Assembly

FIGS. 24-29 illustrate the method of coupling the actuator wiring bundle, for example, wire bundle 1386 within illustrative elbow actuator (J4) 1374. In various embodiments, a through-bore installation tool 1550 is used to couple the wiring bundle 1386 to the PCB 1376 of an actuator elbow actuator (J4) 1374. In particular, as described above, the first PCB terminal 1377 is configured to be coupled to the second surface 1376.1.4 of the PCB 1376 in the first interface region 1376.2. With the first PCB terminal 1377 fixed to the PCB 1376, the wiring bundle 1386 can be installed using the following method.

Figures 24, 25:
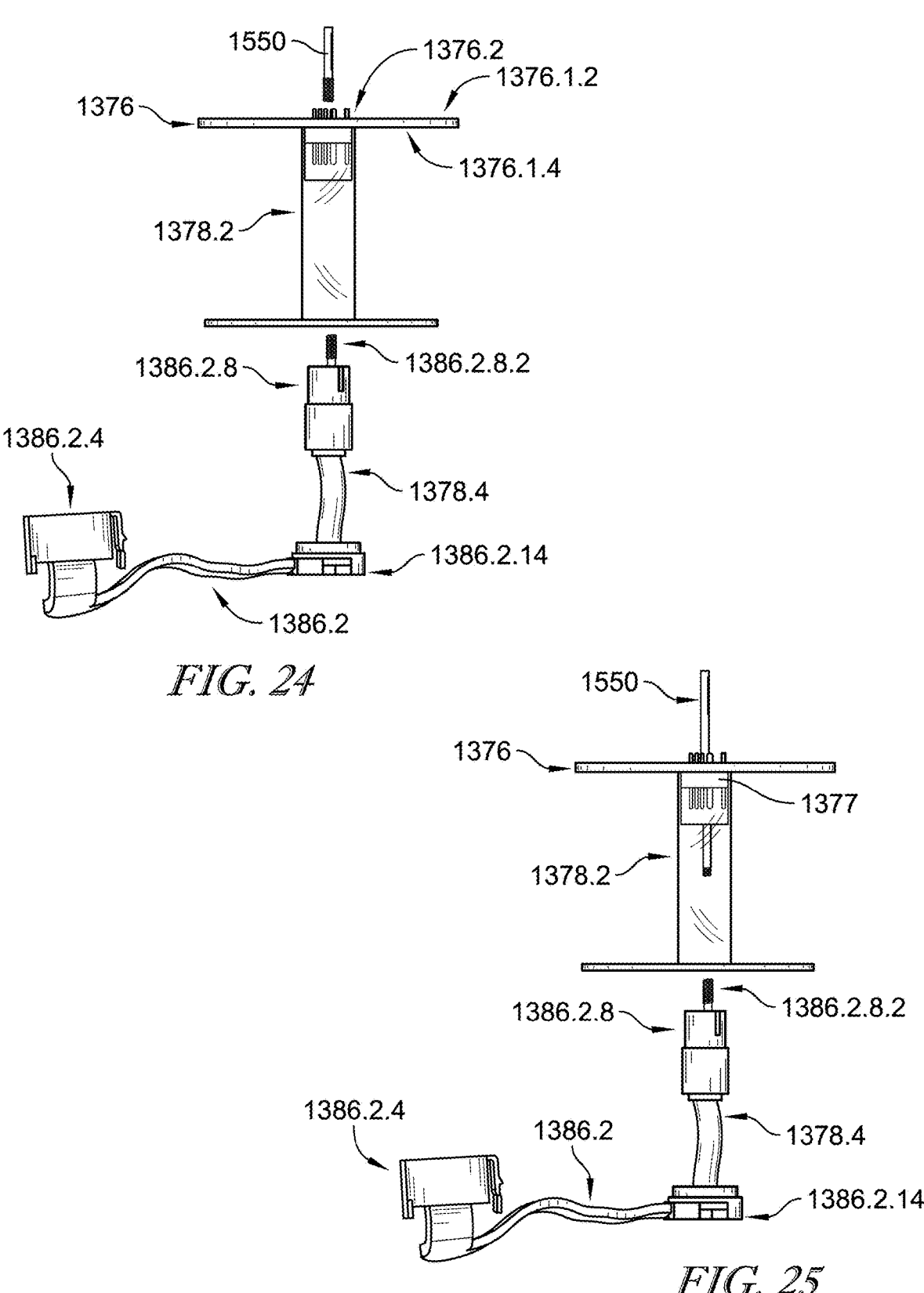
FIG. 24 is a side view of an extent of the elbow actuator and the adjacent actuator wiring bundle, wherein an extent of the elbow actuator is shown as semi-transparent in order to show the first step in a method for securing the actuator wiring bundle to the elbow actuator PCB.
FIG. 25 shows a second step of the method for securing the actuator wiring bundle to the elbow actuator PCB, wherein an installation tool is inserted into the through-bore wire passage.

Starting from a partially assembled state, where the first PCB terminal 1377 is coupled to the PCB assembly 1376 and positioned over the through-bore receiver 1378.8, and said elbow actuator (J4) 1374 has been assembled except for exterior covers that overlay or underlay the actuator. Referring to FIG. 24, in step one, the installation tool 1550 and the first end connector 1386.2.8, are properly positioned on opposite sides of the elbow actuator (J4) 1374. In particular, the installation tool 1550 may be positioned at the chassis opening 1377.4 (of the first PCB terminal 1377, aligned with PCB opening 1376.2.2.2) above the first surface 1376.1.2 of the PCB 1376 and the first end connector 1386.2.8 of the wiring bundle 1386 is positioned at the through-bore receiver 1378.8 on the second side 1378.9 of the elbow actuator (J4) 1374.

In the second step, the installation tool 1550 is inserted through both: (i) the chassis opening 1376.2.2.2 in the first interface region 1376.2 of the PCB assembly 1376, and (ii) the chassis opening 1377.4 of the first PCB terminal 1377 and into the through-bore receiver 1378.8, as shown in FIG. 25. In step three, the external threads 1550.2 of the installation tool 1550, engage with the internal threads 1386.2.8.2.6 of the chassis pin 1386.2.8.2, of said first end connector 1386.2.8, as shown in FIG. 26.

Figures 26, 27:
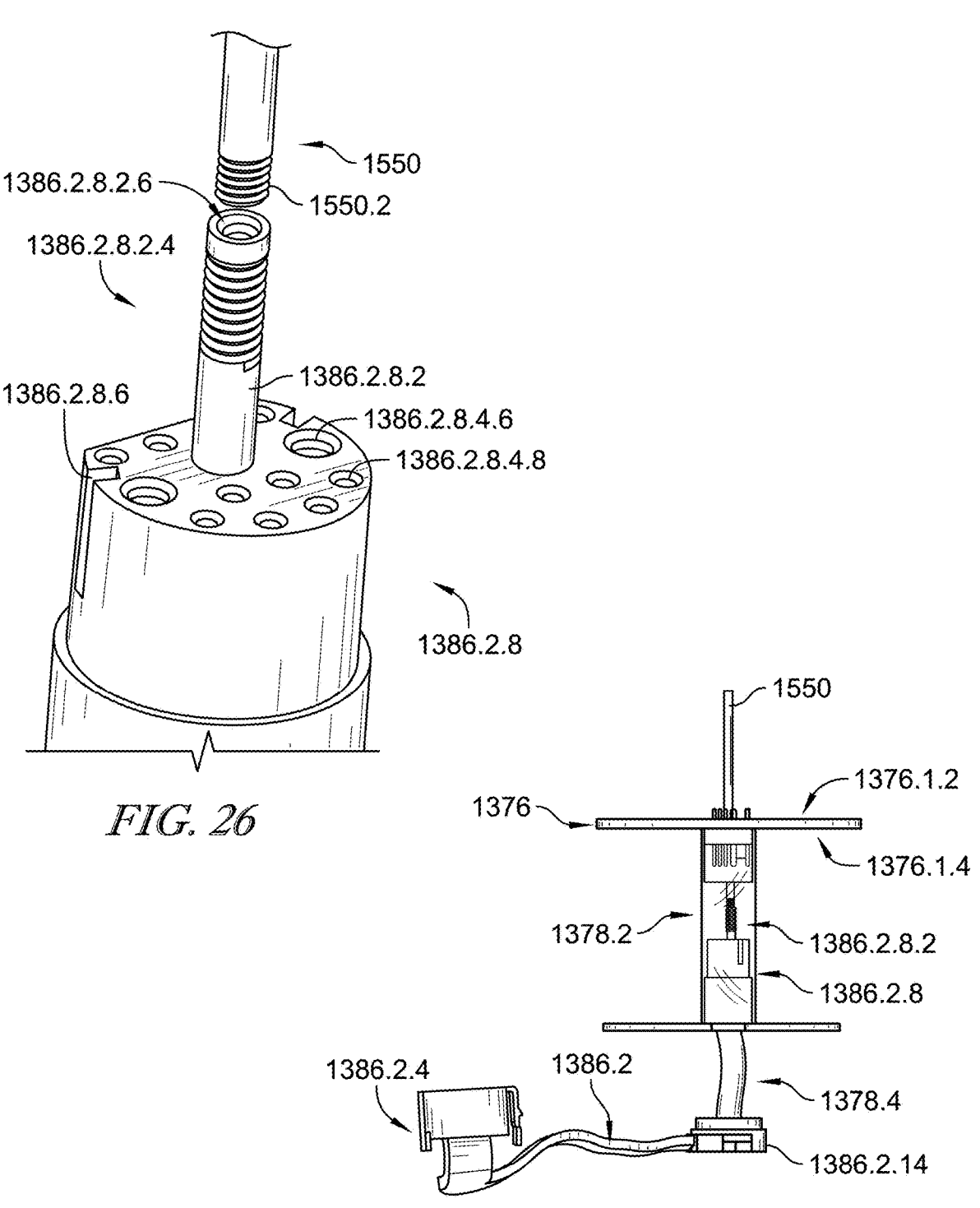
FIG. 26 is a zoomed-in perspective view of the installation tool being coupled to an extent of a first end connector of the actuator wiring bundle.
FIG. 27 shows a third step of the method for securing the actuator wiring bundle to the elbow actuator PCB, wherein the installation tool has been secured to an extent of the connector and the installation tool is used to pull the wire bundle assembly into the through-bore wire passage.
Figure 28:
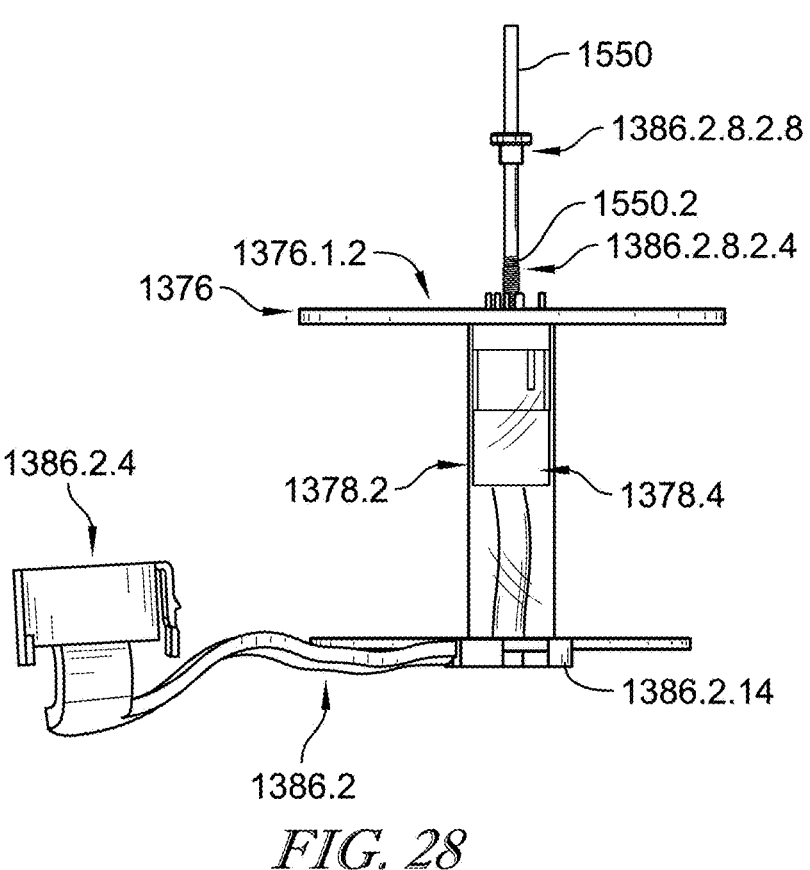
FIG. 28 shows a fourth step of the method for securing the actuator wiring bundle to the elbow actuator PCB, wherein a nut is slid over the installation tool and coupled to an extent of the first end connector.
Figure 29:
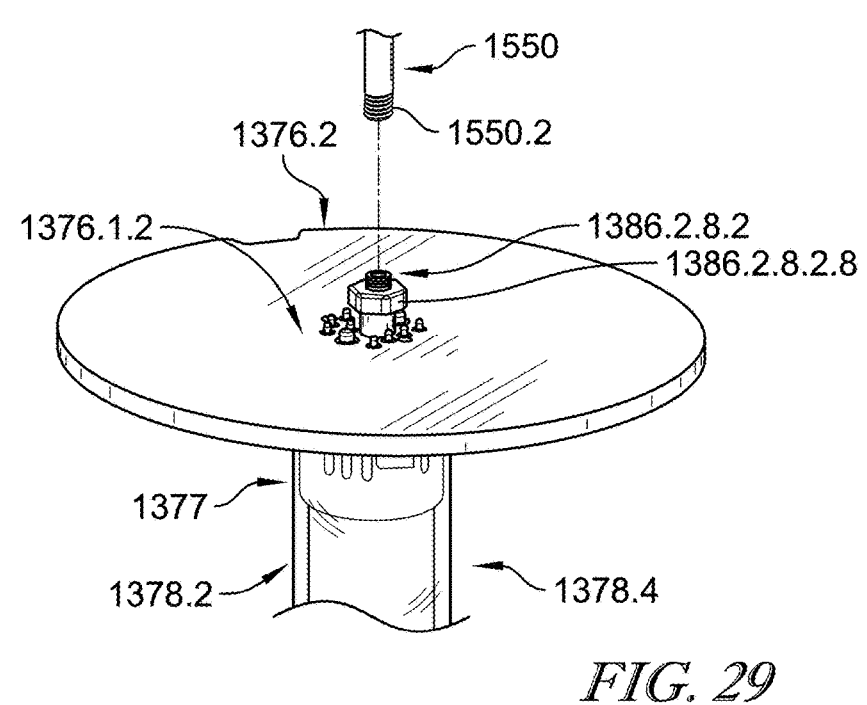
FIG. 29 shows a fifth step of the method for securing the actuator wiring bundle to the elbow actuator PCB, wherein the installation tool is removed from the actuator wiring bundle once the nut is secured to an extent of the actuator wiring bundle.
Figures 30, 31:
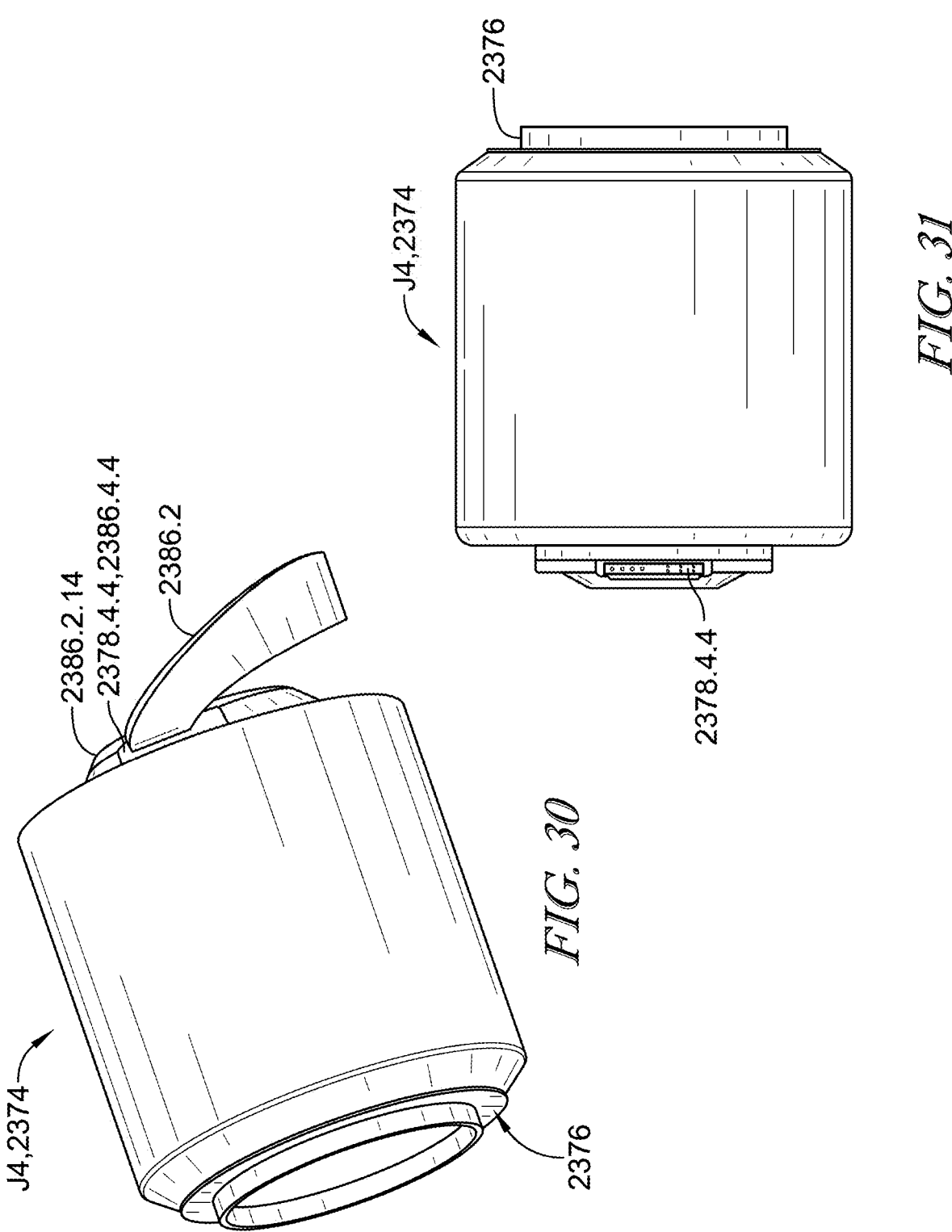
FIG. 30 is a perspective view of a third embodiment of the elbow actuator and actuator wiring coupled thereto.
FIG. 31 is a side view of the elbow actuator of FIG. 30, and showing a first end connector.
Figures 32, 33:
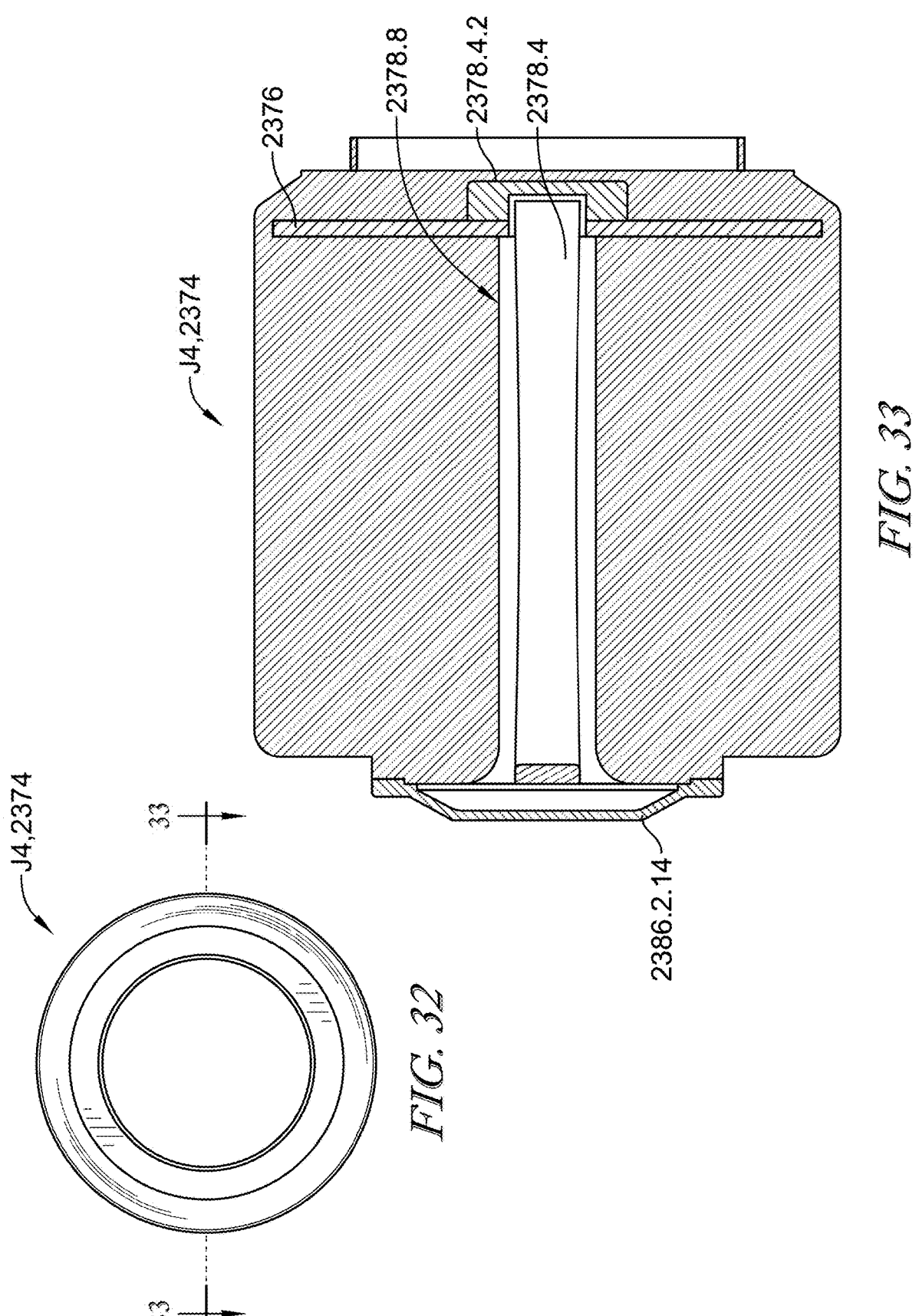
FIG. 32 is a top view of the elbow actuator of FIG. 30.
FIG. 33 is a cross sectional view along line 32-32 of the elbow actuator of FIG. 32, and showing a second end connector.

Then, in step four, a vertical force is applied on the installation tool 1550 to extract the tool 1550 and the first end connector 1386.2.8 coupled thereto, as shown in FIG. 27. This action draws the chassis pin 1386.2.8.2 upward with the installation tool 1550 and pulls the through-bore wire portion 1378.4 into the central through-bore receiver 1378.8 of the elbow actuator (J4) 1374. As the said tool 1550 is removed through chassis opening 1377.4 of the first PCB terminal 1377 and the chassis opening 1376.2.2.2 of PCB 1376, the first end connector 1386.2.8 engages with the first PCB terminal 1377, and a substantial portion of the through-bore wire portion 1378.4 resides in the central through-bore receiver 1378.8.

Once the tool 1550 has been removed from the extent of the actuator, the externally threaded extent 1386.2.8.2.4 of the chassis pin 1386.2.8.2 projects over the first surface 1376.1.2 of the PCB 1376. At this point, with the installation tool 1550 still coupled to the chassis pin 1386.2.8.2, the nut 1386.2.8.2.8 can be received over the installation tool 1550. The installation tool 1550 is configured such that the nut 1386.2.8.2.8 can slide down to engage the externally threaded extent 1386.2.8.2.4 of the chassis pin 1386.2.8.2.

Once engaged with the externally threaded extent 1386.2.8.2.4, the nut 1386.2.8.2.8 can be rotated to enable the internal threads of the nut 1386.2.8.2.8 to engage with the externally threaded extent 1386.2.8.2.4 of the chassis pin 1386.2.8.2, which forces the power pins 1377.2 and signal pins 1377.6 extending from the second surface 1377.8.4 of the base 1377.8 into the receivers (e.g., 1386.2.8.4.6, 1386.2.8.4.8) of the first end connector 1386.2.8. Tightening of the nut 1386.2.8.2.8 causes the mechanical and electrical coupling of the wiring bundle 1386 and the PCB assembly 1376. Once coupled, the installation tool 1550 can be decoupled from the chassis pin 1386.2.8.2.

E. Third Embodiment

Shown as a third embodiment of the actuator wiring assembly 2960 in FIGS. 30-33, robot 2001 includes a similar arrangement of actuators (J1-J16) as robot 1 and robot 1001 described above, but with an alternative actuator wiring arrangement for coupling adjacent actuators. For the sake of brevity, the above disclosure in connection with the arm assembly will not be repeated below, but it should be understood that across embodiments, like numbers represent like structures. For example, individual part assemblies (e.g., arms 5, torso 16, pelvis 64, legs 6) of robot 1 are similarly numbered for robot 2001 (e.g., arms 2005, torso 2016, pelvis 2064, legs 2006). Also, the actuators are generally arranged within robot 2001 to provide the same number of degrees of freedom and similar ranges of motion as robot 1 and robot 1001.

Similar to the second embodiment, the illustrative arm actuators (J3) 2320, (J4) 2374, (J5) 2468 include a central through-bore receiver 2324.8, 2378.8, 2472.8 and PCB assembly 2322, 2376, 2470 positioned adjacent to one side of said actuator 2324, 2378, 2472. However, the third embodiment actuator wiring 2334, 2386, 2430 includes separate bundles for the through-bore bundle 2324.4, 2378.4, 2472.4 and the adjacent actuator bundle 2334.2, 2386.2, 2430.2. In this embodiment, the through-bore bundle 2324.4, 2378.4, 2472.4 includes a first connector 2324.4.2, 2378.4.2, 2472.4.2 coupled to the first end and a second connector 2324.4.4, 2378.4.4, 2472.4.4 coupled to the second end of the through-bore bundle 2324.4, 2378.4, 2472.4. Similarly, the adjacent actuator bundle 2334.2, 2386.2, 2430.2 includes a first connector 2334.2.2, 2386.2.2, 2430.2.2 coupled to the first end and a second connector 2334.2.4, 2386.2.4, 2430.2.4 coupled to the second end of the adjacent actuator bundle 2334.2, 2386.2, 2430.2. The through-bore bundle 2324.4, 2378.4, 2472.4 and adjacent actuator bundle 2334.2, 2386.2, 2430.2 are coupled in series.

For example, the first connector 2378.4.2 of through-bore bundle 2378.4 is configured to couple with a first PCB terminal 2377 of the PCB 2376 for elbow actuator (J4) 2374. The through-bore bundle 2378.4 extends through the elbow actuator (J4) 2374, and its second connector 2378.4.4 is configured to be received within an actuator cover 2386.2.14 and mate with the first connector 2386.2.2 of the adjacent actuator bundle 2386.2. The adjacent actuator bundle 2386.2 extends therefrom to its second connector 2386.2.4, which is configured to couple with the second PCB terminal of PCB 2322 of the upper arm twist actuator (J3) 2320.

F. Industrial Application

While the disclosure shows illustrative embodiments of a robot (in particular, a humanoid robot), it should be understood that embodiments are designed to be examples of the principles of the disclosed assemblies, methods and systems, and are not intended to limit the broad aspects of the disclosed concepts to the embodiments illustrated. As will be realized, the disclosed robot, and its functionality and methods of operation, are capable of other and different configurations and several details are capable of being modified all without departing from the scope of the disclosed methods and systems. For example, one or more of the disclosed embodiments, in part or whole, may be combined with a disclosed assembly, method and system. As such, one or more steps from the diagrams or components in the Figures may be selectively omitted and/or combined consistent with the disclosed assemblies, methods and systems. Additionally, one or more steps from the arrangement of components may be omitted or performed in a different order. Accordingly, the drawings, diagrams, and detailed description are to be regarded as illustrative in nature, not restrictive or limiting, of said humanoid robot.

While the above-described methods and systems are designed for use with a general-purpose humanoid robot, it should be understood that the assemblies, components, learning capabilities, and/or kinematic capabilities may be used with other robots. Examples of other robots include: articulated robot (e.g., an arm having two, six, or ten degrees of freedom, etc.), a cartesian robot (e.g., rectilinear or gantry robots, robots having three prismatic joints, etc.), Selective Compliance Assembly Robot Arm (SCARA) robots (e.g., with a donut shaped work envelope, with two parallel joints that provide compliance in one selected plane, with rotary shafts positioned vertically, with an end effector attached to an arm, etc.), delta robots (e.g., parallel link robots with parallel joint linkages connected with a common base, having direct control of each joint over the end effector, which may be used for pick-and-place or product transfer applications, etc.), polar robots (e.g., with a twisting joint connecting the arm with the base and a combination of two rotary joints and one linear joint connecting the links, having a centrally pivoting shaft and an extendable rotating arm, spherical robots, etc.), cylindrical robots (e.g., with at least one rotary joint at the base and at least one prismatic joint connecting the links, with a pivoting shaft and extendable arm that moves vertically and by sliding, with a cylindrical configuration that offers vertical and horizontal linear movement along with rotary movement about the vertical axis, etc.), self-driving car, a kitchen appliance, construction equipment, or a variety of other types of robot systems. The robot system may include one or more sensors (e.g., cameras, temperature, pressure, force, inductive or capacitive touch), motors (e.g., servo motors and stepper motors), actuators, biasing members, encoders, housing, or any other component known in the art that is used in connection with robot systems. Likewise, the robot system may omit one or more sensors (e.g., cameras, temperature, pressure, force, inductive or capacitive touch), motors (e.g., servo motors and stepper motors), actuators, biasing members, encoders, housing, or any other component known in the art that is used in connection with robot systems.

In other embodiments, other configurations and/or components may be utilized. As is known in the data processing and communications arts, a general-purpose computer typically comprises a central processor or other processing device, an internal communication bus, various types of memory or storage media (RAM, ROM, EEPROM, cache memory, disk drives etc.) for code and data storage, and one or more network interface cards or ports for communication purposes. The software functionalities involve programming, including executable code as well as associated stored data. The software code is executable by the general-purpose computer. In operation, the code is stored within the general-purpose computer platform. At other times, however, the software may be stored at other locations and/or transported for loading into the appropriate general-purpose computer system.

A server, for example, includes a data communication interface for packet data communication. The server also includes a central processing unit (CPU), in the form of one or more processors, for executing program instructions. The server platform typically includes an internal communication bus, program storage and data storage for various data files to be processed and/or communicated by the server, although the server often receives programming and data via network communications. The hardware elements, operating systems and programming languages of such servers are conventional in nature, and it is presumed that those skilled in the art are adequately familiar therewith. The server functions may be implemented in a distributed fashion on a number of similar platforms, to distribute the processing load.

Hence, aspects of the disclosed methods and systems outlined above may be embodied in programming. Program aspects of the technology may be thought of as "products" or "articles of manufacture" typically in the form of executable code and/or associated data that is carried on or embodied in a type of machine-readable medium. "Storage" type media includes any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

A machine-readable medium may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the disclosed methods and systems. Volatile storage media include dynamic memory, such as the main memory of such a computer platform. Tangible transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards, paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

It is to be understood that the invention is not limited to the exact details of construction, operation, exact materials or embodiments shown and described, as obvious modifications and equivalents will be apparent to one skilled in the art. While the specific embodiments have been illustrated and described, numerous modifications come to mind without significantly departing from the spirit of the invention, and the scope of protection is only limited by the scope of the accompanying Claims. In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

It should also be understood that substantially utilized herein means a deviation less than 15% and preferably less than 5%. It should also be understood that other configuration or arrangements of the above-described components is contemplated by this Application. Moreover, the description provided in the background section should not be assumed to be prior art merely because it is mentioned in or associated with the background section. The background section may include information that describes one or more aspects of the subject of the technology. Finally, the mere fact that something is described as conventional does not mean that the Applicant admits it is prior art.

In this Application, to the extent any U.S. patents, U.S. patent applications, or other materials (e.g., articles) have been incorporated by reference, the text of such materials is only incorporated by reference to the extent that they do not conflict with materials, statements and drawings set forth herein. In the event of such conflict, the text of the present document controls, and terms in this document should not be given a narrower reading in virtue of the way in which those terms are used in other materials incorporated by reference. It should also be understood that structures and/or features not directly associated with a robot cannot be adopted or implemented into the disclosed humanoid robot without careful analysis and verification of the complex realities of designing, testing, manufacturing, and certifying a robot for completion of usable work nearby and/or around humans. Theoretical designs that attempt to implement such modifications from non-robotic structures and/or features are insufficient (and in some instances, woefully insufficient) because they amount to mere design exercises that are not tethered to the complex realities of successfully designing, manufacturing and testing a robot.

The invention claimed is:

1. A humanoid robot, comprising:
   a first actuator having:
      a first side,
      a first actuator printed circuit board (PCB) positioned near said first side of the first actuator and including a first PCB terminal, and
      a second side that is opposed to the first side and including: (i) an output portion, (ii) an actuator cover coupled to the output portion and having a wire bundle opening formed therein, and (iii) an actuator opening formed through an extent of the second side;

a second actuator having:

a first side, and a second actuator printed circuit board (PCB) positioned near said first side of the second actuator and including a second PCB terminal; and a wire bundle having:

a first end connector coupled to the first PCB terminal, a second end connector coupled to the second PCB terminal, and a plurality of wires extending between the first end connector and the second end connector, and including: (i) a first portion positioned within the first actuator and having an extent that is arranged in a first shape, and (ii) a second portion positioned external to the first actuator and having an extent that is arranged in a second shape that is different from the first shape, and wherein said plurality of wires extends through the actuator opening of the second side of the first actuator and the wire bundle opening formed in the actuator cover of the second side of the first actuator.

2. The humanoid robot of claim 1, further comprising a head having a screen positioned therein.

3. The humanoid robot of claim 2, further comprising a computer configured to run a vision-language-action model that allows the humanoid robot to operate autonomously.

4. The humanoid robot of claim 1, wherein the first actuator includes a strain wave gearbox.

5. The humanoid robot of claim 1, wherein the first actuator is positioned in a knee portion of the robot and includes a clutch.

6. The humanoid robot of claim 1, wherein the second actuator PCB includes a first positive voltage pin configured to conduct a first voltage, and a second positive voltage pin configured to conduct a second voltage; and wherein the second voltage is both lower than the first voltage and less than 48 volts.

7. The humanoid robot of claim 1, wherein the first end connector has a width that is less than a diameter of the actuator opening of the first actuator.

8. The humanoid robot of claim 7, wherein an outer surface of the first end connector includes a planar surface.

9. The humanoid robot of claim 1, wherein the first actuator includes a permanent magnet synchronous motor coupled to a planetary gearbox.

10. The humanoid robot of claim 1, wherein the plurality of wires does not extend across more than two degrees of freedom.

11. The humanoid robot of claim 1, wherein the first actuator further comprises a Hall-effect sensor that is operatively coupled to a portion of the first actuator PCB.

12. The humanoid robot of claim 11, wherein the first actuator further comprises an inductive encoder that is operatively coupled to a portion of the first actuator PCB.

13. The humanoid robot of claim 1, wherein the wire bundle opening does not have a substantially circular cross-sectional area.

14. The humanoid robot of claim 1, wherein the actuator opening of the first actuator resides in a first plane, and the wire bundle opening in the actuator cover resides in a second plane that is oriented at a non-zero angle relative to the first plane.

15. The humanoid robot of claim 1, wherein the first PCB terminal includes a first plurality of signal pins, and the second PCB terminal includes a second plurality of signal pins; and wherein a number of signal pins in the first plurality of signal pins is greater than a number of signal pins in the second plurality of signal pins.

16. The humanoid robot of claim 1, wherein said first portion twists angularly within the first actuator when the output portion of the first actuator moves.

17. The humanoid robot of claim 1, wherein the first PCB terminal is coupled to the first connector via a threaded nut.

18. The humanoid robot of claim 1, wherein the first portion has a substantially rectangular cross-sectional area.

19. The humanoid robot of claim 1, further comprising a head with an indicator light positioned adjacent to a frontal shield within said head.

20. The humanoid robot of claim 1, further comprising an indicator light that indicates an operation status of a component of the humanoid robot.

21. The humanoid robot of claim 1, wherein the first actuator is a spinal actuator coupled to a pelvis of the humanoid robot.

22. The humanoid robot of claim 1, wherein both power and data are configured to pass through the first end connector.

* * * * *